(12) United States Patent
Nagata

(10) Patent No.: US 12,051,743 B2
(45) Date of Patent: Jul. 30, 2024

(54) SEMICONDUCTOR DEVICE

(71) Applicant: ROHM CO., LTD., Kyoto (JP)

(72) Inventor: Masaki Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 96 days.

(21) Appl. No.: 17/163,982

(22) Filed: Feb. 1, 2021

(65) Prior Publication Data
US 2021/0249535 A1 Aug. 12, 2021

(30) Foreign Application Priority Data

Feb. 7, 2020 (JP) ................................. 2020-020083

(51) Int. Cl.
| | |
|---|---|
| H01L 29/78 | (2006.01) |
| H01L 29/40 | (2006.01) |
| H01L 29/417 | (2006.01) |
| H01L 29/423 | (2006.01) |
| H01L 29/66 | (2006.01) |

(52) U.S. Cl.
CPC ........ H01L 29/7813 (2013.01); H01L 29/401 (2013.01); H01L 29/41775 (2013.01); H01L 29/42364 (2013.01); H01L 29/66734 (2013.01)

(58) Field of Classification Search
CPC ............ H01L 29/7811; H01L 29/7813; H01L 29/407; H01L 29/404; H01L 29/42368
See application file for complete search history.

(56) References Cited

U.S. PATENT DOCUMENTS

| | | | | |
|---|---|---|---|---|
| 6,750,508 | B2* | 6/2004 | Omura | H01L 29/872 |
| | | | | 257/E21.345 |
| 8,431,457 | B2* | 4/2013 | Chang | H01L 29/41741 |
| | | | | 257/334 |
| 9,425,305 | B2* | 8/2016 | Terrill | H01L 29/66734 |
| 10,600,906 | B1* | 3/2020 | Chien | H01L 29/66734 |
| 2010/0140695 | A1* | 6/2010 | Yedinak | H01L 29/872 |
| | | | | 257/334 |
| 2010/0140696 | A1* | 6/2010 | Yedinak | H01L 29/8725 |
| | | | | 257/334 |

(Continued)

FOREIGN PATENT DOCUMENTS

| | | |
|---|---|---|
| JP | 2013508980 A | 3/2013 |
| JP | 2013-214551 A | 10/2013 |
| JP | 2016-167542 A | 9/2016 |

OTHER PUBLICATIONS

Office Action issued on Nov. 2, 2023, in corresponding Japanese patent Application No. 2020-020083, 12 pages.

Primary Examiner — Vincent Wall
(74) Attorney, Agent, or Firm — XSENSUS LLP

(57) ABSTRACT

There is provided a semiconductor device, including: a semiconductor chip including a main surface; a gate trench formed on the main surface; a first insulating film configured to cover an upper wall surface of the gate trench; a second insulating film configured to cover a lower wall surface of the gate trench; a field trench formed on the main surface so as to be spaced apart from the gate trench, and including a facing wall at a side of the gate trench and a non-facing wall at an opposite side of the facing wall; a third insulating film configured to cover an upper wall surface of the field trench at a side of the facing wall; and a fourth insulating film configured to cover a lower wall surface of the field trench at the side of the facing wall and the non-facing wall.

16 Claims, 37 Drawing Sheets

(56) References Cited

U.S. PATENT DOCUMENTS

| | | | |
|---|---|---|---|
| 2010/0140697 A1* | 6/2010 | Yedinak | H01L 29/7813 |
| | | | 257/334 |
| 2011/0039383 A1* | 2/2011 | Chen | H01L 29/7811 |
| | | | 438/270 |
| 2020/0395478 A1* | 12/2020 | Probst | H01L 21/765 |

* cited by examiner

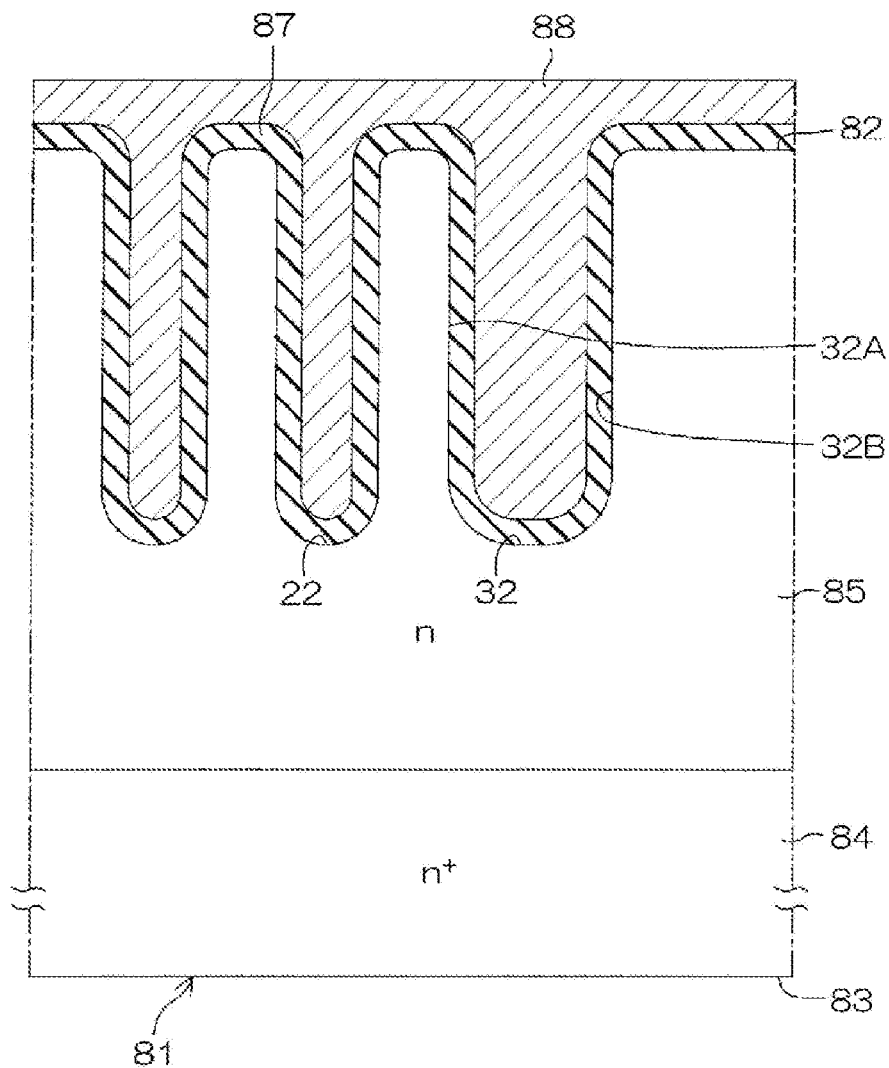

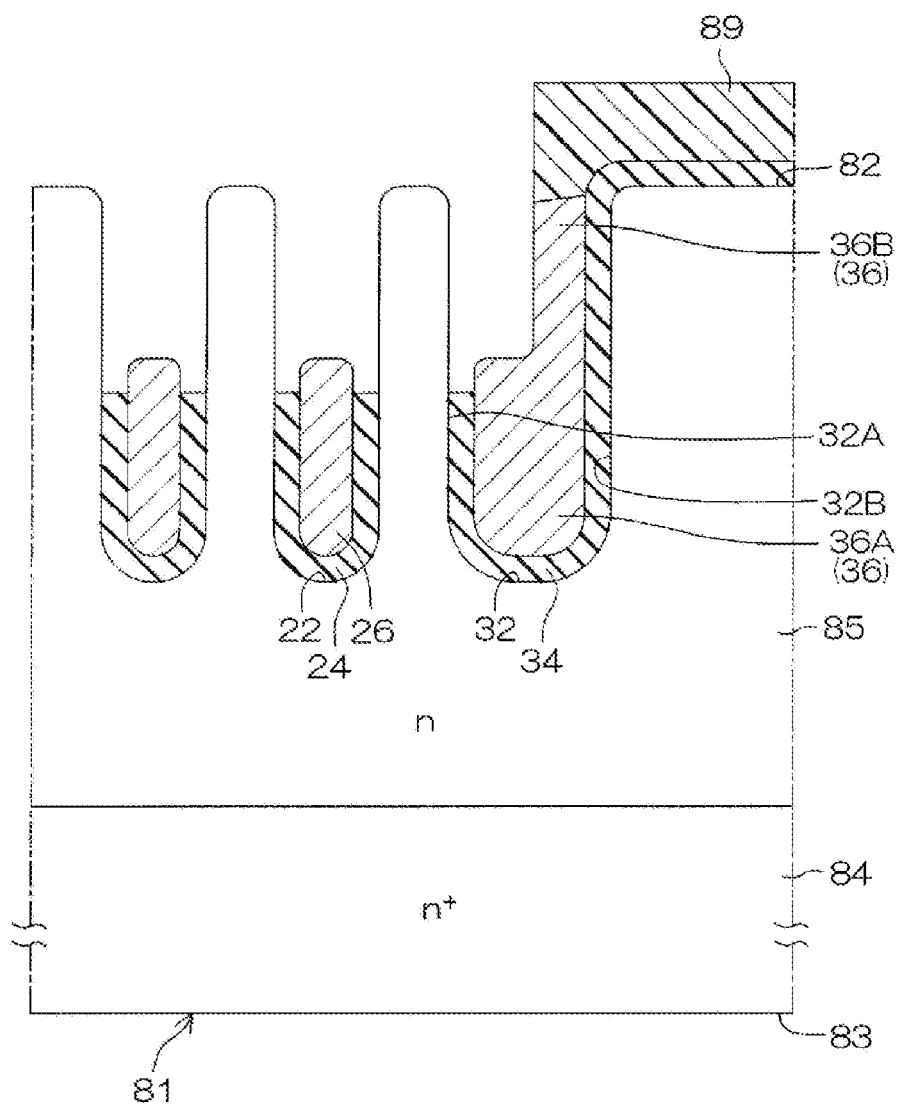

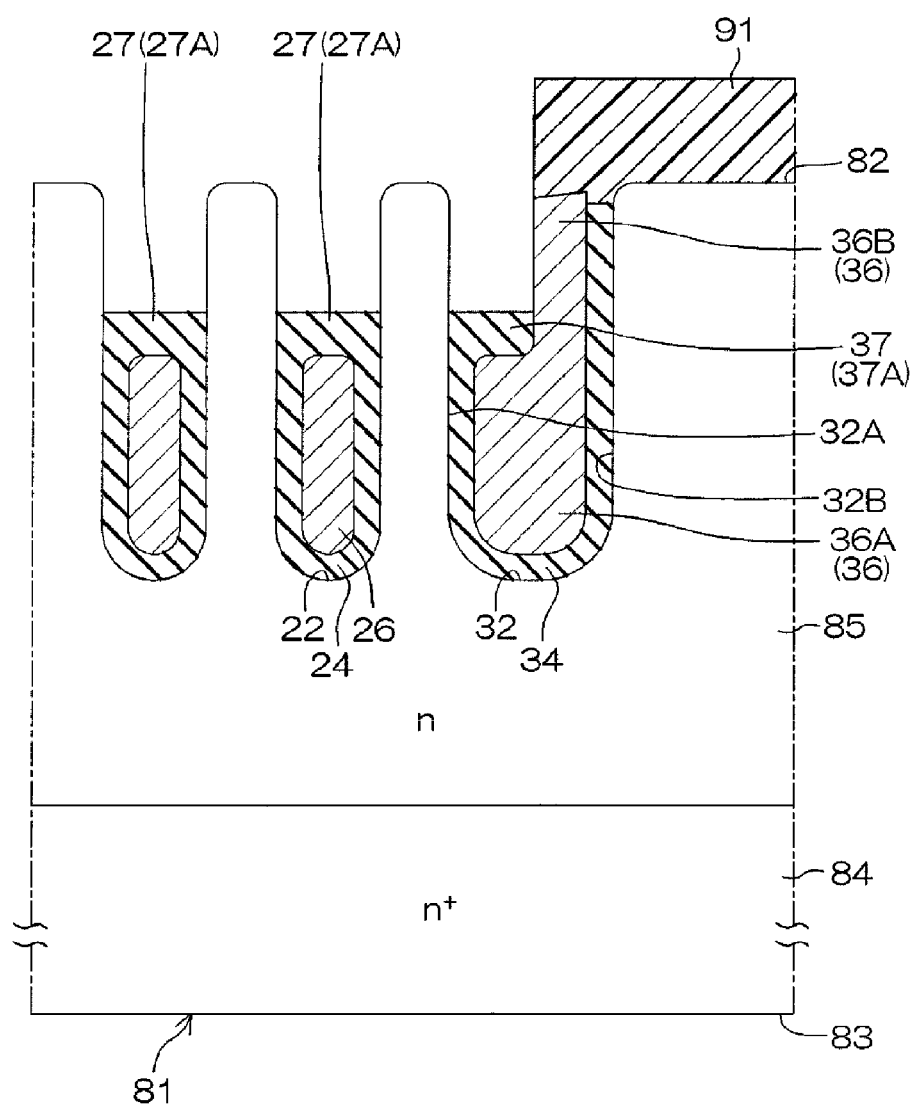

SEMICONDUCTOR DEVICE

CROSS-REFERENCE TO RELATED APPLICATION

This application is based upon and claims the benefit of priority from Japanese Patent Application No. 2020-020083, filed on Feb. 7, 2020, the entire contents of which are incorporated herein by reference.

TECHNICAL FIELD

The present disclosure relates to a semiconductor device.

BACKGROUND

Related art discloses a semiconductor device including a semiconductor chip, a gate trench structure and a field trench structure. The gate trench structure includes a gate trench, a first insulating film and a second insulating film. The gate trench is formed on a main surface of the semiconductor chip. The first insulating film covers an upper wall surface of the gate trench. The second insulating film covers a lower wall surface of the gate trench and is formed thicker than the first insulating film. The field trench structure includes a field trench and a third insulating film. The field trench is formed on the main surface of the semiconductor chip so as to be spaced apart from the gate trench. The third insulating film covers the wall surface of the field trench and is formed thicker than the first insulating film.

If a structure in the gate trench and a structure in the field trench are different, a stress may be generated in a region between the gate trench and the field trench in the semiconductor chip, and crystal defects may be formed.

SUMMARY

Some embodiments of the present disclosure provide a semiconductor device capable of relieving a stress generated in a region between a gate trench and a field trench.

According to one embodiment of the present disclosure, a semiconductor device includes: a semiconductor chip including a main surface; a gate trench formed on the main surface; a first insulating film configured to cover an upper wall surface of the gate trench; a second insulating film configured to cover a lower wall surface of the gate trench, and having a larger thickness than the first insulating film; a field trench formed on the main surface so as to be spaced apart from the gate trench, and including a facing wall at a side of the gate trench and a non-facing wall at an opposite side of the facing wall; a third insulating film configured to cover an upper wall surface of the field trench at a side of the facing wall, and having a smaller thickness than the second insulating film; and a fourth insulating film configured to cover a lower wall surface of the field trench at the side of the facing wall and the non-facing wall, and having a larger thickness than the third insulating film.

BRIEF DESCRIPTION OF DRAWINGS

The accompanying drawings, which are incorporated in and constitute a part of the specification, illustrate embodiments of the present disclosure.

FIG. 8D is a cross-sectional view showing a process after FIG. 8C.

FIG. 8G is a cross-sectional view showing a process after FIG. 8F.

FIG. 8J is a cross-sectional view showing a process after FIG. 8I.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
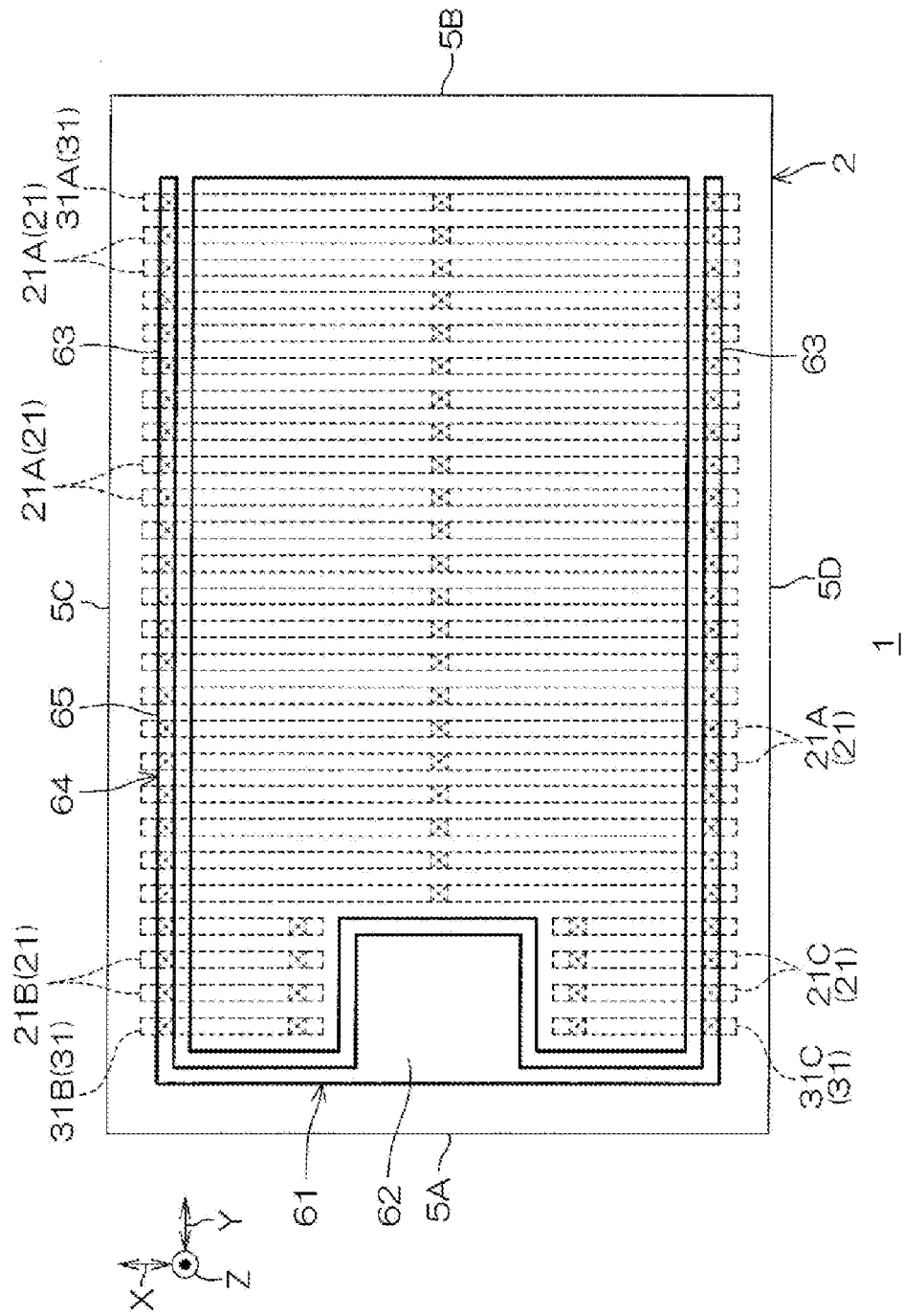
FIG. 1 is a plan view showing a semiconductor device according to a first embodiment of the present disclosure.
Figure 2:
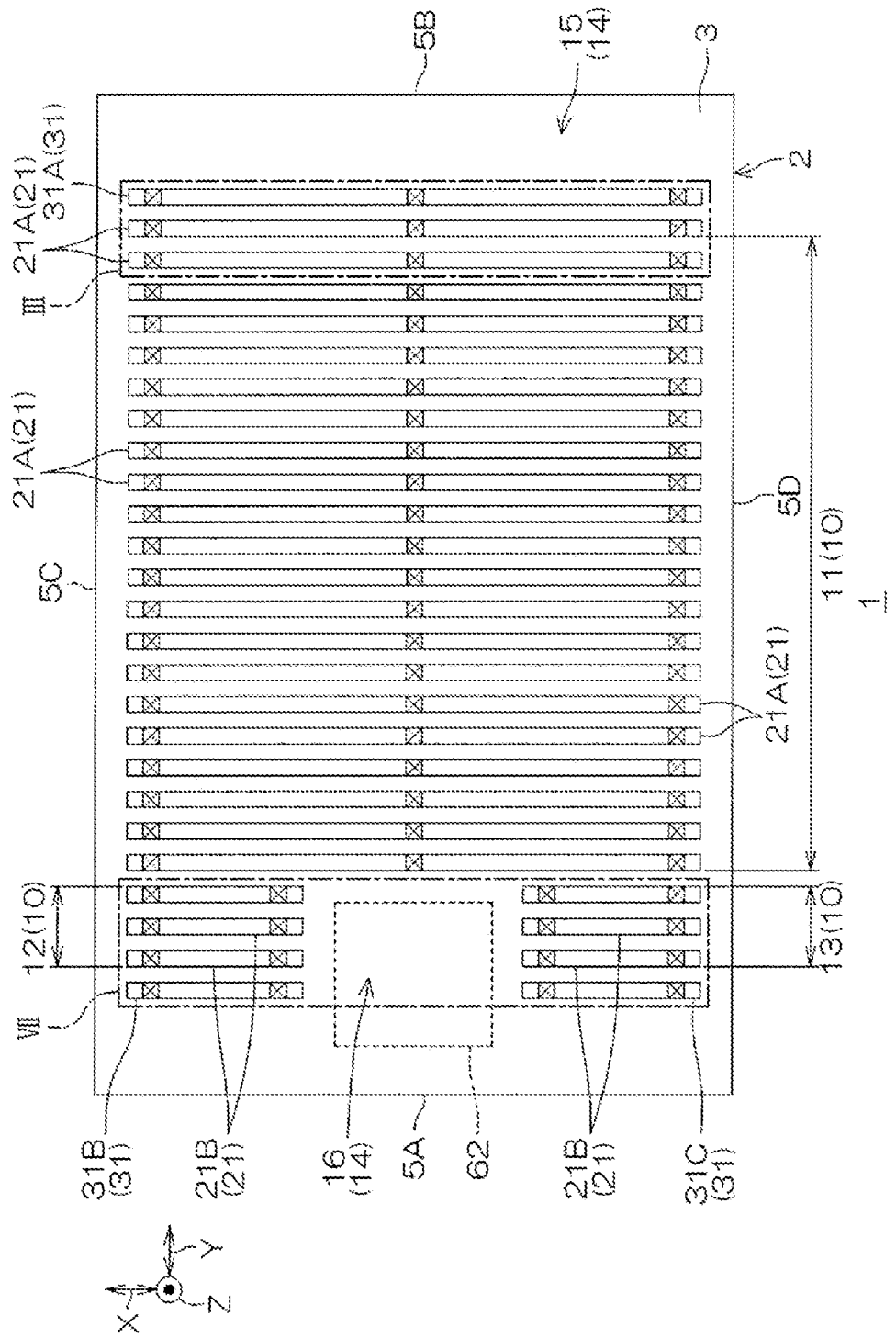
FIG. 2 is a plan view showing a structure of a first main surface of a semiconductor chip shown in FIG. 1.
Figure 3:
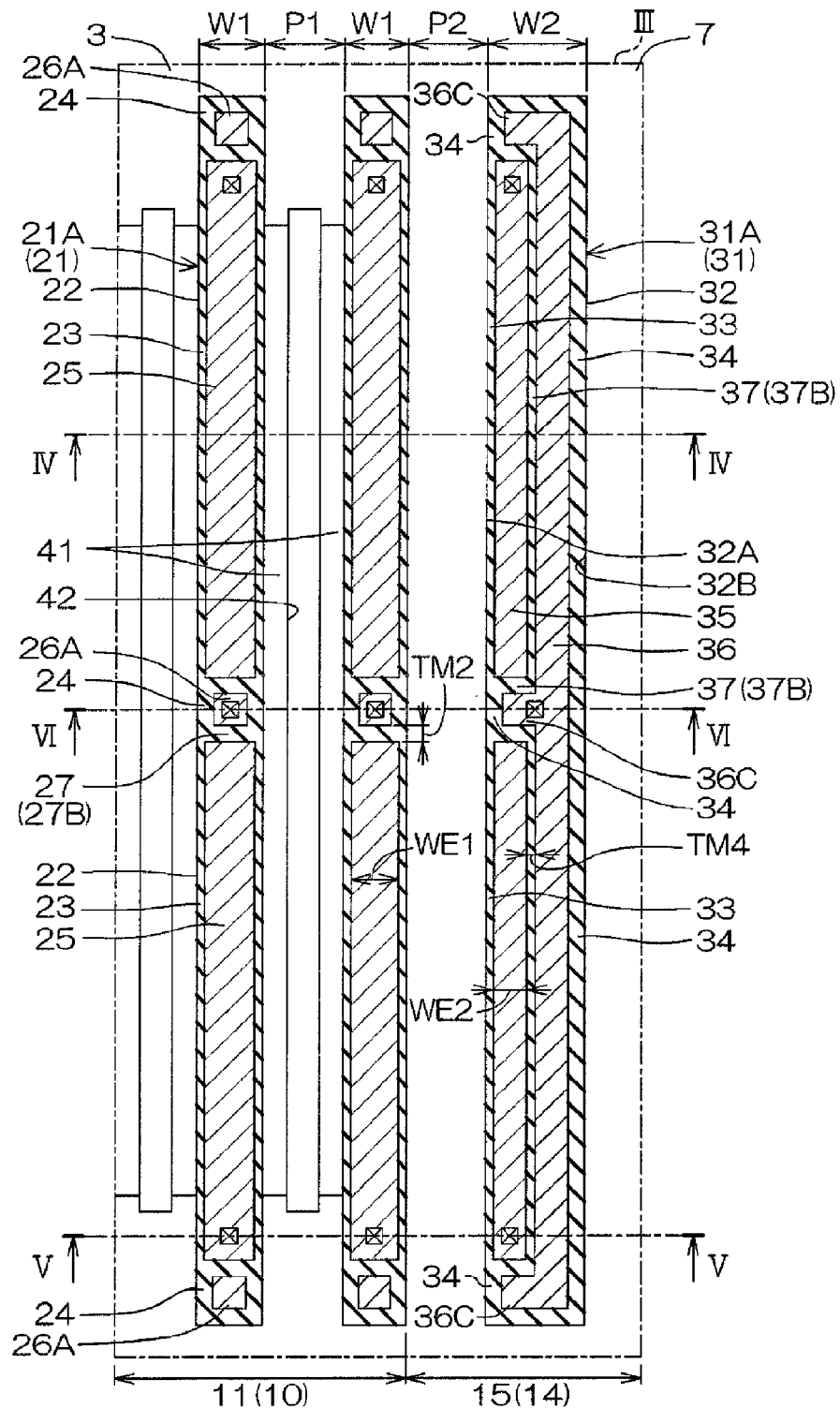
FIG. 3 is an enlarged view of region III shown in FIG. 2.
Figure 4:
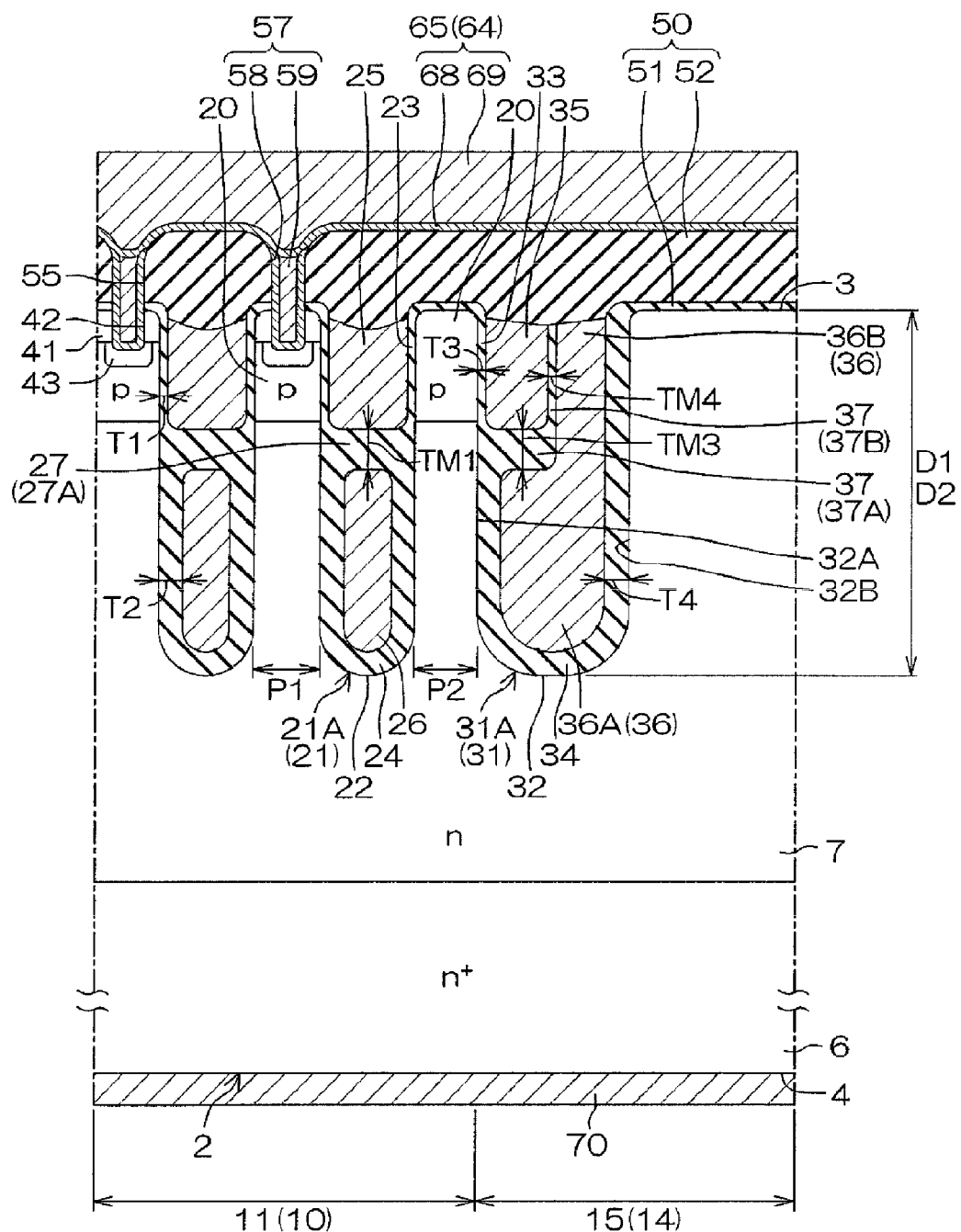
FIG. 4 is a cross-sectional view taken along line IV-IV in FIG. 3.
Figure 5:
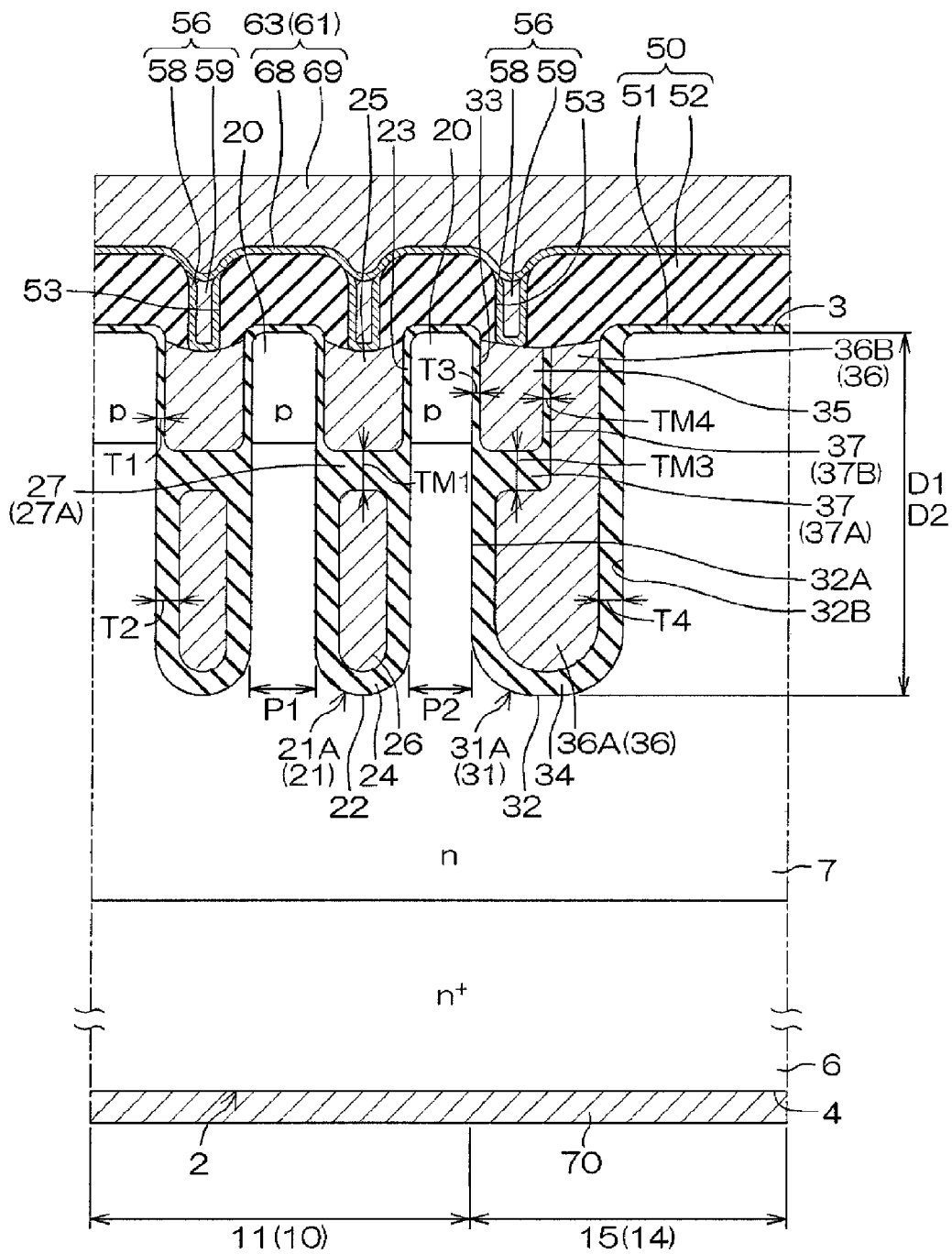
FIG. 5 is a cross-sectional view taken along line V-V shown in FIG. 3.
Figure 6:
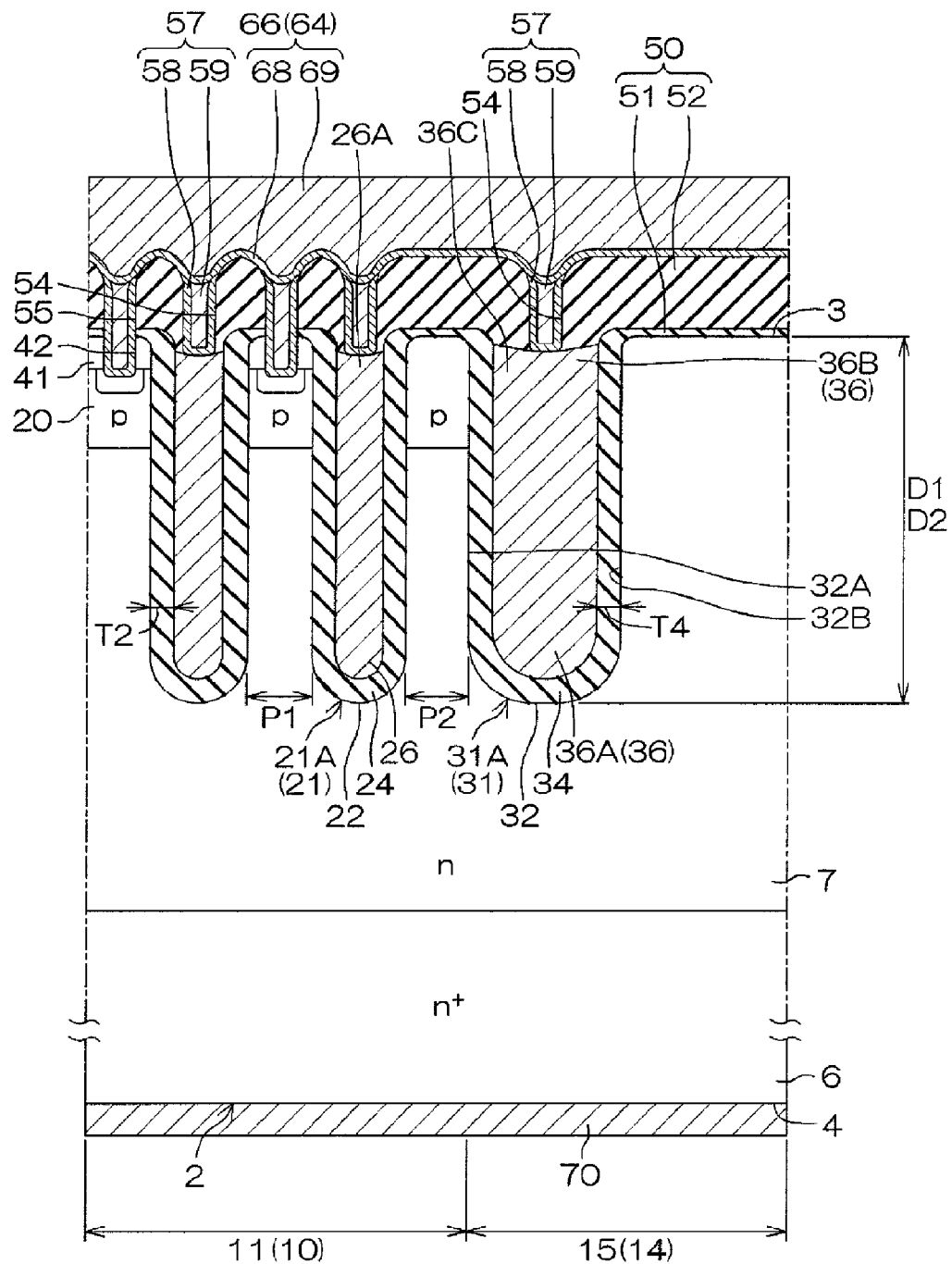
FIG. 6 is a cross-sectional view taken along line VI-VI shown in FIG. 3.
Figure 7:
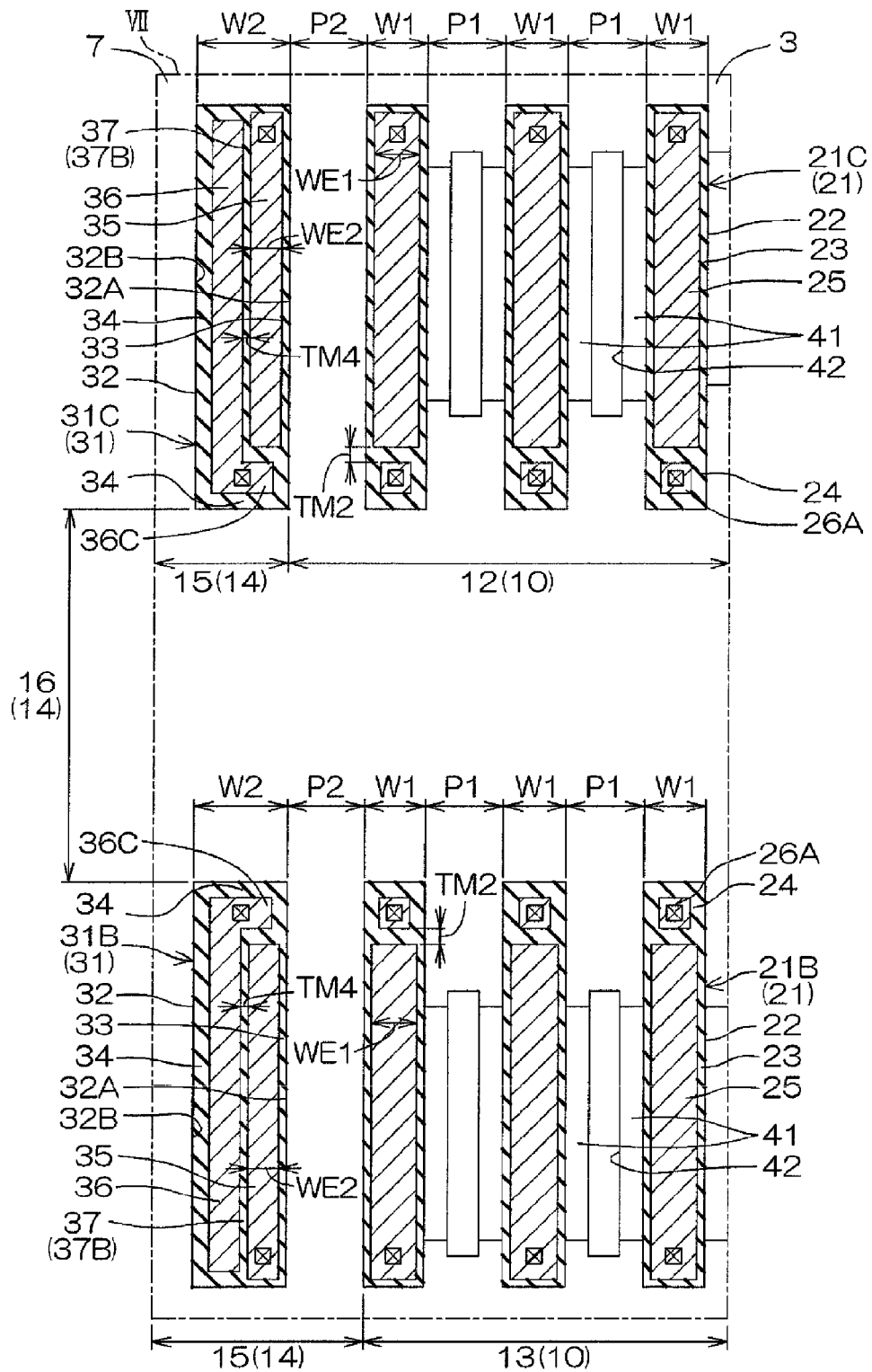
FIG. 7 is an enlarged view of region VII shown in FIG. 2.

Hereinafter, embodiments of the present disclosure will be described in detail with reference to the accompanying drawings. FIG. 1 is a plan view showing a semiconductor device 1 according to a first embodiment of the present disclosure. FIG. 2 is a plan view showing a structure of a first main surface 3 of a semiconductor chip 2 shown in FIG. 1. FIG. 3 is an enlarged view of region III shown in FIG. 2. FIG. 4 is a cross-sectional view taken along line IV-IV shown in FIG. 3. FIG. 5 is a cross-sectional view taken along line V-V shown in FIG. 3. FIG. 6 is a cross-sectional view taken along line VI-VI shown in FIG. 3. FIG. 7 is an enlarged view of region VII shown in FIG. 2.

Referring to FIGS. 1 to 7, the semiconductor device 1 includes the silicon semiconductor chip 2 formed in a rectangular parallelepiped shape. The semiconductor chip 2 includes a first main surface 3 on one side, a second main surface 4 on the other side, and side surfaces 5A, 5B, 5C and 5D that connect the first main surface 3 and the second main surface 4. The first main surface 3 and the second main surface 4 are formed in a quadrilateral shape (specifically, a rectangular shape) in a plan view seen from a normal line direction Z thereof (hereinafter referred to as "plan view").

The side surfaces 5A to 5D include the first side surface 5A, the second side surface 5B, the third side surface 5C and the fourth side surface 5D. The first side surface 5A and the second side surface 5B extend in a first direction X and face a second direction Y intersecting the first direction X. Specifically, the second direction Y is orthogonal to the first direction X. The first side surface 5A and the second side surface 5B form short sides of the semiconductor chip 2. The third side surface 5C and the fourth side surface 5D extend in the second direction Y and face the first direction X. The third side surface 5C and the fourth side surface 5D form long sides of the semiconductor chip 2.

The semiconductor chip 2 includes an n$^+$-type drain region 6 and an n-type drift region 7. The drain region 6 is formed at a surface layer portion of the second main surface 4. The drain region 6 is preferably formed over the entire surface layer portion of the second main surface 4. The n-type impurity concentration in the drain region 6 may be $1\times10^{18}$ cm$^{-3}$ or more and $1\times10^{21}$ cm$^{-3}$ or less. The drain region 6 is formed of a semiconductor substrate in this embodiment.

The thickness of the drain region 6 may be 50 μm or more and 400 μm or less. The thickness of the drain region 6 may be 50 μm or more and 100 μm or less, 100 μm or more and 200 μm or less, 200 μm or more and 300 μm or less, or 300 μm or more and 400 μm or less. The thickness of the drain region 6 is preferably 50 μm or more and 150 μm or less. The drift region 7 is formed at a surface layer portion of the first main surface 3. The drift region 7 is preferably formed over the entire surface layer portion of the first main surface 3. The drift region 7 is formed in a region between the first main surface 3 and the drain region 6 and is electrically connected to the drain region 6. The drift region 7 has an n-type impurity concentration less than the n-type impurity concentration in the drain region 6. The n-type impurity concentration in the drift region 7 may be $1\times10^{15}$ cm$^{-3}$ or more and $1\times10^{18}$ cm$^{-3}$ or less. The drift region 7 is formed by an epitaxial layer in this embodiment.

The drift region 7 has a thickness less than the thickness of the drain region 6. The thickness of the drift region 7 may be 5 μm or more and 30 μm or less. The thickness of the drift region 7 may be 5 μm or more and 10 μm or less, 10 μm or more and 15 μm or less, 15 μm or more and 20 μm or less, 20 μm or more and 25 μm or less, or 25 μm or more and 30 μm or less. The thickness of the drift region 7 is preferably 5 μm or more and 15 μm or less.

Referring to FIG. 2, the semiconductor device 1 includes an active region 10 formed at the first main surface 3 so as to be spaced apart inward from the side surfaces 5A to 5D. The active region 10 is a region in which a MISFET (Metal Insulator Semiconductor Field Effect Transistor) as a functional device is formed. Specifically, the active region 10 includes a first active region 11, a second active region 12 and a third active region 13. The first active region 11 is formed in a central portion of the first main surface 3. The first active region 11 is formed in a quadrilateral shape (rectangular shape extending in the second direction Y) in a plan view.

The second active region 12 is formed in a region between the first side surface 5A and the first active region 11. When a central line that crosses the central portion of the first main surface 3 in the second direction Y is set, the second active region 12 is formed so as to be spaced apart from the central line to one side in the first direction X (the side of the third side surface 5C). The second active region 12 is formed in a quadrilateral shape (rectangular shape extending in the first direction X) in a plan view. The second active region 12 faces the first active region 11 in the second direction Y.

The third active region 13 is formed in a region between the first side surface 5A and the first active region 11. When a central line that crosses the central portion of the first main surface 3 in the second direction Y is set, the third active region 13 is formed so as to be spaced apart from the central line to the other side (the side of the fourth side surface 5D) in the first direction X. The third active region 13 is formed in a quadrilateral shape (rectangular shape extending in the first direction X) in a plan view. The third active region 13 faces the first active region 11 in the second direction Y and faces the second active region 12 in the first direction X.

The semiconductor device 1 includes an inactive region 14 formed at the first main surface 3. The inactive region 14 is a region formed outside the active region 10 and a region in which a functional device (MISFET) is not formed. Specifically, the inactive region 14 includes an outer peripheral region 15 and a pad region 16. The outer peripheral region 15 is formed in an annular shape so as to surround the active region 10 in a plan view. Specifically, the outer peripheral region 15 extends in a band shape along the side surfaces 5A to 5D in a plan view, and surrounds the first active region 11, the second active region 12 and the third active region 13. The pad region 16 is formed in a quadrilateral shape in the region between the second active region 12 and the third active region 13 in a plan view.

Referring to FIGS. 3 to 6, the semiconductor device 1 includes a p-type body region 20 formed at the surface layer portion of the first main surface 3 in the active region 10. The body region 20 is formed uniformly over the entire active region 10. The body region 20 is formed so as to be spaced apart from the bottom portion of the drift region 7 to the side of the first main surface 3. The p-type impurity concentration in the body region 20 may be $1\times10^{16}$ cm$^{-3}$ or more and $1\times10^{18}$ cm$^{-3}$ or less.

Referring to FIGS. 2 to 7, the semiconductor device 1 includes a plurality of trench gate structures 21 formed on the first main surface 3 in the active region 10. The trench gate structures 21 include a plurality of first trench gate structures 21A, a plurality of second trench gate structures 21B and a plurality of third trench gate structures 21C. The first trench gate structures 21A are formed in the first active region 11 so as to be spaced apart from each other. Each of the first trench gate structures 21A is formed in a band shape extending in the first direction X. The first trench gate structures 21A are formed so as to be spaced apart from each other in the second direction Y. The first trench gate structures 21A are formed in a stripe shape extending in the first direction X.

The first trench gate structures 21A are formed so as to be spaced apart from each other by a first interval P1. The first interval P1 may be 0.1 μm or more and 2 μm or less. The first interval P1 may be 0.1 μm or more and 0.5 μm or less, 0.5 μm or more and 1 μm or less, 1 μm or more and 1.5 μm or less, or 1.5 μm or more and 2 μm or less. The first interval P1 is preferably 0.5 μm or more and 1.5 μm or less.

Each of the first trench gate structures 21A includes a gate trench 22, a first insulating film 23, a second insulating film 24, a first electrode 25, a second electrode 26 and a first intermediate insulating film 27. Each of the first trench gate structures 21A includes a vertical split electrode structure in which the first electrode 25 and the second electrode 26 are separately arranged in the depth direction of the gate trench 22. The gate trench 22 is formed by digging the first main surface 3 toward the second main surface 4. The gate trench 22 penetrates the body region 20 and is formed so as to be spaced apart from the bottom portion of the drift region 7 to the side of the first main surface 3.

The angle formed by the side wall of the gate trench 22 with respect to the first main surface 3 in the semiconductor chip 2 may be 90° or more and 92° or less. The gate trench 22 may be formed in a tapered shape in which the opening width narrows from an opening toward a bottom wall. The bottom wall of the gate trench 22 is preferably formed in a curved shape so as to face the second main surface 4. The gate trench 22 has a first width W1. The first width W1 is the width in the direction (i.e., the second direction Y) orthogonal to the direction in which the gate trench 22 extends. The first width W1 may be 0.5 μm or more and 3 μm or less. The first width W1 may be 0.5 μm or more and 1 μm or less, 1 μm or more and 1.5 μm or less, 1.5 μm or more and 2 μm or less, 2 μm or more and 2.5 μm or less, or 2.5 μm or more and 3 μm or less. The first width W1 is preferably 0.5 μm or more and 2 μm or less.

The gate trench 22 has a first depth D1. The first depth D1 may be 1 μm or more and 10 μm or less. The first depth D1 may be 1 μm or more and 2 μm or less, 2 μm or more and 4 μm or less, 4 μm or more and 6 μm or less, 6 μm or more and 8 μm or less, or 8 μm or more and 10 μm or less. The first depth D1 is preferably 1 μm or more and 5 μm or less. The gate trench 22 has a first aspect ratio D1/W1. The first aspect ratio D1/W1 is the ratio of the first depth D1 to the first width W1. The first aspect ratio D1/W1 is preferably more than 1 and 5 or less. It is particularly preferable that the first aspect ratio D1/W1 is 3 or more and 5 or less.

The first insulating film 23 covers an upper wall surface of the gate trench 22. Specifically, the first insulating film 23 covers the upper wall surface located in the region on the opening side of the gate trench 22 with respect to the bottom portion of the body region 20. The first insulating film 23 is in contact with the body region 20. The first insulating film 23 may be in contact with the drift region 7 in the region outside the body region 20. The first insulating film 23 includes silicon oxide in this embodiment. The first insulating film 23 is formed as a gate insulating film.

The first insulating film 23 has a first thickness T1. The first thickness T1 is the thickness of the first insulating film 23 along the normal line direction of the wall surface of the gate trench 22. The first thickness T1 may be 0.01 μm or more and 0.2 μm or less. The first thickness T1 may be 0.01 μm or more and 0.05 μm or less, 0.05 μm or more and 0.1 μm or less, 0.1 μm or more and 0.15 μm or less, or 0.15 μm or more and 0.2 μm or less. The first thickness T1 is preferably 0.05 μm or more and 0.1 μm or less.

The second insulating film 24 covers a lower wall surface of the gate trench 22. Specifically, the second insulating film 24 covers the lower wall surface located in the region on the bottom wall side of the gate trench 22 with respect to the bottom portion of the body region 20. The second insulating film 24 defines a U-shaped recess space in the region on the bottom wall side of the gate trench 22. The second insulating film 24 is in contact with the drift region 7. The second insulating film 24 includes silicon oxide in this embodiment.

The second insulating film 24 has a second thickness T2 larger than the first thickness T1 of the first insulating film 23. The second thickness T2 is the thickness of the second insulating film 24 along the normal line direction of the wall surface of the gate trench 22. The second thickness T2 may be 0.1 μm or more and 1 μm or less. The second thickness T2 may be 0.1 μm or more and 0.25 μm or less, 0.25 μm or more and 0.5 μm or less, 0.5 μm or more and 0.75 μm or less, or 0.75 μm or more and 1 μm or less. The second thickness T2 is preferably 0.15 μm or more and 0.65 μm or less.

The first electrode 25 is embedded in the upper side (opening side) in the gate trench 22 with the first insulating film 23 interposed therebetween. The first electrode 25 faces the body region 20 with the first insulating film 23 interposed therebetween. The bottom portion of the first electrode 25 is located on the bottom wall side of the gate trench 22 with respect to the depth position of the bottom portion of the body region 20. The bottom portion of the first electrode 25 faces the drift region 7 with the first insulating film 23 interposed therebetween. The area of the first electrode 25 facing the body region 20 is larger than the area of the first electrode 25 facing the drift region 7. The first electrode 25 includes conductive polysilicon in this embodiment. The first electrode 25 is formed as a gate electrode. A gate potential as a control potential is applied to the first electrode 25.

The first electrode 25 is formed in a band shape extending in the first direction X in a plan view. The first electrode 25 has a first electrode width WE1 with respect to the second direction Y. The first electrode width WE1 is a value obtained by subtracting the first thickness T1 of the first insulating film 23 from the first width W1 of the gate trench 22. The second electrode 26 is embedded in the lower side (bottom wall side) in the gate trench 22 with the second insulating film 24 interposed therebetween. The second electrode 26 faces the drift region 7 with the second insulating film 24 interposed therebetween. The second electrode 26 includes conductive polysilicon in this embodiment. The second electrode 26 is formed as a field electrode. A source potential (e.g., a ground potential) as a reference potential is applied to the second electrode 26.

The second electrode 26 includes one or more (three, in this embodiment) lead-out electrodes 26A led out toward the opening side of the gate trench 22 with the second insulating film 24 interposed therebetween. In this embodiment, the lead-out electrodes 26A are formed at one end of the gate trench 22 on one side (on the side of the third side surface 5C), at the other end of the gate trench 22 on the other side (on the side of the fourth side surface 5D), and at the central portion of the gate trench 22. The lead-out electrode 26A formed at the central portion divides the first electrode 25 into two portions, i.e., a portion on one side (the side of the third side surface 5C) of the gate trench 22 and a portion on the other side (the side of the fourth side surface 5D) of the gate trench 22.

Looking at the first trench gate structures 21A, the lead-out electrodes 26A are arranged in a row in the second direction Y in a plan view so as to face each other. The arrangement and number of the lead-out electrodes 26A are arbitrary, and are appropriately adjusted according to the length of the gate trench 22 and the wiring layout. The first intermediate insulating film 27 is interposed between the first electrode 25 and the second electrode 26 to electrically insulate the first electrode 25 and the second electrode 26. The first intermediate insulating film 27 is connected to the first insulating film 23 and the second insulating film 24. The first intermediate insulating film 27 includes silicon oxide in this embodiment.

Specifically, the first intermediate insulating film 27 includes a first intermediate portion 27A and a second intermediate portion 27B. The first intermediate portion 27A is located directly below the first electrode 25 to electrically insulate the first electrode 25 and the second electrode 26 in the depth direction of the gate trench 22. The first intermediate portion 27A has a first intermediate thickness TM1 larger than the first thickness T1 of the first insulating film 23 in the normal line direction Z.

The first intermediate thickness TM1 may be 0.05 μm or more and 1 μm or less. The first intermediate thickness TM1 may be 0.05 μm or more and 1 μm or less, 0.1 μm or more and 0.25 μm or less, 0.25 μm or more and 0.5 μm or less, 0.5 μm or more and 0.75 μm or less, or 0.75 μm or more and 1 μm or less. The first intermediate thickness TM1 is preferably 0.2 μm or more and 0.5 μm or less.

The second intermediate portion 27B covers a peripheral edge of the first electrode 25 in a plan view, and electrically insulates the first electrode 25 and the second electrode 26 (lead-out electrodes 26A) in the horizontal direction parallel to the first main surface 3. The second intermediate portion 27B has a second intermediate thickness TM2 in the horizontal direction parallel to the first main surface 3. The second intermediate thickness TM2 is arbitrary and may be larger than the first intermediate thickness TM1 or smaller than the first intermediate thickness TM1.

The second intermediate thickness TM2 may be 0.05 μm or more and 15 μm or less. The second intermediate thickness TM2 may be 0.05 μm or more and 1 μm or less, 1 μm or more and 5 μm or less, 5 μm or more and 10 μm or less, or 10 μm or more and 15 μm or less. The second intermediate thickness TM2 is preferably 3 μm or more and 5 μm or less. Referring to FIG. 7, the second trench gate structures 21B are formed in the second active region 12. Each of the second trench gate structures 21B is formed in a band shape extending in the first direction. The second trench gate structures 21B are formed so as to be spaced apart from each other by a first interval P1 in the second direction Y. The second trench gate structures 21B are formed in a stripe shape extending in the first direction X.

Similar to the first trench gate structures 21A, each of the second trench gate structures 21B has a vertical split electrode structure including a gate trench 22, a first insulating film 23, a second insulating film 24, a first electrode 25, a second electrode 26 and a first intermediate insulating film 27. The second trench gate structures 21B have the same structure as the first trench gate structures 21A except that the length of the gate trench 22 and the layout of the lead-out electrodes 26A (the second electrodes 26) are different. Specific descriptions of the second trench gate structures 21B will be omitted.

Referring to FIG. 7, the third trench gate structures 21C are formed in the third active region 13. Each of the third trench gate structures 21C is formed in a band shape extending in the first direction X. The third trench gate structures 21C are formed so as to be spaced apart from each other by a first interval P1 in the second direction Y. The third trench gate structures 21C are formed in a stripe shape extending in the first direction X. Similar to the first trench gate structures 21A, each of the third trench gate structures 21C has a vertical split electrode structure including a gate trench 22, a first insulating film 23, a second insulating film 24, a first electrode 25, a second electrode 26 and a first intermediate insulating film 27. The third trench gate structures 21C have the same structure as the first trench gate structures 21A except that the length of the gate trench 22 and the layout of the lead-out electrodes 26A (the second electrodes 26) are different. Specific descriptions of the third trench gate structures 21C will be omitted.

Referring to FIGS. 2 to 7, the semiconductor device 1 includes a plurality of field trench structures 31 formed on the first main surface 3 in the inactive region 14. The field trench structures 31 include one first field trench structure 31A, one second field trench structure 31B and one third field trench structure 31C. The first field trench structure 31A is formed in the inactive region 14 so as to be spaced apart from the first trench gate structure 21A, and is adjacent to the first trench gate structure 21A. The first field trench structure 31A is formed in a band shape extending in the first direction X. That is, the first field trench structure 31A extends parallel to the first trench gate structure 21A. The first field trench structure 31A defines the first active region 11 in a region on one side of the first main surface 3 (on the side of the first side surface 5A), and defines the inactive region 14 on the other side of the first main surface 3 (on the side of the second side surface 5B).

The first field trench structure 31A is formed so as to be spaced apart by a second interval P2 from the first trench gate structure 21A. The second interval P2 may be 0.1 μm or more and 2 μm or less. The second interval P2 may be 0.1 μm or more and 0.5 μm or less, 0.5 μm or more and 1 μm or less, 1 μm or more and 1.5 μm or less, or 1.5 μm or more and 2 μm or less. The second interval P2 is preferably 0.5 μm or more and 1.5 μm or less.

The second interval P2 is preferably equal to the first interval P1 of the trench gate structure 21. The second interval P2 being equal to the first interval P1 means that the value of the second interval P2 falls within ±10% of the value of the first interval P1. The first field trench structure 31A includes a field trench 32, a third insulating film 33, a fourth insulating film 34, a third electrode 35, a fourth electrode 36 and a second intermediate insulating film 37. The first field trench structure 31A has a horizontal split electrode structure in which the third electrode 35 and the fourth electrode 36 are separately arranged in the width direction of the field trench 32. The field trench 32 is formed by digging the first main surface 3 toward the second main surface 4. The field trench 32 penetrates the body region 20 and is formed so as to be spaced apart from the bottom portion of the drift region 7 to the side of the first main surface 3.

The field trench 32 includes a facing wall 32A and a non-facing wall 32B. The facing wall 32A faces the gate trench 22 with a portion of the semiconductor chip 2 interposed therebetween. The non-facing wall 32B is located on the opposite side of the facing wall 32A and does not face the gate trench 22. The angle formed by the facing wall 32A (non-facing wall 32B) of the field trench 32 with respect to the first main surface 3 in the semiconductor chip 2 may be 90° or more and 92° or less. The field trench 32 may be formed in a tapered shape in which the opening width narrows from an opening toward a bottom wall. The bottom wall of the field trench 32 is preferably formed in a curved shape toward the second main surface 4.

The field trench 32 has a second width W2. The second width W2 is the width in the direction orthogonal to the direction in which the field trench 32 extends (i.e., in the second direction Y). The second width W2 may be 0.5 μm or more and 4 μm or less. The second width W2 may be 0.5 μm or more and 1 μm or less, 1 μm or more and 2 μm or less, 2 μm or more and 3 μm or less, or 3 μm or more and 4 μm or less. The second width W2 is preferably 1 μm or more and 2.5 μm or less.

The field trench 32 has a second depth D2. The second depth D2 may be 1 μm or more and 10 μm or less. The second depth D2 may be 1 μm or more and 2 μm or less, 2 μm or more and 4 μm or less, 4 μm or more and 6 μm or less, 6 μm or more and 8 μm or less, or 8 μm or more and 10 μm or less. The second depth D2 is preferably 1 μm or more and 5 μm or less. The second width W2 exceeds the first width W1 of the gate trench 22 in this embodiment. The second width W2 may be equal to the first width W1. The second width W2 being equal to the first width W1 means that the value of the second width W2 falls within ±10% of the value of the first width W1. The second depth D2 is preferably equal to the first depth D1 of the gate trench 22. The second depth D2 being equal to the first depth D1 means that the value of the second depth D2 falls within ±10% of the value of the first depth D1.

The field trench 32 has a second aspect ratio D2/W2. The second aspect ratio D2/W2 is the ratio of the second depth D2 to the second width W2. The second aspect ratio D2/W2 is preferably more than 1 and 5 or less. It is particularly preferable that the second aspect ratio D2/W2 is 3 or more and 5 or less. The second aspect ratio D2/W2 is less than the first aspect ratio D1/W1 of the gate trench 22 in this embodiment.

The third insulating film 33 covers an upper wall surface of the field trench 32 on the side of the facing wall 32A. Specifically, the third insulating film 33 covers the upper wall surface located in the region on the opening side of the field trench 32 with respect to the bottom portion of the body region 20. The third insulating film 33 is in contact with the body region 20. The third insulating film 33 faces the first insulating film 23 of the trench gate structure 21 with a portion of the semiconductor chip 2 interposed therebetween. The third insulating film 33 includes silicon oxide in this embodiment.

The third insulating film 33 has a third thickness T3 smaller than the second thickness T2 of the second insulating film 24 of the trench gate structure 21. The third thickness T3 is the thickness of the third insulating film 33 along the normal line direction of the wall surface of the field trench 32. The third thickness T3 may be 0.01 μm or more and 0.2 μm or less. The third thickness T3 may be 0.01 μm or more and 0.05 μm or less, 0.05 μm or more and 0.1 μm or less, 0.1 μm or more and 0.15 μm or less, or 0.15 μm or more and 0.2 μm or less. The third thickness T3 is preferably 0.05 μm or more and 0.1 μm or less.

The third thickness T3 is preferably equal to the first thickness T1 of the first insulating film 23 of the trench gate structure 21. The third thickness T3 being equal to the first thickness T1 means that the value of the third thickness T3 falls within ±10% of the value of the first thickness T1. The fourth insulating film 34 covers the lower wall surface of the field trench 32 on the side of the facing wall 32A and the non-facing wall 32B via the bottom wall of the field trench 32. Specifically, the fourth insulating film 34 covers the lower wall surface on the bottom wall side with respect to the bottom portion of the body region 20 on the side of the facing wall 32A, and is connected to the third insulating film 33. The fourth insulating film 34 covers the lower wall surface of the non-facing wall 32B from the side of the facing wall 32A via the bottom wall of the field trench 32. The fourth insulating film 34 further covers the upper wall surface of the non-facing wall 32B. The fourth insulating film 34 defines a U-shaped recess space in the region on the side of the bottom wall of the field trench 32. The fourth insulating film 34 is in contact with the drift region 7.

The portion of the fourth insulating film 34 that covers the facing wall 32A faces the second insulating film 24 of the trench gate structure 21 with a part of the semiconductor chip 2 interposed therebetween. The portion of the fourth insulating film 34 that covers the non-facing wall 32B faces the third insulating film 33 with the internal space of the field trench 32 interposed therebetween. The fourth insulating film 34 includes silicon oxide in this embodiment. The fourth insulating film 34 has a fourth thickness T4 larger than the third thickness T3 of the third insulating film 33. The fourth thickness T4 is the thickness of the fourth insulating film 34 along the normal line direction of the wall surface of the field trench 32.

The fourth thickness T4 may be 0.1 μm or more and 1 μm or less. The fourth thickness T4 may be 0.1 μm or more and 0.25 μm or less, 0.25 μm or more and 0.5 μm or less, 0.5 μm or more and 0.75 μm or less, or 0.75 μm or more and 1 μm or less. The fourth thickness T4 is preferably 0.15 μm or more and 0.65 μm or less.

The fourth insulating film 34 is preferably equal to the second thickness T2 of the second insulating film 24 of the trench gate structure 21. The fourth thickness T4 being equal to the second thickness T2 means that the value of the fourth thickness T4 falls within ±10% of the value of the second thickness T2. The third electrode 35 is embedded on the upper side in the field trench 32 with the third insulating film 33 interposed therebetween on the side of the facing wall 32A of the field trench 32. The third electrode 35 faces the body region 20 with the third insulating film 33 interposed therebetween. The bottom portion of the third electrode 35 is located on the side of the bottom wall of the field trench 32 with respect to the depth position of the bottom portion of the body region 20. The bottom portion of the third electrode 35 faces the drift region 7 with the third insulating film 33 interposed therebetween. The area of the third electrode 35 facing the body region 20 is larger than the area of the third electrode 35 facing the drift region 7.

The third electrode 35 faces the first electrode 25 of the trench gate structure 21 with a portion of the semiconductor chip 2 interposed therebetween. The third electrode 35 includes conductive polysilicon in this embodiment. The third electrode 35 may be formed as a gate electrode. In this case, a gate potential as a control potential may be applied to the third electrode 35. The third electrode 35 is formed in a band shape extending in the first direction X in a plan view. In this embodiment, the third electrode 35 has a second electrode width WE2 less than the first electrode width WE1 of the first electrode 25 in the second direction Y. As a result, the width of the field trench structure 31 can be narrowed. Of course, the third electrode 35 having a second electrode width WE2 equal to the first electrode width WE1 may be formed.

The fourth electrode 36 is embedded in the lower side and the upper side in the field trench 32 with the fourth insulating film 34 interposed therebetween on the side of the non-facing wall 32B of the field trench 32. The fourth electrode 36 crosses the bottom portion of the third electrode 35 in the depth direction of the field trench 32. The fourth electrode 36 faces the drift region 7 with the fourth insulating film 34 interposed therebetween. The fourth electrode 36 faces the second electrode 26 of the trench gate structure 21 with a portion of the semiconductor chip 2 interposed therebetween.

Specifically, the fourth electrode 36 includes a lower electrode portion 36A and an upper electrode portion 36B arranged in the depth direction of the field trench 32. The lower electrode portion 36A is located on the bottom wall side of the field trench 32 with respect to the bottom portion of the third electrode 35. The lower electrode portion 36A does not face the third electrode 35 in the horizontal direction parallel to the first main surface 3, but makes contact with only the fourth insulating film 34. The lower electrode portion 36A includes a portion facing the third electrode 35 in the depth direction of the field trench 32 in the region directly below the third electrode 35. The lower electrode portion 36A faces the second electrode 26 of the trench gate structure 21 with a portion of the semiconductor chip 2 interposed therebetween. On the other hand, the upper electrode portion 36B is located on the opening side of the field trench 32 with respect to the bottom portion of the third electrode 35. The upper electrode portion 36B faces the third electrode 35 in the horizontal direction parallel to the first main surface 3.

The fourth electrode 36 includes one or more (three, in this embodiment) lead-out electrodes 36C led out from the side of the non-facing wall 32B of the field trench 32 to the side of the facing wall 32A with the fourth insulating film 34 interposed therebetween. Each of the lead-out electrodes 36C is formed by the lower electrode portion 36A and the upper electrode portion 36B of the fourth electrode 36. In this embodiment, the lead-out electrodes 36C are formed at one end of the field trench 32 on one side (on the side of the third side surface 5C), at the other end of the field trench 32 on the other side (on the side of the fourth side surface 5D), and at the central portion of the field trench 32. The lead-out electrode 36C formed at the central portion divides the third electrode 35 into two portions, i.e., a portion on one side (the side of the third side surface 5C) of the field trench 32 and a portion on the other side (the side of the fourth side surface 5D) of the field trench 32.

The lead-out electrodes 36C face the third electrode 35 in the first direction X. When a plurality of lines crossing the lead-out electrodes 26A of the trench gate structures 21 in the second direction Y is set, the lead-out electrodes 36C are located on the lines. As a result, the lead-out electrodes 36C face the lead-out electrodes 26A in a one-to-one correspondence relationship with a portion of the semiconductor chip 2 interposed therebetween. The arrangement and number of the lead-out electrodes 36C are arbitrary, and are appropriately adjusted according to the layout of the lead-out electrodes 26A (second electrode 26).

The fourth electrode 36 includes conductive polysilicon in this embodiment. The fourth electrode 36 is formed as a field electrode. A source potential (e.g., a ground potential) as a reference potential is applied to the fourth electrode 36. The second intermediate insulating film 37 is interposed between the third electrode 35 and the fourth electrode 36 to insulate and separate the third electrode 35 and the fourth electrode 36. The second intermediate insulating film 37 is connected to the third insulating film 33 and the fourth insulating film 34. The second intermediate insulating film 37 faces the first intermediate insulating film 27 of the trench gate structure 21 with a portion of the semiconductor chip 2 interposed therebetween. The second intermediate insulating film 37 includes silicon oxide in this embodiment.

Specifically, the second intermediate insulating film 37 includes a third intermediate portion 37A and a fourth intermediate portion 37B. The third intermediate portion 37A is located directly below the third electrode 35 to electrically insulate the third electrode 35 and the fourth electrode 36 (lower electrode portion 36A) in the depth direction of the field trench 32. The third intermediate portion 37A faces the first intermediate portion 27A of the first intermediate insulating film 27 with a portion of the semiconductor chip 2 interposed therebetween.

The third intermediate portion 37A has a third intermediate thickness TM3 larger than the third thickness T3 of the third insulating film 33 in the normal line direction Z. The third intermediate thickness TM3 may be 0.05 μm or more and 1 μm or less. The third intermediate thickness TM3 may be 0.05 μm or more and 1 μm or less, 0.1 μm or more and 0.25 μm or less, 0.25 μm or more and 0.5 μm or less, 0.5 μm or more and 0.75 μm or less, or 0.75 μm or more and 1 μm or less. The third intermediate thickness TM3 is preferably 0.2 μm or more and 0.5 μm or less.

The third intermediate thickness TM3 is preferably equal to the first intermediate thickness TM1 of the first intermediate insulating film 27. The third intermediate thickness TM3 being equal to the first intermediate thickness TM1 means that the value of the third intermediate thickness TM3 falls within ±10% of the value of the first intermediate thickness TM1. The fourth intermediate portion 37B covers a peripheral edge of the third electrode 35 in a plan view to electrically insulate the third electrode 35 and the fourth electrode 36 (upper electrode portion 36B) in the horizontal direction parallel to the first main surface 3. The fourth intermediate portion 37B has a fourth intermediate thickness TM4 in the horizontal direction parallel to the first main surface 3. The fourth intermediate thickness TM4 is arbitrary and may be larger than the third intermediate thickness TM3 or smaller than the third intermediate thickness TM3.

The fourth intermediate thickness TM4 may be 0.05 μm or more and 15 μm or less. The fourth intermediate thickness TM4 may be 0.05 μm or more and 1 μm or less, 1 μm or more and 5 μm or less, 5 μm or more and 10 μm or less, or 10 μm or more and 15 μm or less. The fourth intermediate thickness TM4 is preferably 3 μm or more and 5 μm or less. The fourth intermediate thickness TM4 is preferably equal to the second intermediate thickness TM2 of the first intermediate insulating film 27. The fourth intermediate thickness TM4 being equal to the second intermediate thickness TM2 means that the value of the fourth intermediate thickness TM4 falls within ±10% of the value of the second intermediate thickness TM2.

Referring to FIG. 7, the second field trench structure 31B is formed in the inactive region 14 so as to be spaced apart by a second interval P2 from the second trench gate structure 21B, so that the second field trench structure 31B is adjacent to the second trench gate structure 21B. The second field trench structure 31B is formed in a band shape extending in the first direction X. That is, the second field trench structure 31B extends parallel to the second trench gate structure 21B. The second field trench structure 31B defines the second active region 12 in the region on the other side of the first main surface 3 (on the side of the second side surface 5B), and defines the inactive region 14 in the region on one side of the first main surface 3 (on the side of the first side surface 5A).

Similar to the first field trench structure 31A, the second field trench structure 31B has a horizontal split electrode structure including a field trench 32, a third insulating film 33, a fourth insulating film 34, a third electrode 35, a fourth electrode 36 and a second intermediate insulating film 37. The second field trench structure 31B has the same structure as the first field trench structure 31A except that the length of the field trench 32 and the layout of the lead-out electrodes 36C (fourth electrodes 36) are different. Specific descriptions of the second field trench structure 31B will be omitted.

Referring to FIG. 7, the third field trench structure 31C is formed in the inactive region 14 so as to be spaced apart by a second interval P2 from the third trench gate structure 21C, so that the third field trench structure 31C is adjacent to the third trench gate structure 21C. The third field trench structure 31C is formed in a band shape extending in the first direction X. That is, the third field trench structure 31C extends parallel to the third trench gate structure 21C. The third field trench structure 31C defines the third active region 13 in the region on the other side of the first main surface 3 (on the side of the second side surface 5B), and defines the inactive region 14 in the region on one side of the first main surface 3 (on the side of the first side surface 5A).

Similar to the first field trench structure 31A, the third field trench structure 31C has a horizontal split electrode structure including a field trench 32, a third insulating film 33, a fourth insulating film 34, a third electrode 35, a fourth electrode 36 and a second intermediate insulating film 37. The third field trench structure 31C has the same structure as the first field trench structure 31A except that the length of the field trench 32 and the layout of the lead-out electrodes 36C (fourth electrodes 36) are different. Specific descriptions of the third field trench structure 31C will be omitted.

Referring to FIGS. 3 and 4, the semiconductor device 1 includes a plurality of n$^+$-type source regions 41 formed along the gate trenches 22 (trench gate structure 21) in the surface layer portion of the body region 20. Each of the source regions 41 has an n-type impurity concentration that exceeds the n-type impurity concentration of the drift region 7. The n-type impurity concentration of each of the source regions 41 may be $1\times10^{18}$ cm$^{-3}$ or more and $1\times10^{21}$ cm$^{-3}$ or less.

Each of the source regions 41 is formed in a band shape extending along the gate trenches 22 in a plan view. Each of the source regions 41 covers the first insulating film 23 exposed from the corresponding gate trench 22. That is, each of the source regions 41 faces the first electrode 25 with the first insulating film 23 interposed therebetween. The bottom portion of each of the source regions 41 is located in the region on the side of the first main surface 3 so as to be spaced apart from the bottom portion of the body region 20. Each of the source regions 41 defines a MISFET channel with the drift region 7.

The semiconductor device 1 includes a plurality of source contact holes 42 formed in the region between the gate trenches 22 (trench gate structure 21) in the active region 10. Each of the source contact holes 42 is formed in a band shape extending in the first direction X in a plan view. The source contact holes 42 are formed in a stripe shape extending in the first direction X in a plan view.

The source contact holes 42 are formed alternately with the gate trenches 22 along the second direction Y in such a manner as to sandwich one gate trench 22. With respect to the first direction X, the length of each of the source contact holes 42 is preferably less than the length of each of the gate trenches 22. Each of the source contact holes 42 is formed so as to be spaced apart from the gate trench 22 in a plan view. Each of the source contact holes 42 is formed to a depth that crosses the source region 41. The bottom wall of each of the source contact holes 42 is located in the region between the bottom portion of the body region 20 and the bottom portion of the source region 41. Each of the source contact holes 42 exposes the source region 41 from both sides.

The semiconductor device 1 includes a plurality of pt-type contact regions 43 formed in the body region 20 along the source contact holes 42. Each of the contact regions 43 has a p-type impurity concentration that exceeds the p-type impurity concentration of the body region 20. The p-type impurity concentration of each of the contact regions 43 may be $1\times10^{18}$ cm$^{-3}$ or more and $1\times10^{21}$ cm$^{-3}$ or less.

Each of the contact regions 43 is formed in the body region 20 along the bottom wall of each of the source contact holes 42. Each of the contact regions 43 is formed so as to be spaced apart from the bottom portion of the body region 20 to the bottom wall side of each of the source contact holes 42. Each of the contact regions 43 covers the entire bottom wall of each of the source contact holes 42. Each of the contact regions 43 may cover the side wall of each of the source contact holes 42. Each of the contact regions 43 is electrically connected to the source regions 41.

Referring to FIGS. 4 to 6, the semiconductor device 1 includes a main surface insulating film 50 that covers the first main surface 3. The main surface insulating film 50 selectively covers the field trench structures 31 and the trench gate structures 21. In this embodiment, the main surface insulating film 50 has a stacked structure including a first main surface insulating film 51 and a second main surface insulating film 52 which are stacked in this order from the side of the first main surface 3.

The first main surface insulating film 51 includes silicon oxide in this embodiment. The first main surface insulating film 51 covers the first main surface 3 and is connected to the first insulating film 23, the second insulating film 24, the third insulating film 33 and the fourth insulating film 34. The second main surface insulating film 52 includes silicon oxide in this embodiment. The second main surface insulating film 52 selectively covers the field trench structures 31 and the trench gate structures 21. The second main surface insulating film 52 has a thickness exceeding the thickness of the first main surface insulating film 51.

The main surface insulating film 50 has a plurality of gate openings 53, a plurality of source openings 54 and a plurality of source contact openings 55. The gate openings 53 are formed in a portion of the main surface insulating film 50 that covers the trench gate structures 21 and a portion of the main surface insulating film 50 that covers the field trench structures 31. The gate openings 53 expose the first electrodes 25 and the third electrodes 35. The gate openings 53 may expose one ends and/or the other ends of the trench gate structures 21. It is preferable that the gate openings 53 are arranged in a row at intervals in the second direction Y.

The source openings 54 are formed in a portion of the main surface insulating film 50 that covers the trench gate structures 21 and a portion of the main surface insulating film 50 that covers the field trench structures 31. The source openings 54 expose the second electrode 26 (lead-out electrodes 26A) of the trench gate structures 21 and the fourth electrode 36 (lead-out electrodes 36C) of the field trench structures 31.

The source openings 54 are arranged in a row at intervals in the second direction Y according to the arrangement of the lead-out electrodes 26A and the arrangement of the lead-out electrodes 36C. In this embodiment, the source openings 54 expose the lead-out electrodes 26A and the lead-out electrodes 36C located at the central portion, and do not expose the lead-out electrodes 26A and the lead-out electrodes 36C located at both ends. That is, the lead-out electrodes 26A and the lead-out electrodes 36C located at both ends are covered by the main surface insulating film 50.

Each of the source contact openings 55 is formed in a portion of the main surface insulating film 50 that covers the region between the trench gate structures 21. The source contact openings 55 expose the source contact holes 42 in a one-to-one correspondence. The source contact openings 55 have a planar shape that matches the source contact holes 42, and communicate with the source contact holes 42, respectively.

The semiconductor device 1 includes a plurality of gate plug electrodes 56 and a plurality of source plug electrodes 57 embedded in the main surface insulating film 50. The gate plug electrodes 56 are embedded in the gate openings 53. The gate plug electrodes 56 are electrically connected to the first electrode 25 of the trench gate structure 21 and the third electrode 35 of the field trench structure 31 in the corresponding gate opening 53.

The source plug electrodes 57 are embedded in the source openings 54 and the source contact openings 55. The source plug electrodes 57 are electrically connected to the lead-out electrodes 26A (second electrodes 26) of the trench gate structure 21 and the lead-out electrodes 36C (fourth electrodes 36) of the field trench structure 31 in the corresponding source openings 54. Furthermore, the source plug electrodes 57 are inserted into the source contact holes 42 through the corresponding source contact openings 55, and are electrically connected to the source region 41 and the contact region 43.

The gate plug electrodes 56 and the source plug electrodes 57 have a stacked structure including a barrier electrode 58 and a main electrode 59 stacked in this order from the side of the main surface insulating film 50. The barrier electrode 58 is formed in a film shape along the main surface insulating film 50 to define a recess space. The barrier electrode 58 includes at least one selected from the group of a Ti layer and a TiN layer. The main electrode 59 is embedded in the main surface insulating film 50 with the barrier electrode 58 interposed therebetween. The main electrode 59 contains tungsten.

Referring to FIGS. 1 and 2, the semiconductor device 1 includes a gate main surface electrode 61 formed over the main surface insulating film 50. The gate main surface electrode 61 is electrically connected to the first electrodes 25 of the trench gate structures 21 and the third electrodes 35 of the field trench structures 31 via the gate plug electrodes 56. In FIGS. 1, 2, 3 and 7, the connection portions of the gate main surface electrode 61 to the first electrodes 25 and the third electrodes 35 are indicated by marks x.

Specifically, the gate main surface electrode 61 integrally includes a gate pad electrode 62 and a gate finger electrode 63. The gate pad electrode 62 is an external terminal portion that is externally connected to a conducting wire (e.g., a bonding wire) or the like. The gate pad electrode 62 is formed over the portion of the main surface insulating film 50 that covers the pad region 16 of the first main surface 3. Therefore, the gate pad electrode 62 is formed in a region that does not overlap the trench gate structure 21 and the field trench structure 31 in a plan view. The gate pad electrode 62 is formed in a quadrilateral shape in a plan view.

The gate finger electrode 63 is led out from the gate pad electrode 62 on the main surface insulating film 50 in a line shape to define the inner region of the first main surface 3 from a plurality of directions in a plan view. In this embodiment, the gate finger electrode 63 is formed in a C shape extending along the first side surface 5A, the third side surface 5C and the fourth side surface 5D so as to define the inner region of the first main surface 3 from three directions in a plan view. The gate finger electrode 63 opens the region on the side of the second side surface 5B.

The gate finger electrode 63 is electrically connected to the gate plug electrodes 56. The gate finger electrode 63 is electrically connected to the first electrodes 25 of the trench gate structures 21 and the third electrode 35 of the field trench structure 31 via the gate plug electrodes 56. The semiconductor device 1 includes a source main surface electrode 64 formed over the main surface insulating film 50 so as to be spaced apart from the gate main surface electrode 61. The source main surface electrode 64 is electrically connected to the second electrodes 26 (lead-out electrodes 26A) of the trench gate structures 21, the fourth electrodes 36 (lead-out electrodes 36C) of the field trench structures 31, the source region 41 and the contact region 43 via the source plug electrodes 57. In FIGS. 1, 2, 3 and 7, the connection portions of the source main surface electrode 64 to the second electrodes 26 and the fourth electrodes 36 are indicated by marks x.

Specifically, the source main surface electrode 64 includes a source pad electrode 65. The source pad electrode 65 is an external terminal portion that is externally connected to a conducting wire (e.g., a bonding wire) or the like. The source pad electrode 65 is formed over the portion of the main surface insulating film 50 that covers the active region 10. The source pad electrode 65 is formed in a polygonal shape in a region defined by an inner peripheral edge of the gate main surface electrode 61 in a plan view.

The source pad electrode 65 is electrically connected to the source plug electrodes 57. The source pad electrode 65 is electrically connected to the second electrodes 26 (lead-out electrodes 26A) of the trench gate structures 21 and the fourth electrodes 36 (lead-out electrodes 36C) of the field trench structures 31 via the source plug electrodes 57. Further, the source pad electrode 65 is electrically connected to the source region 41 and the contact region 43 via the source plug electrodes 57.

Each of the gate main surface electrode 61 and the source main surface electrode 64 includes a barrier electrode 68 and a main electrode 69 stacked in this order from the side of the main surface insulating film 50. The barrier electrode 68 is formed in a film shape on the main surface insulating film 50. The barrier electrode 68 includes at least one selected from the group of a Ti layer and a TiN layer. The main electrode 69 is formed in a film shape on the barrier electrode 68. The main electrode 69 includes at least one selected from the group of a pure Cu layer (Cu layer having a purity of 99% or more), a pure Al layer (Al layer having a purity of 99% or more), an AlSi alloy layer, an AlCu alloy layer and an AlSiCu alloy layer.

The semiconductor device 1 includes a drain electrode 70 formed over the second main surface 4. The drain electrode 70 covers the entire region of the second main surface 4. The drain electrode 70 forms ohmic contact with the second main surface 4 (drain region 6). The drain electrode 70 includes at least one selected from the group of a Ti layer, a Ni layer, a Pd layer, an Au layer and an Ag layer. The drain electrode 70 may have a stacked structure in which at least two of a Ti layer, a Ni layer, a Pd layer, an Au layer and an Ag layer are stacked in an arbitrary order. The drain electrode 70 may have a single-layer structure composed of a Ti layer, a Ni layer, a Pd layer, an Au layer or an Ag layer. The drain electrode 70 preferably includes a Ti layer as an ohmic electrode. In this embodiment, the drain electrode 70 has a stacked structure including a Ti layer, a Ni layer, a Pd layer, an Au layer and an Ag layer stacked in this order from the side of the second main surface 4.

Figure 8A:
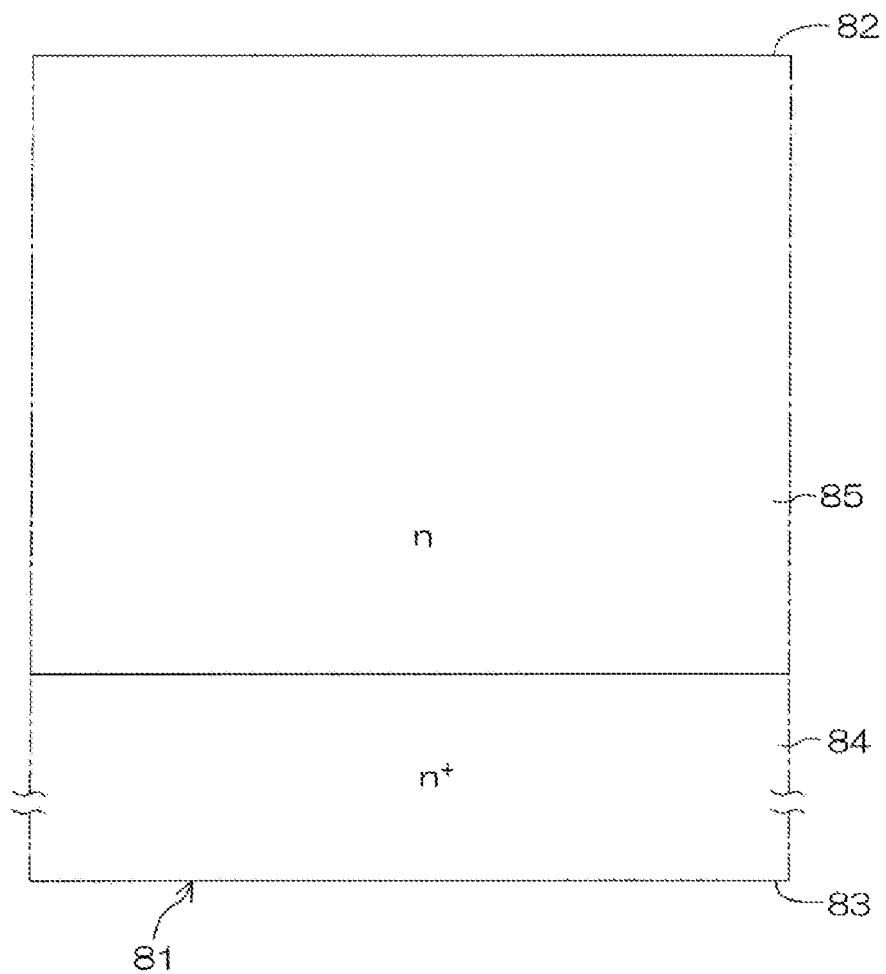
FIG. 8A is a cross-sectional view for explaining an example of a method of manufacturing the semiconductor device shown in FIG. 1.
Figure 8B:
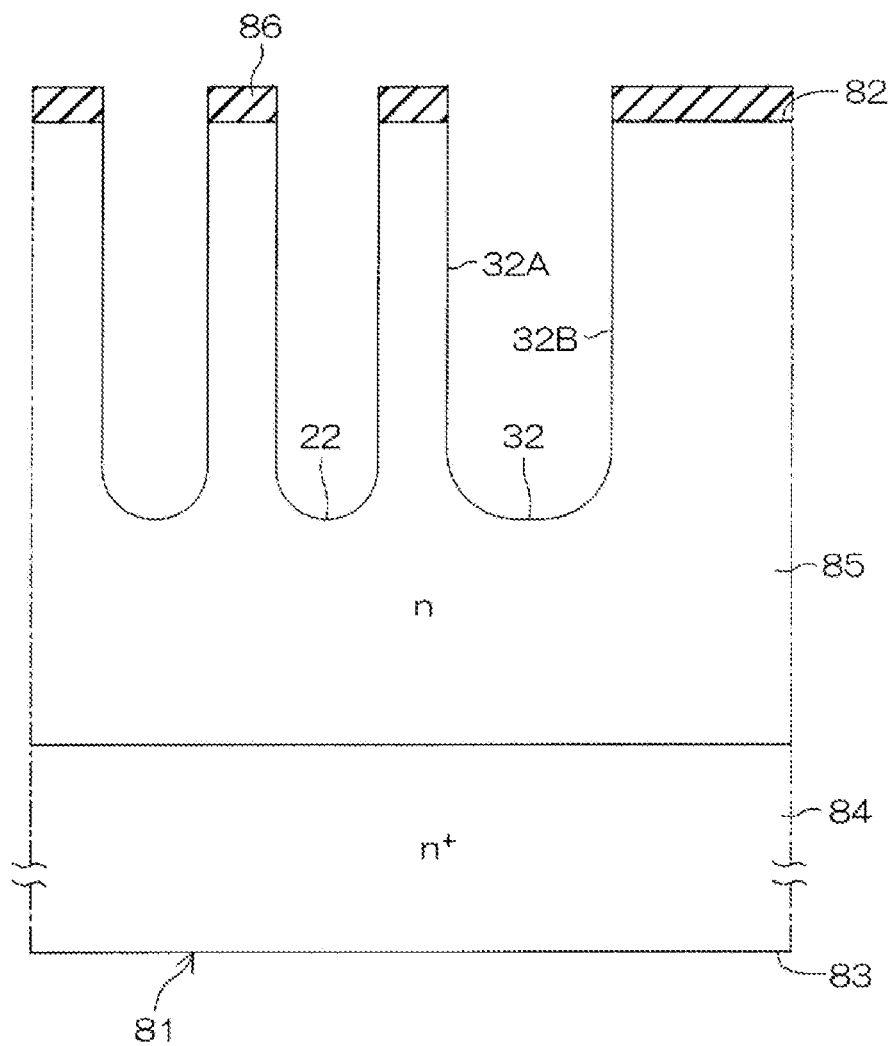
FIG. 8B is a cross-sectional view showing a process after FIG. 8A.
Figure 8C:
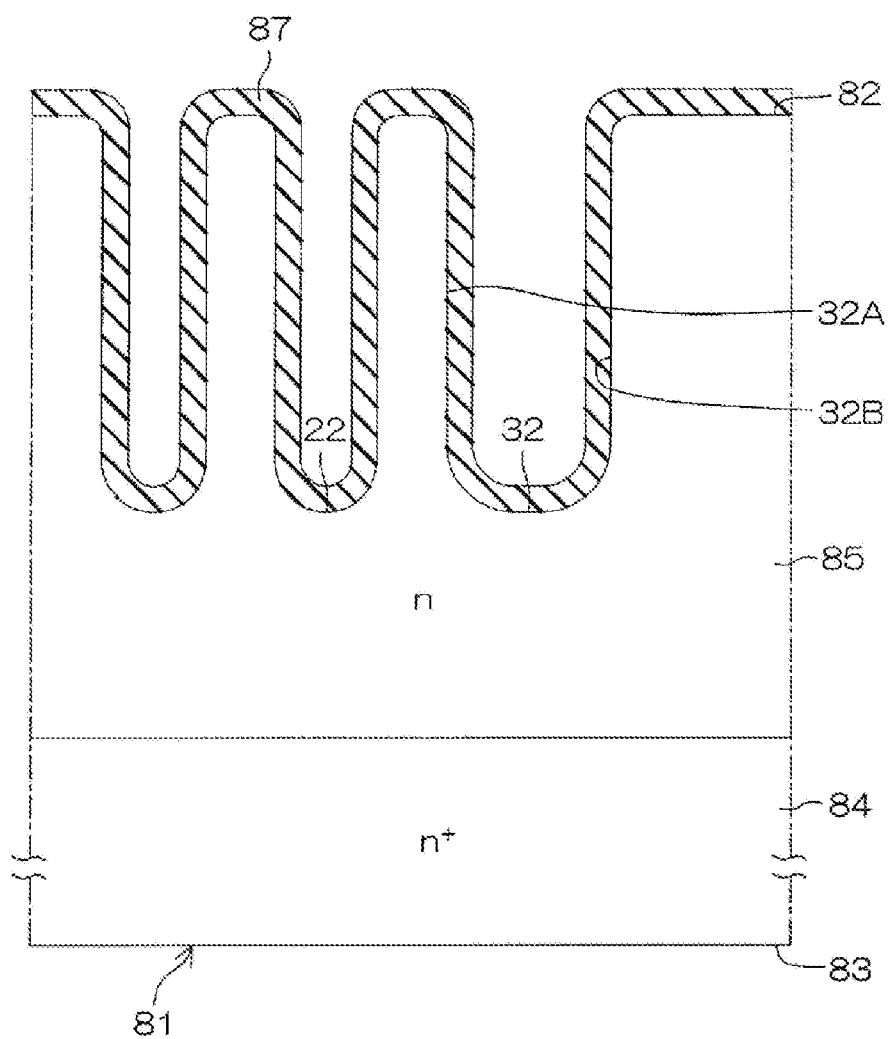
FIG. 8C is a cross-sectional view showing a process after FIG. 8B.
Figure 8E:
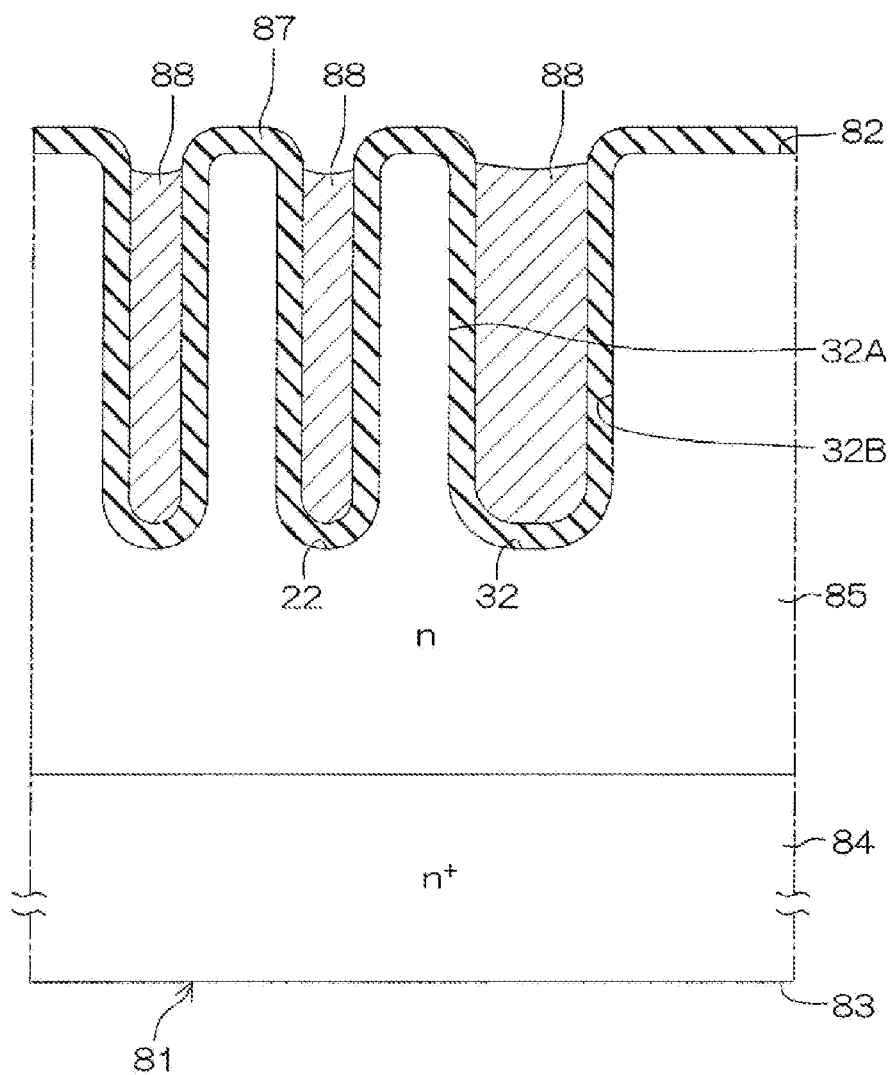
FIG. 8E is a cross-sectional view showing a process after FIG. 8D.
Figure 8F:
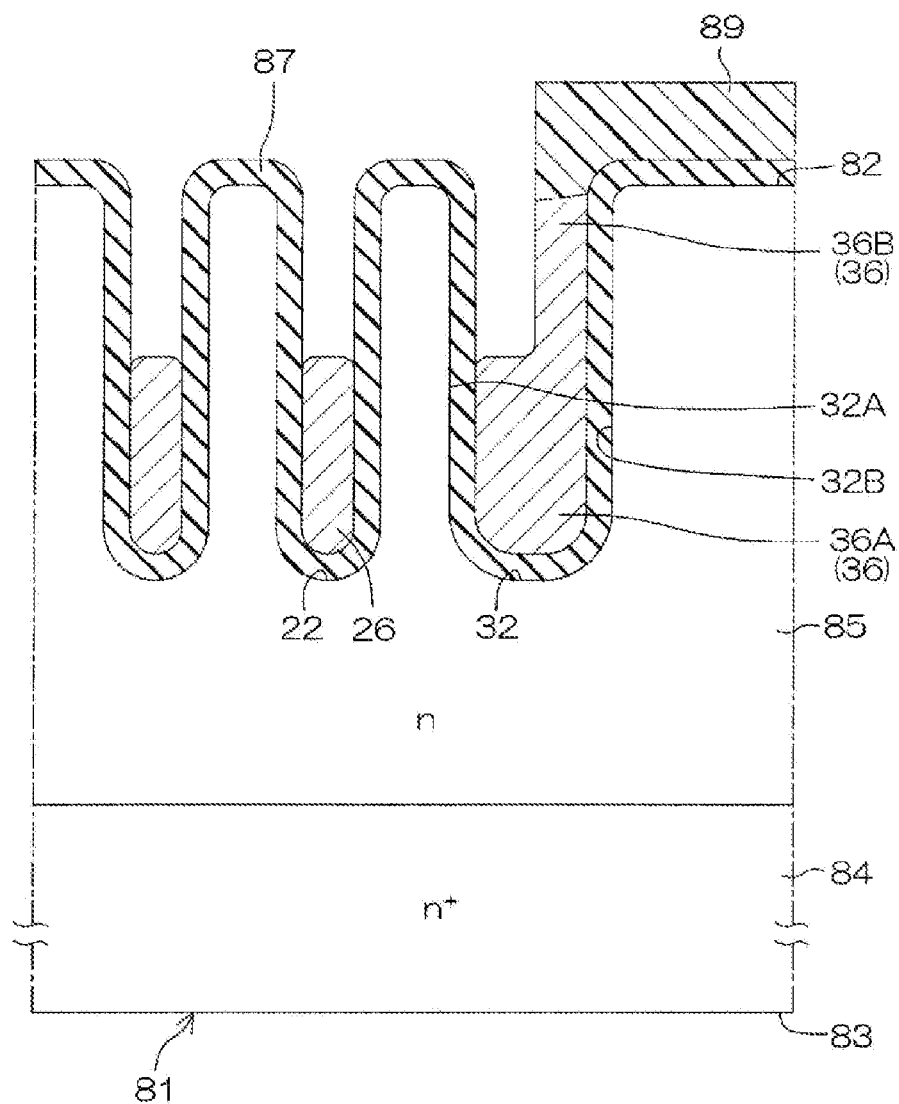
FIG. 8F is a cross-sectional view showing a process after FIG. 8E.
Figure 8H:
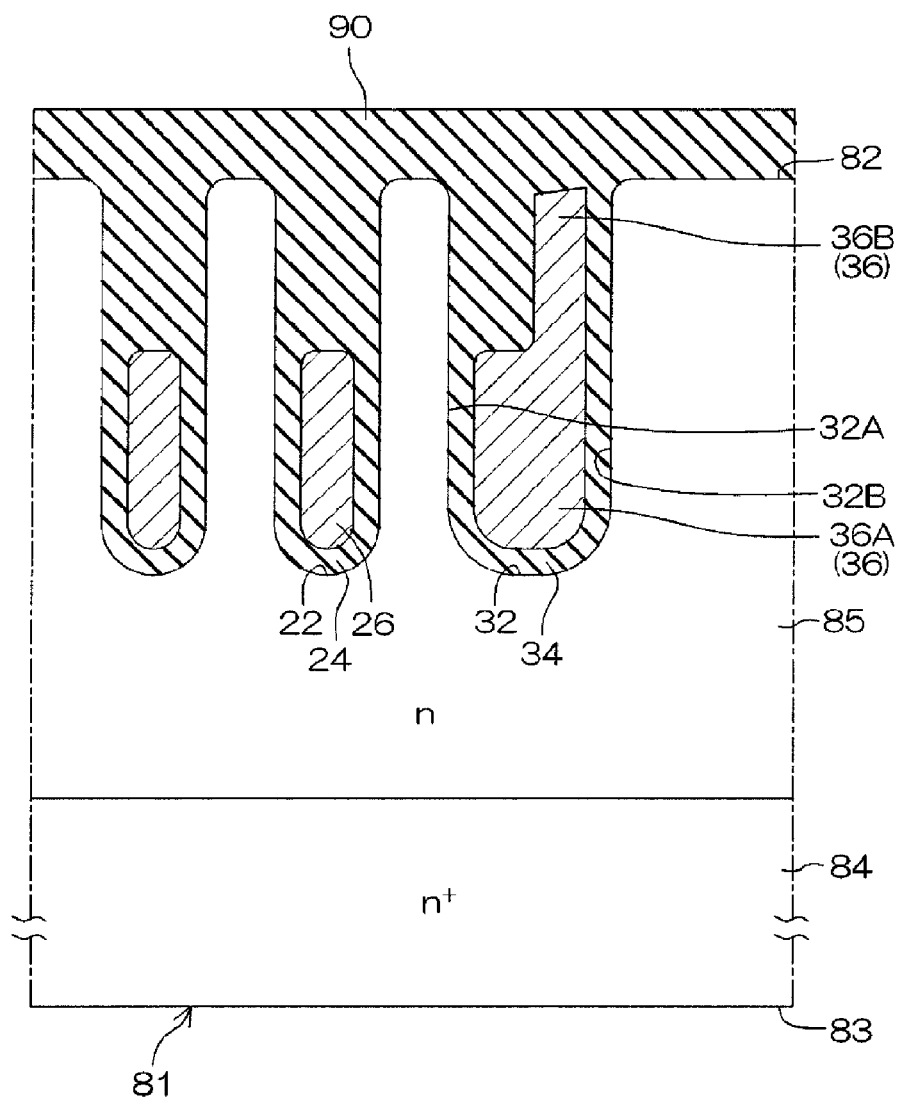
FIG. 8H is a cross-sectional view showing a process after FIG. 8G.
Figure 8I:
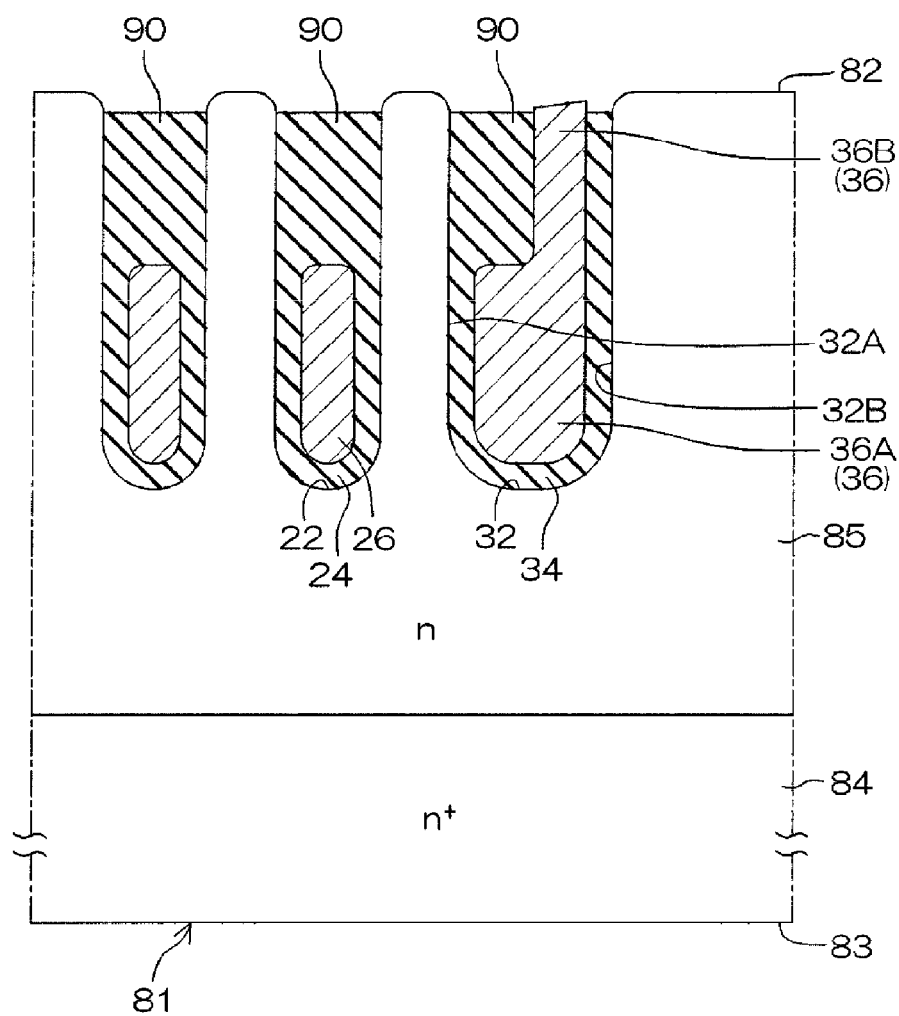
FIG. 8I is a cross-sectional view showing a process after FIG. 8H.
Figure 8K:
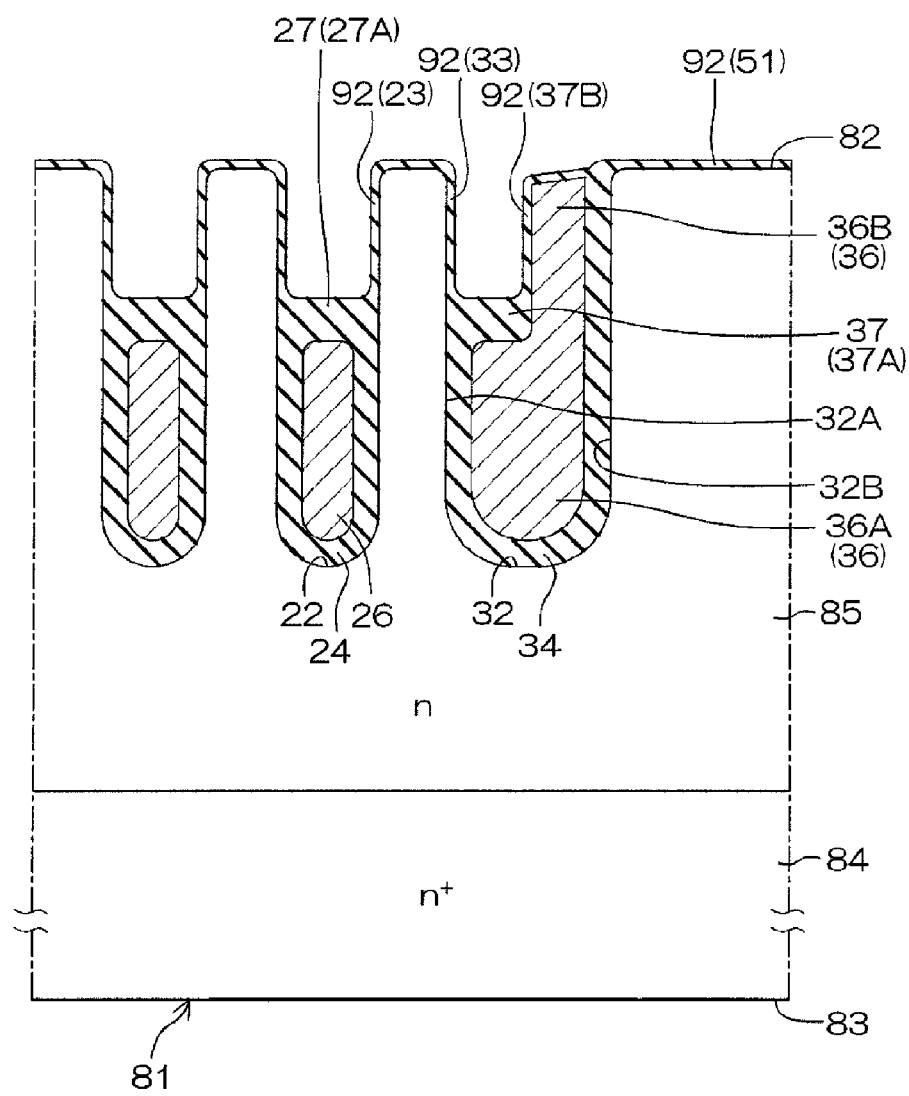
FIG. 8K is a cross-sectional view showing a process after FIG. 8J.
Figure 8L:
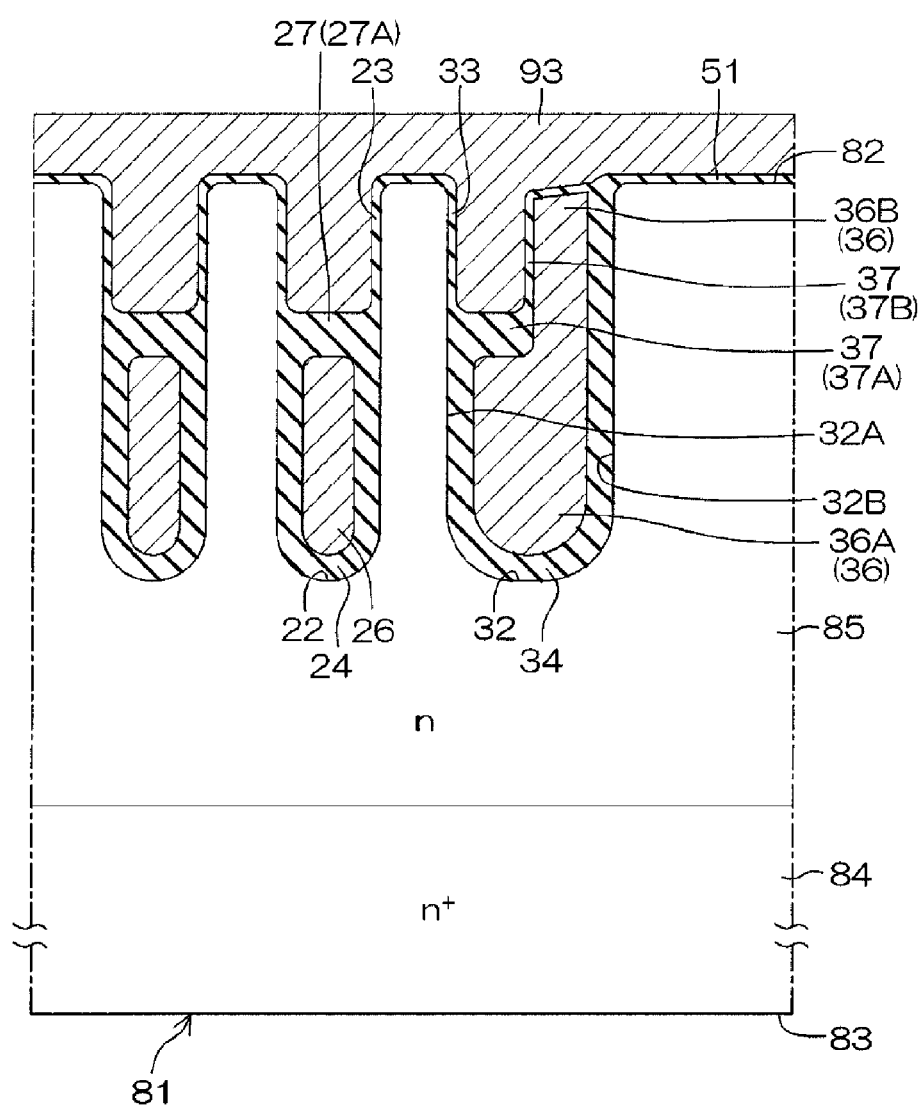
FIG. 8L is a cross-sectional view showing a process after FIG. 8K.
Figure 8M:
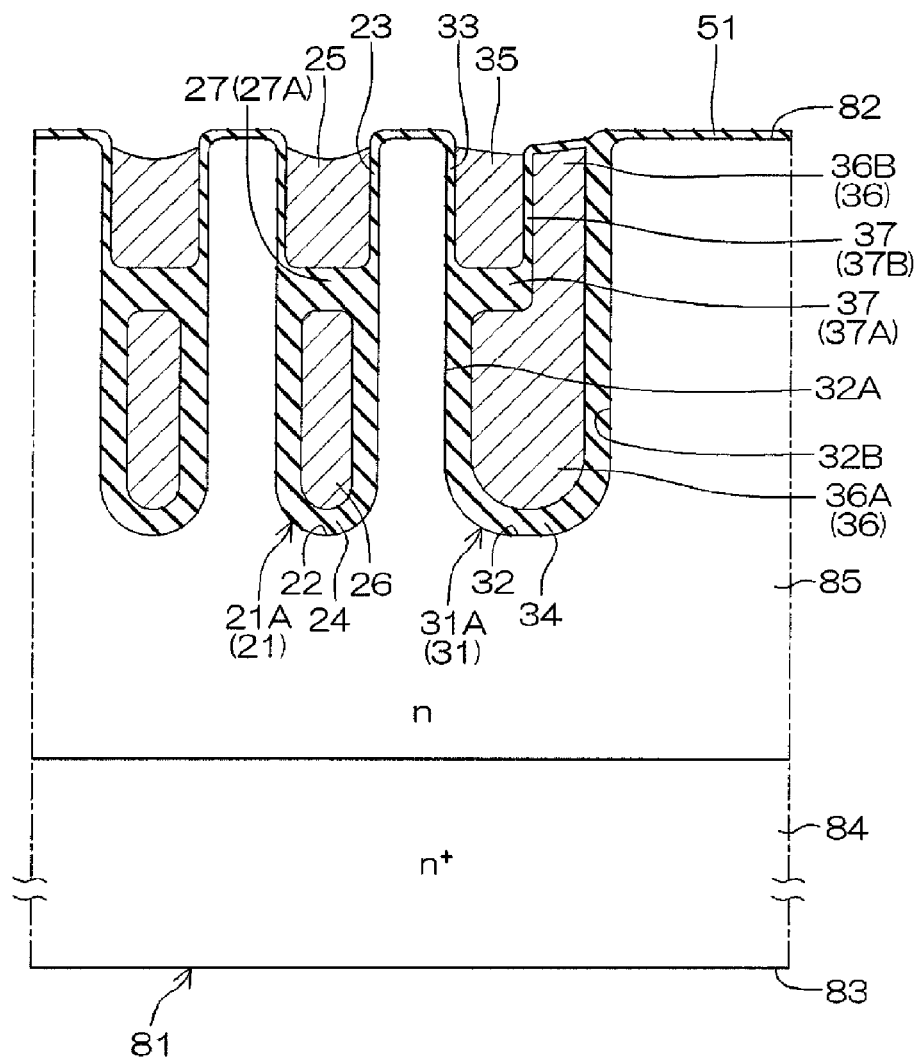
FIG. 8M is a cross-sectional view showing a process after FIG. 8L.
Figure 8N:
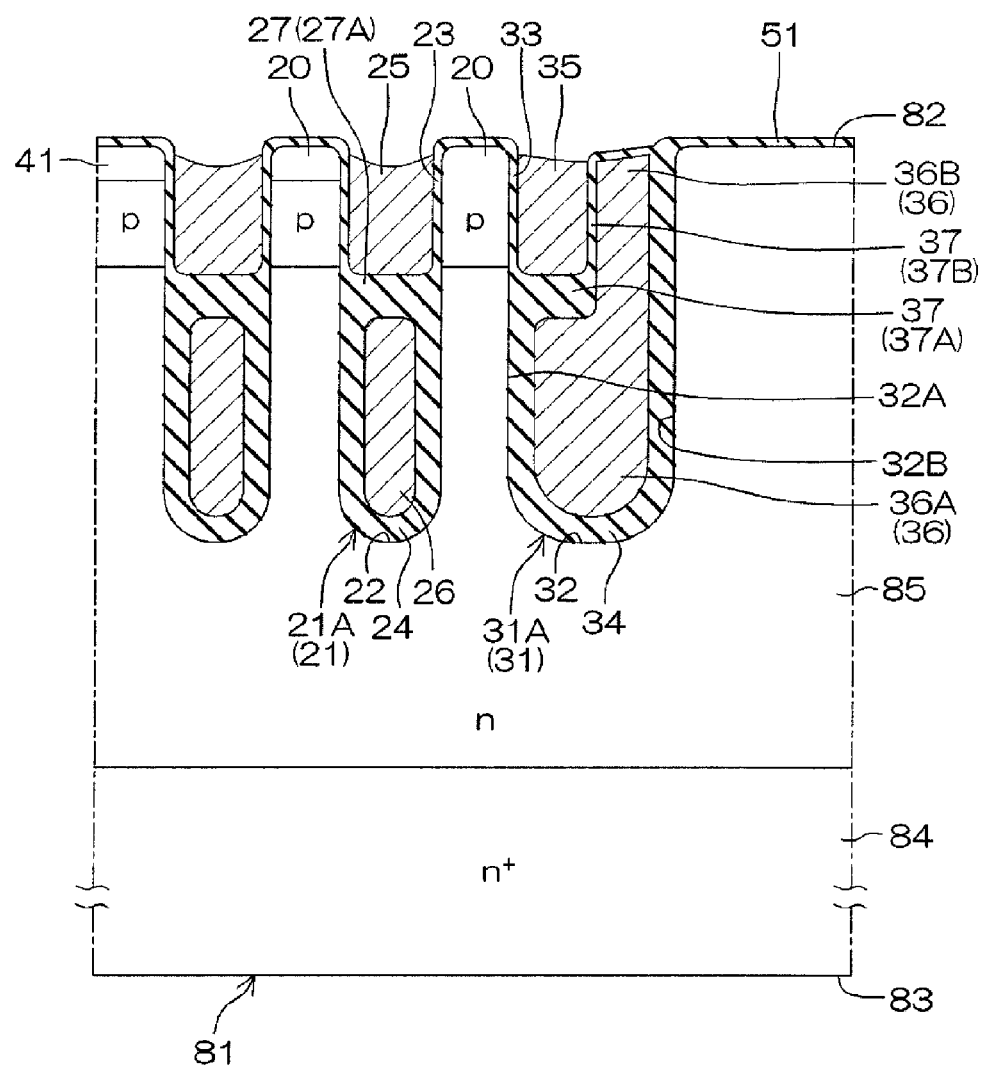
FIG. 8N is a cross-sectional view showing a process after FIG. 8M.
Figure 8O:
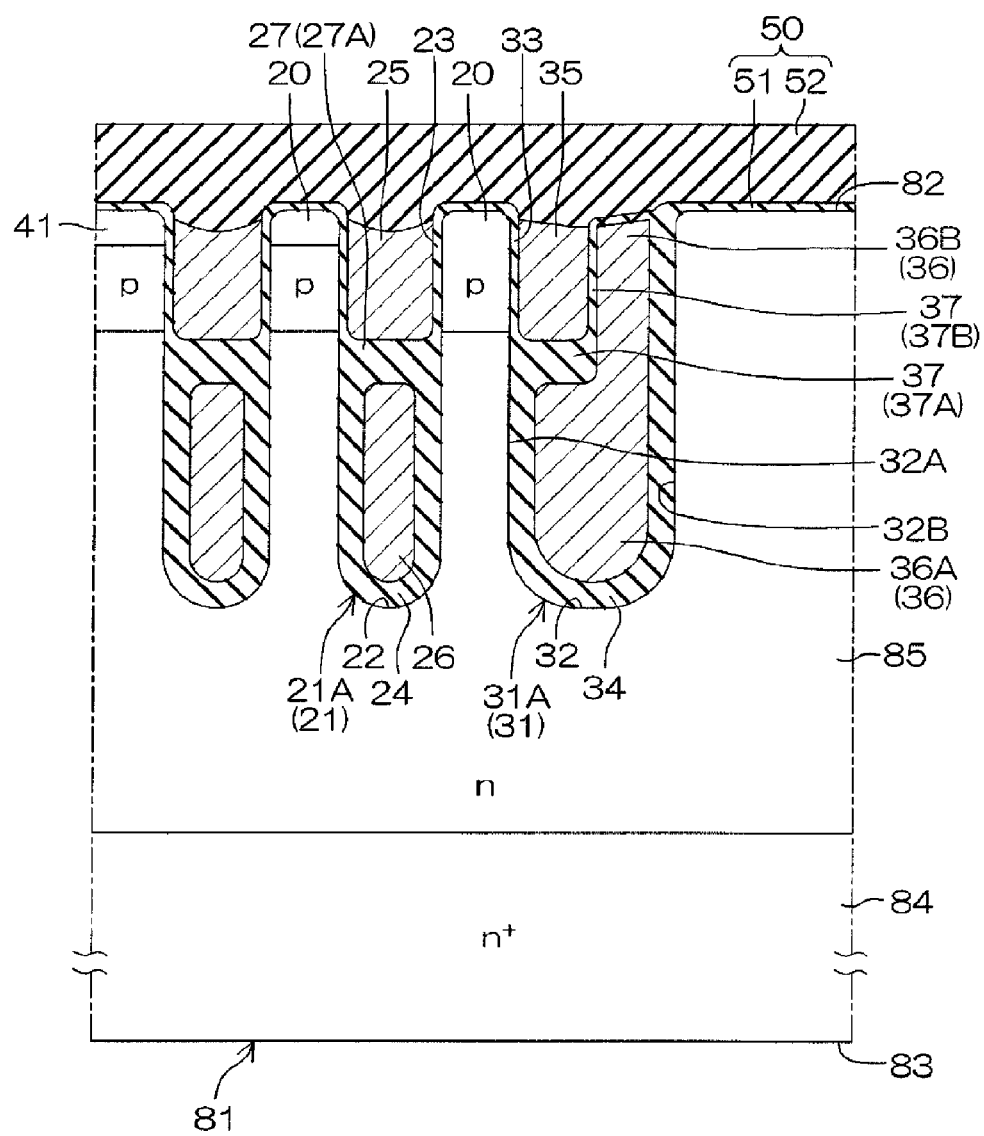
FIG. 8O is a cross-sectional view showing a process after FIG. 8N.
Figure 8P:
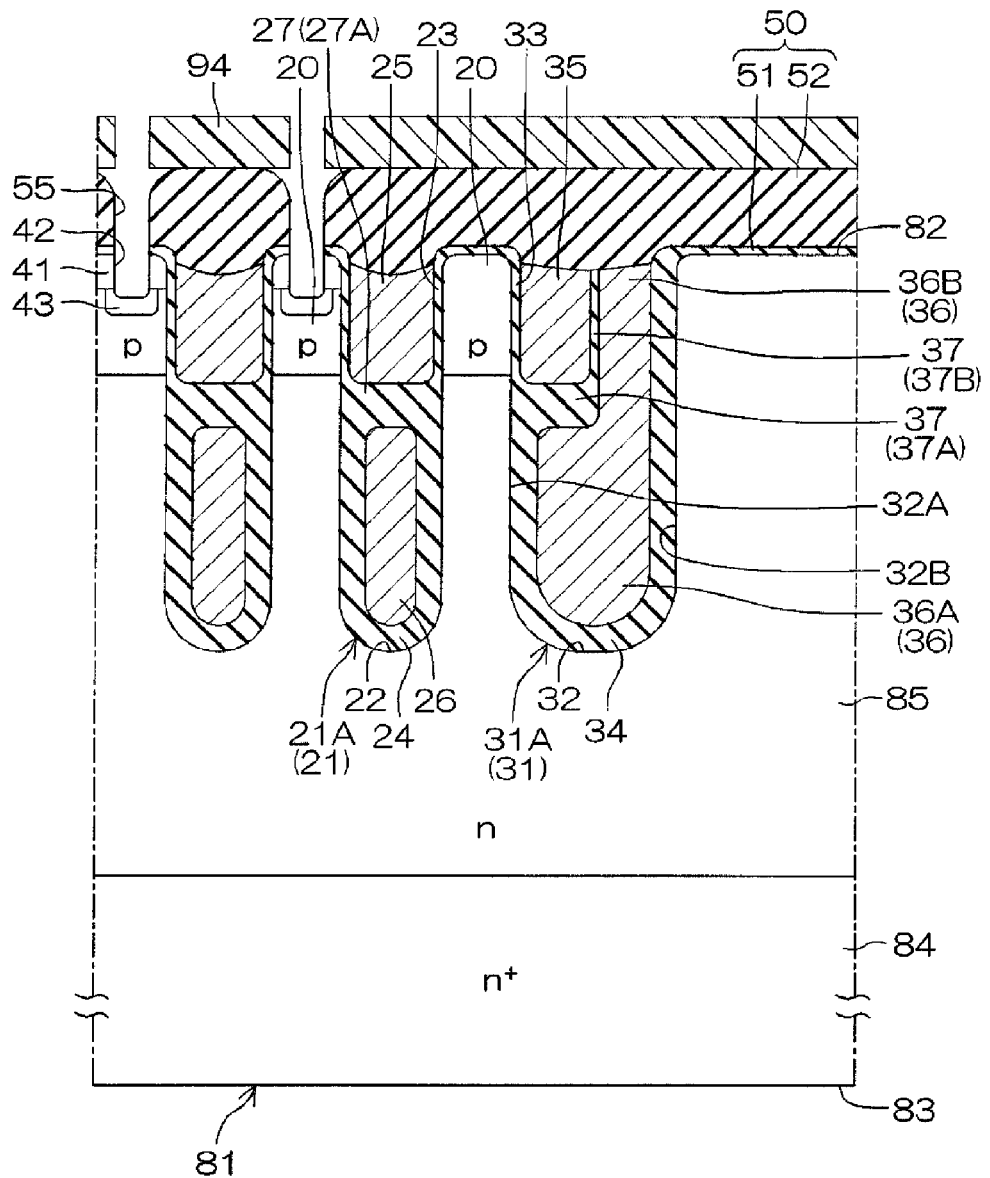
FIG. 8P is a cross-sectional view showing a process after FIG. 8O.
Figure 8Q:
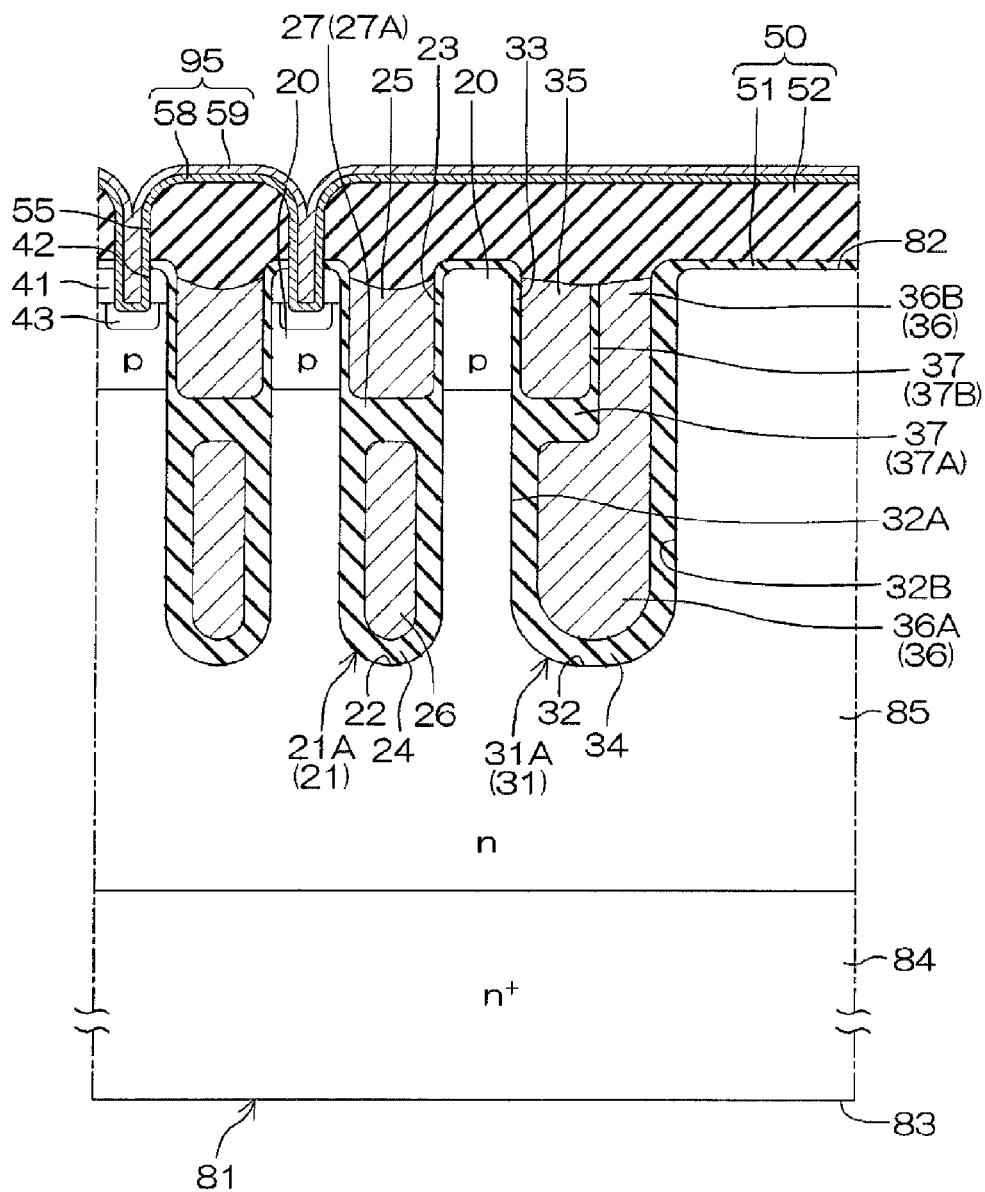
FIG. 8Q is a cross-sectional view showing a process after FIG. 8P.
Figure 8R:
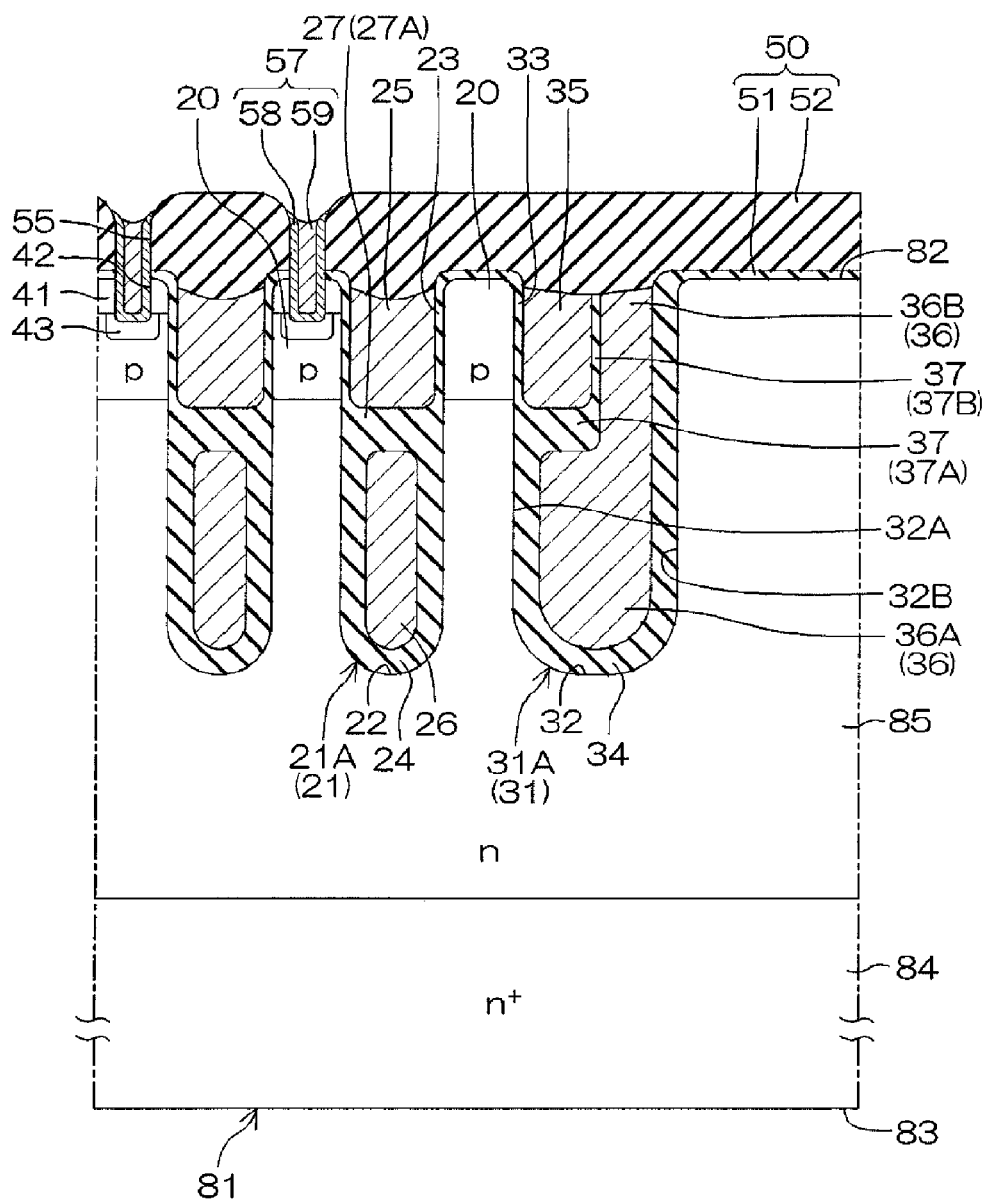
FIG. 8R is a cross-sectional view showing a process after FIG. 8Q.
Figure 8S:
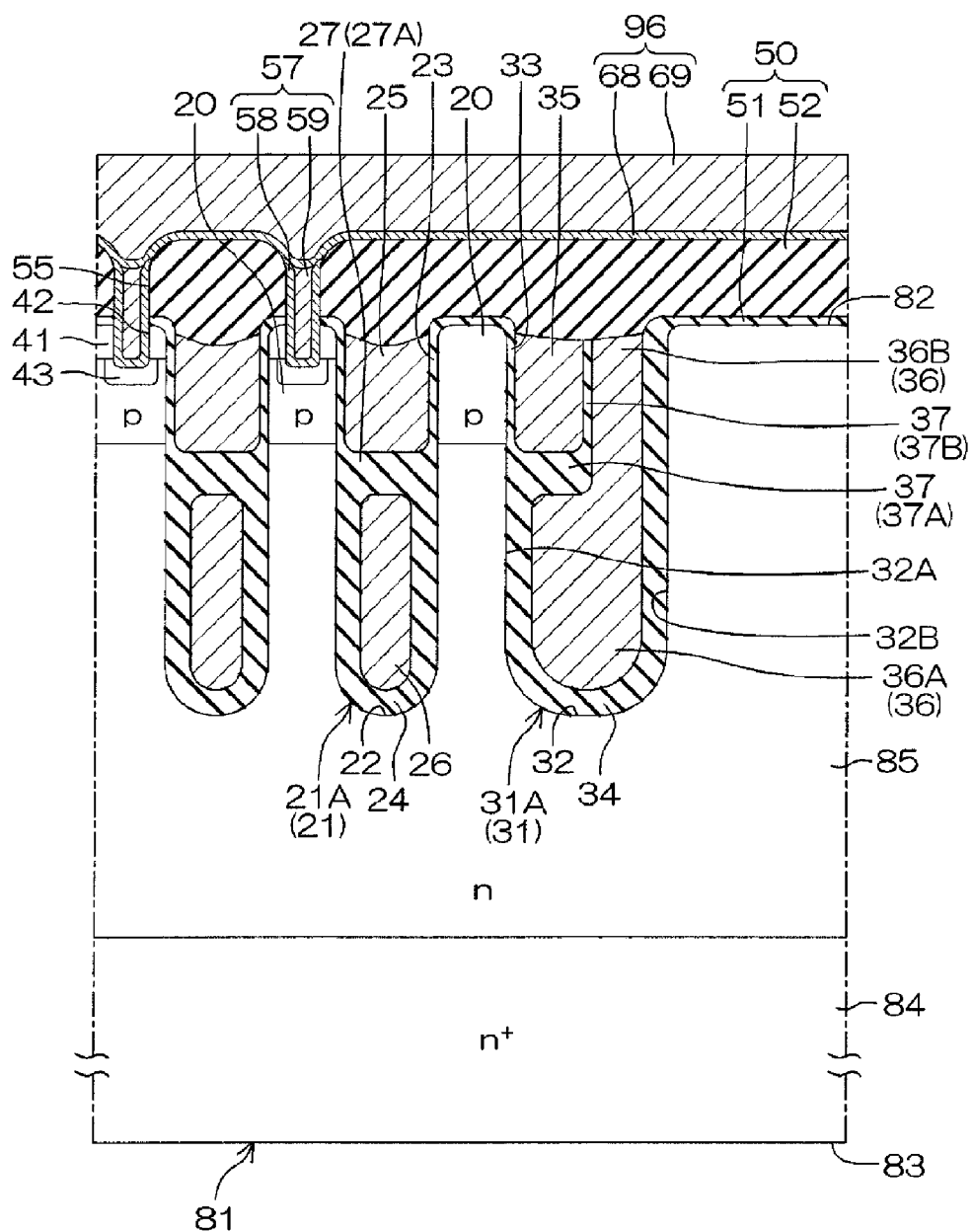
FIG. 8S is a cross-sectional view showing a process after FIG. 8R.
Figure 8T:
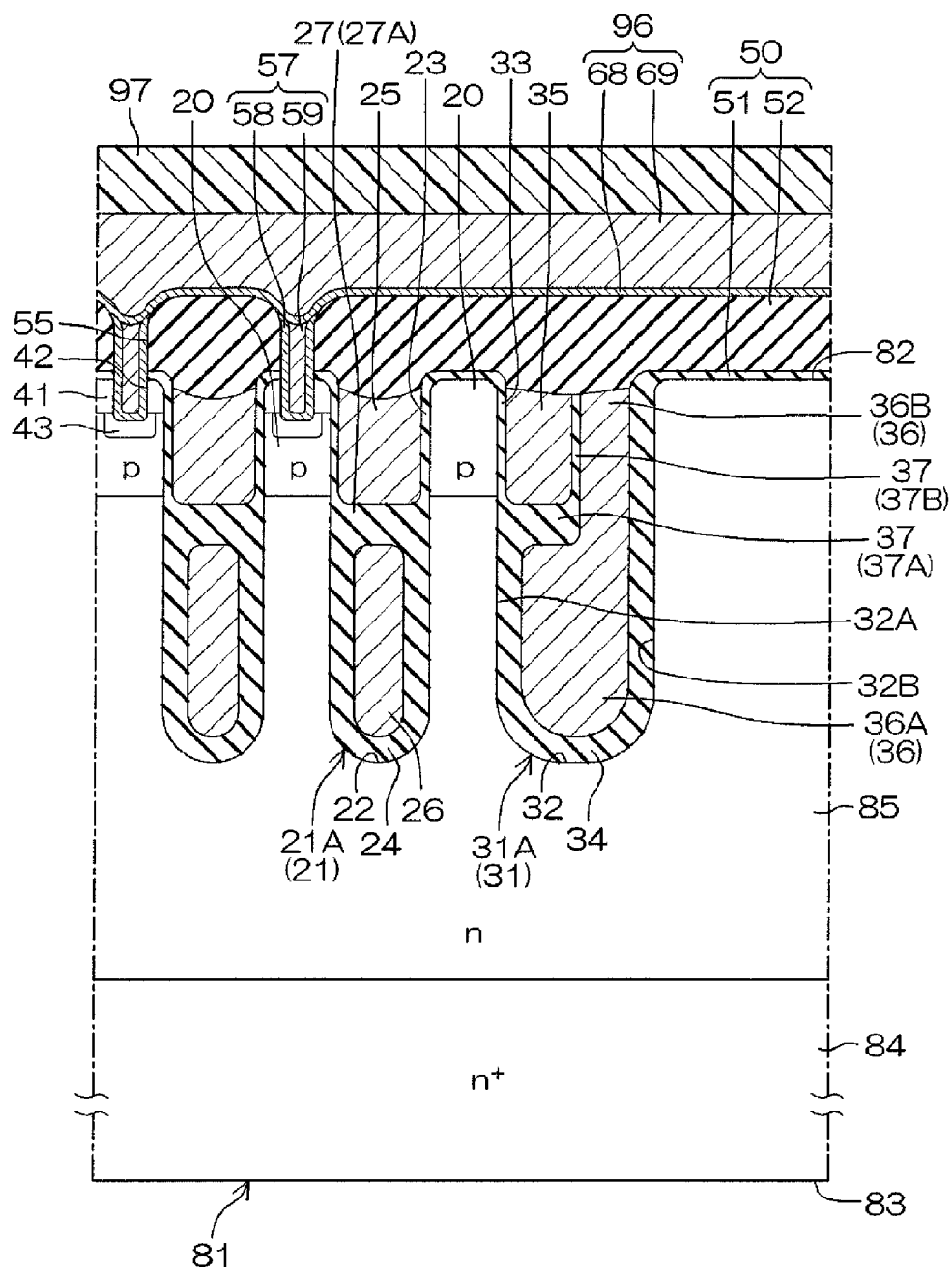
FIG. 8T is a cross-sectional view showing a process after FIG. 8S.
Figure 8U:
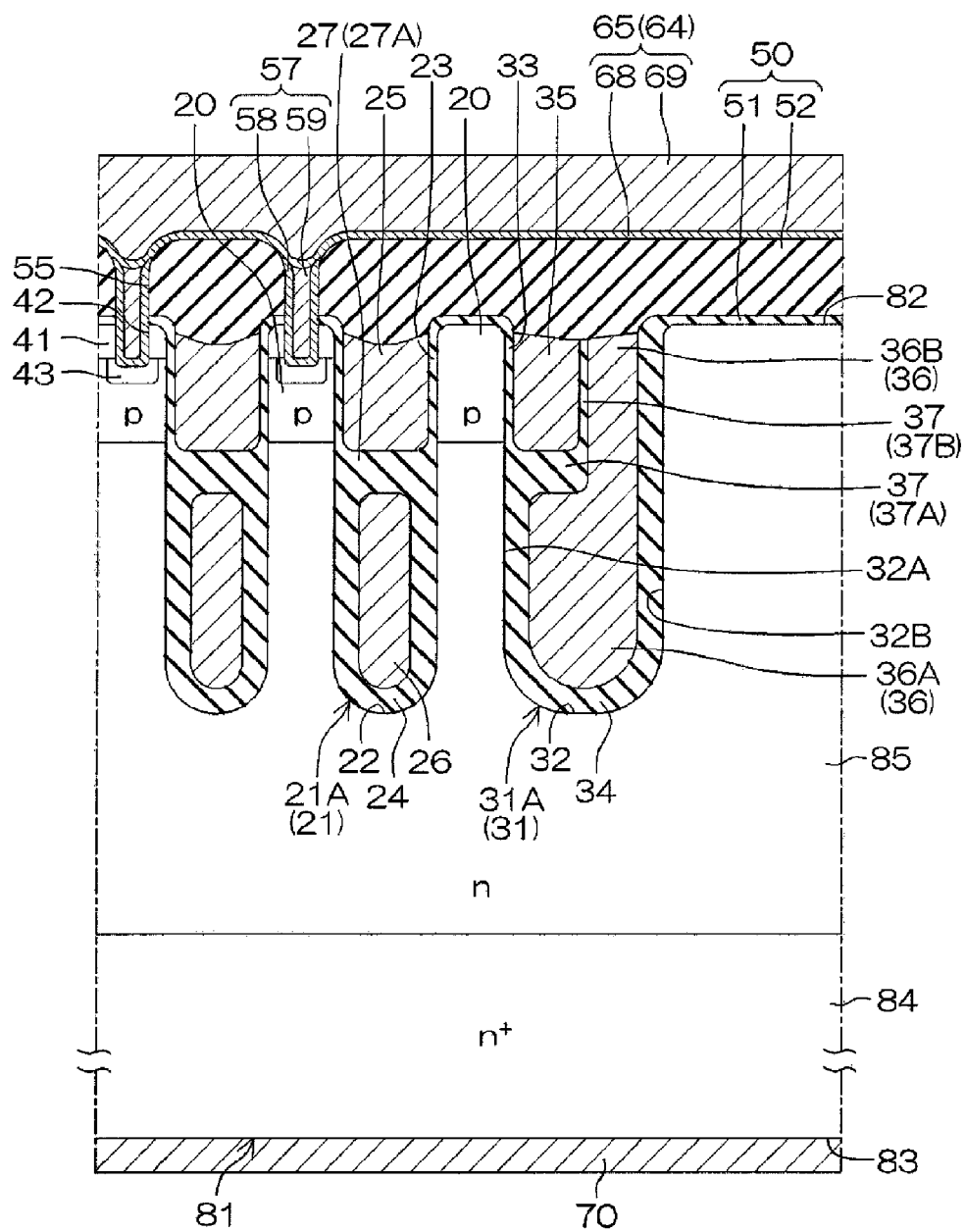
FIG. 8U is a cross-sectional view showing a process after FIG. 8T.

FIGS. 8A to 8U are cross-sectional views for explaining an example of a method of manufacturing the semiconductor device 1 shown in FIG. 1. FIGS. 8A to 8U are cross-sectional views of a portion corresponding to FIG. 4. Referring to FIG. 8A, an epitaxial wafer 81 as a base for the semiconductor chip 2 is prepared. The epitaxial wafer 81 includes a first wafer main surface 82 on one side and a second wafer main surface 83 on the other side. The first wafer main surface 82 and the second wafer main surface 83 correspond to the first main surface 3 and the second main surface 4 of the semiconductor chip 2, respectively.

The epitaxial wafer 81 has a stacked structure including an $n^+$-type semiconductor wafer 84 and an n-type epitaxial layer 85. The epitaxial layer 85 is formed by epitaxially growing silicon from the main surface of the semiconductor wafer 84. The semiconductor wafer 84 serves as a base for the drain region 6, and the epitaxial layer 85 serves as a base for the drift region 7.

Referring next to FIG. 8B, a hard mask 86 having a predetermined pattern is formed over the first wafer main surface 82. The hard mask 86 exposes a region of the first wafer main surface 82 in which the gate trenches 22 and the field trenches 32 should be formed, and covers the remaining regions of the first wafer main surface 82. The hard mask 86 may be formed by a CVD (Chemical Vapor Deposition) method or an oxidation treatment method (e.g., a thermal oxidation treatment method). The hard mask 86 may be patterned via a resist mask (not shown) by an etching method.

Next, an unnecessary portion of the first wafer main surface 82 is removed via the hard mask 86 by an etching method. The etching method may be a wet etching method and/or a dry etching method. As a result, the gate trenches 22 and the field trenches 32 are formed over the first wafer main surface 82. The hard mask 86 is then removed.

Referring next to FIG. 8C, a first base insulating film 87 is formed over the first wafer main surface 82. The first base insulating film 87 serves as a base for the second insulating film 24 and the fourth insulating film 34. The first base insulating film 87 is formed in a film shape along the first wafer main surface 82, the wall surfaces of the gate trenches 22, and the wall surfaces of the field trenches 32. The first base insulating film 87 may be formed by a CVD method and/or an oxidation treatment method (e.g., a thermal oxidation treatment method).

Referring next to FIG. 8D, a first base electrode layer 88 is formed over the first base insulating film 87. The first base electrode layer 88 includes conductive polysilicon and serves as a base for the second electrode 26 and the fourth electrode 36. The first base electrode layer 88 fills the gate trenches 22 and the field trenches 32 with the first base insulating film 87 interposed therebetween, and covers the first wafer main surface 82. The first base electrode layer 88 may be formed by a CVD method.

Referring next to FIG. 8E, an unnecessary portion of the first base electrode layer 88 is removed by an etching method until the first base insulating film 87 is exposed. The etching method may be a wet etching method and/or a dry etching method. Referring next to FIG. 8F, a resist mask 89 having a predetermined pattern is formed over the first wafer main surface 82. The resist mask 89 exposes the gate trenches 22 and partially exposes the field trenches 32. Next, an unnecessary portion of the first base electrode layer 88 is removed via the resist mask 89 by an etching method. The etching method may be a wet etching method and/or a dry etching method. As a result, the second electrode 26 and the fourth electrode 36 are formed.

Referring next to FIG. 8G, an unnecessary portion of the first base insulating film 87 is removed via the resist mask 89 by an etching method. The etching method may be a wet etching method and/or a dry etching method. As a result, the second insulating film 24 and the fourth insulating film 34 are formed. The resist mask 89 is then removed. Referring next to FIG. 8H, the second base insulating film 90 is formed over the first wafer main surface 82. The second base insulating film 90 includes silicon oxide and serves as a base for the first intermediate portion 27A of the first intermediate insulating film 27 and the third intermediate portion 37A of the second intermediate insulating film 37. The second base insulating film 90 fills the gate trenches 22 and the field trenches 32, and covers the first wafer main surface 82. The second base insulating film 90 may be formed by a CVD method.

Referring next to FIG. 8I, an unnecessary portion of the second base insulating film 90 is removed by an etching method until the first wafer main surface 82 is exposed. The etching method may be a wet etching method and/or a dry etching method. Referring next to FIG. 8J, a resist mask 91 having a predetermined pattern is formed over the first wafer main surface 82. The resist mask 91 exposes the gate trenches 22 and partially exposes the field trenches 32. Next, an unnecessary portion of the second base insulating film 90 is removed via the resist mask 91 by an etching method. The etching method may be a wet etching method and/or a dry etching method.

As a result, the first intermediate insulating film 27 (first intermediate portion 27A and second intermediate portion 27B) and the second intermediate insulating film 37 (third intermediate portion 37A and fourth intermediate portion 37B) are formed. The resist mask 91 is then removed. The second intermediate thickness TM2 of the second intermediate portion 27B and the fourth intermediate thickness TM4 of the fourth intermediate portion 37B are adjusted to arbitrary values depending on the layout of the resist mask 91.

Referring next to FIG. 8K, a third base insulating film 92 is formed in a film shape along the first wafer main surface 82, the wall surfaces of the gate trenches 22 and the wall surfaces of field trenches 32. The third base insulating film 92 becomes the first insulating film 23, the third insulating film 33, the second intermediate portion 27B of the first intermediate insulating film 27, the fourth intermediate portion 37B of the second intermediate insulating film 37, and the first main surface insulating film 51. The third base insulating film 92 may be formed by a CVD method and/or an oxidation treatment method (e.g., a thermal oxidation treatment method).

Referring next to FIG. 8L, a second base electrode layer 93 is formed over the third base insulating film 92. The second base electrode layer 93 includes conductive polysilicon and serves as a base for the first electrode 25 and the third electrode 35. The second base electrode layer 93 fills the gate trenches 22 and the field trenches 32 with the third base insulating film 92 interposed therebetween, and covers the first wafer main surface 82. The second base electrode layer 93 may be formed by a CVD method.

Referring next to FIG. 8M, an unnecessary portion of the second base electrode layer 93 is removed by an etching method until the first main surface insulating film 51 is exposed. The etching method may be a wet etching method and/or a dry etching method. As a result, the first electrode 25 and the third electrode 35 are formed. Further, the trench gate structures 21 and the field trench structures 31 are formed.

Referring next to FIG. 8N, a body region 20 is formed at the surface layer portion of the first wafer main surface 82. The body region 20 is formed by introducing p-type impurities into the surface layer portion of the first wafer main surface 82 via an ion implantation mask (not shown) by an ion implantation method. Specifically, the p-type impurities in the body region 20 are introduced from the first wafer main surface 82 and the side walls of the gate trenches 22 into the surface layer portion of the first wafer main surface 82.

Furthermore, a source region 41 is formed at the surface layer portion of the first wafer main surface 82. The source region 41 is formed by introducing n-type impurities into the surface layer portion of the first wafer main surface 82 via an ion implantation mask (not shown) by an ion implantation method. Specifically, the n-type impurities in the source region 41 are introduced from the first wafer main surface 82 and the side walls of the gate trenches 22 into the surface layer portion of the first wafer main surface 82. The source region 41 may be formed after the step of forming the body region 20, or may be formed prior to the step of forming the body region 20.

Referring next to FIG. 8O, a second main surface insulating film 52 is formed over the first main surface insulating film 51. The second main surface insulating film 52 collectively covers the trench gate structures 21 and the field trench structures 31. The second main surface insulating film 52 includes silicon oxide. The second main surface insulating film 52 may be formed by a CVD method. As a result, the main surface insulating film 50 including the first main surface insulating film 51 and the second main surface insulating film 52 is formed.

Referring next to FIG. 8P, a resist mask 94 having a predetermined pattern is formed over the main surface insulating film 50. The resist mask 94 exposes a region of the main surface insulating film 50 in which the gate openings 53, the source openings 54 and the source contact openings 55 are to be formed, and covers the remaining regions. Next, an unnecessary portion of the main surface insulating film 50 is removed via the resist mask 94 by an etching method. The etching method may be a wet etching method and/or a dry etching method. As a result, the gate openings 53, the source openings 54 and the source contact openings 55 are formed in the main surface insulating film 50.

Next, the portions of the first wafer main surface 82 exposed from the source contact openings 55 are removed via the source contact openings 55 by an etching method. The etching method may be a wet etching method and/or a dry etching method. As a result, a plurality of source contact holes 42 communicating with the source contact openings 55 are formed at the first wafer main surface 82. The resist mask 94 may be removed after the formation of the source contact holes 42, or may be removed after the formation of the source contact openings 55.

Next, a contact region 43 is formed in a region of the surface layer portion of the body region 20 extending along the bottom walls of the source contact holes 42. The contact region 43 is formed by introducing p-type impurities into the bottom walls of the source contact holes 42 via an ion implantation mask (not shown) by an ion implantation method. Referring next to FIG. 8Q, a third base electrode layer 95 is formed over the main surface insulating film 50. The third base electrode layer 95 serves as a base for the gate plug electrodes 56 and the source plug electrodes 57. The third base electrode layer 95 includes a barrier electrode 58 and a main electrode 59 stacked in this order from the side of the main surface insulating film 50. The barrier electrode 58 includes at least one selected from the group of a Ti layer and a TiN layer. The main electrode 59 contains tungsten. The barrier electrode 58 and the main electrode 59 may be formed by a sputtering method and/or a vapor deposition method, respectively.

Referring next to FIG. 8R, an unnecessary portion of the third base electrode layer 95 is removed by an etching method until the main surface insulating film 50 is exposed. The etching method may be a wet etching method and/or a dry etching method. As a result, a plurality of gate plug electrodes 56 and a plurality of source plug electrodes 57 are formed. Referring next to FIG. 8S, a fourth base electrode layer 96 is formed over the main surface insulating film 50. The fourth base electrode layer 96 serves as a base for the gate main surface electrode 61 and the source main surface electrode 64. The fourth base electrode layer 96 includes a barrier electrode 68 and a main electrode 69 stacked in this order from the side of the main surface insulating film 50. The barrier electrode 68 includes at least one selected from the group of a Ti layer and a TiN layer. The main electrode 69 includes at least one selected from the group of a pure Cu layer, a pure Al layer, an AlSi alloy layer, an AlCu alloy layer and an AlSiCu alloy layer. The barrier electrode 68 and the main electrode 69 may be formed by a sputtering method and/or a vapor deposition method, respectively.

Referring next to FIG. 8T, a resist mask 97 having a predetermined pattern is formed over the fourth base electrode layer 96. The resist mask 97 covers a region of the fourth base electrode layer 96 in which the gate main surface electrode 61 and the source main surface electrode 64 are to be formed, and exposes the remaining regions. Next, an unnecessary portion of the fourth base electrode layer 96 is removed via the resist mask 97 by an etching method. The etching method may be a wet etching method and/or a dry etching method. As a result, the gate main surface electrode 61 and the source main surface electrode 64 are formed.

Referring next to FIG. 8U, a drain electrode 70 is formed over the second wafer main surface 83. The drain electrode 70 includes at least one selected from the group of a Ti layer, a Ni layer, a Pd layer, an Au layer and an Ag layer. The drain electrode 70 may be formed by a sputtering method and/or a vapor deposition method. Thereafter, the epitaxial wafer 81 is selectively cut to obtain a plurality of semiconductor devices 1. The semiconductor device 1 is manufactured via the steps including the above steps.

Figure 9:
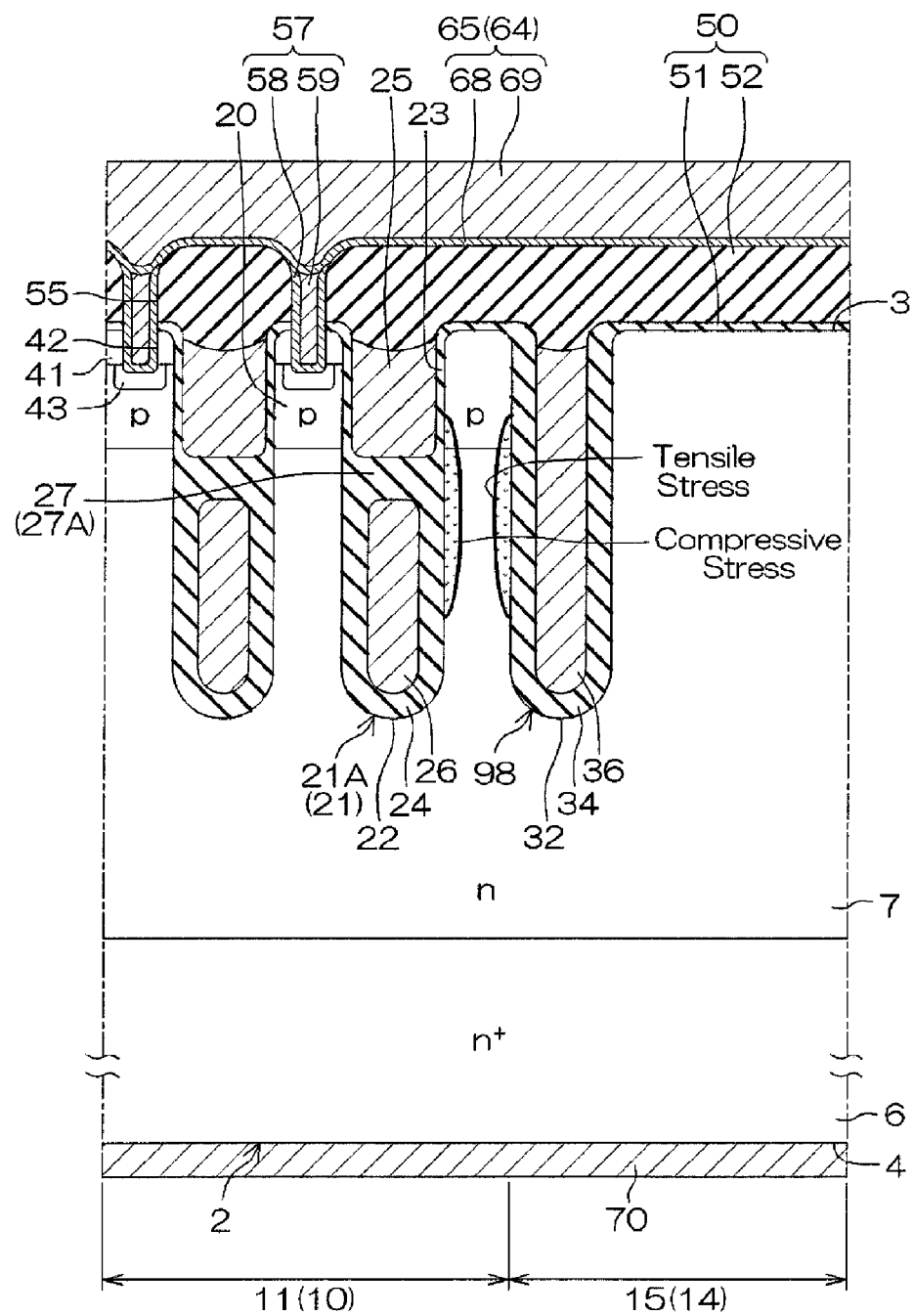
FIG. 9 is a cross-sectional view corresponding to FIG. 4 and explaining a field trench structure according to a comparative example.

FIG. 9 is a cross-sectional view corresponding to FIG. 4 and explaining a field trench structure 98 according to a comparative example. Referring to FIG. 9, the field trench structure 98 according to the comparative example has a single electrode structure unlike the field trench structure 31. Specifically, the field trench structure 98 does not include the third insulating film 33, but includes the field trench 32, the fourth insulating film 34 and the fourth electrode 36. The field trench 32 has the same width as the first width W1 of the gate trench 22 and the same depth as the first depth D1 of the gate trench 22. The fourth insulating film 34 is uniformly formed at the wall surface of the field trench 32. The fourth electrode 36 is embedded in the field trench 32 as an integral body with the fourth insulating film 34 interposed therebetween.

The field trench structure 98 is formed adjacent to the trench gate structures 21 having different internal structures. In this case, a stress is generated in the region between the trench gate structure 21 and the field trench structure 98 in the semiconductor chip 2. This stress is generated due to the difference between the thickness of the first insulating film 23 (second insulating film 24) in the gate trench 22 and the thickness of the fourth insulating film 34 in the field trench 32.

This stress is generated in the direction in which the field trench 32 is pulled toward the gate trench 22. That is, this stress includes a tensile stress on the side of the field trench 32 and a compressive stress on the side of the gate trench 22. This type of stress causes crystal defects in the region between the gate trench 22 and the field trench 32. Therefore, in the semiconductor device 1, in order to avoid the problem caused by the stress, a field trench structure 31 having a structure corresponding to the trench gate structure 21 is formed instead of the field trench structure 98 according to the comparative example (see also FIG. 4 and the like).

The trench gate structure 21 includes a gate trench 22, a first insulating film 23 and a second insulating film 24. The first insulating film 23 has a first thickness T1 and is formed at the upper wall surface of the gate trench 22. The second insulating film 24 has a second thickness T2 larger than the first thickness T1 and is formed at the lower wall surface of the gate trench 22. The trench gate structure 21 further has a vertical split electrode structure including a first electrode 25, a second electrode 26 and a first intermediate insulating film 27. The first electrode 25 is embedded on the upper side in the gate trench 22 with the first insulating film 23 interposed therebetween. The second electrode 26 is embedded on the lower side in the gate trench 22 with the second insulating film 24 interposed therebetween. The first intermediate insulating film 27 is interposed between the first electrode 25 and the second electrode 26 to insulate the first electrode 25 and the second electrode 26.

On the other hand, the field trench structure 31 includes a field trench 32, a third insulating film 33 and a fourth insulating film 34. The third insulating film 33 has a third thickness T3 smaller than the second thickness T2 of the second insulating film 24, and covers the upper wall surface of the field trench 32 on the side of the facing wall 32A. The fourth insulating film 34 has a fourth thickness T4 larger than the third thickness T3 of the third insulating film 33, and covers the lower wall surface of the field trench 32 on the side of the facing wall 32A and the non-facing wall 32B of the field trench 32.

The field trench structure 31 further has a horizontal split electrode structure including a third electrode 35, a fourth electrode 36 and a second intermediate insulating film 37. The third electrode 35 is embedded on the upper side in the field trench 32 with the third insulating film 33 interposed therebetween on the side of the facing wall 32A of the field trench 32. The third electrode 35 faces the first electrode 25 with a portion of the semiconductor chip 2 interposed therebetween.

The fourth electrode 36 is embedded on the lower side and the upper side in the field trench 32 with the fourth insulating film 34 interposed therebetween on the side of the non-facing wall 32B of the field trench 32. The fourth electrode 36 faces the second electrode 26 with a portion of the semiconductor chip 2 interposed therebetween. The second intermediate insulating film 37 is interposed between the third electrode 35 and the fourth electrode 36 to insulate the third electrode 35 and the fourth electrode 36.

As described above, the field trench structure 31 includes a third insulating film 33 and a fourth insulating film 34 corresponding to the first insulating film 23 and the second insulating film 24 of the trench gate structure 21 in the region on the side of the facing wall 32A. Thus, it is possible to suppress the stress caused due to the thickness of the insulating film from being generated in the region between the gate trench 22 and the field trench 32. As a result, it is possible to relieve the stress between the gate trench 22 and the field trench 32, whereby crystal defects caused by the stress can be suppressed.

Figure 10:
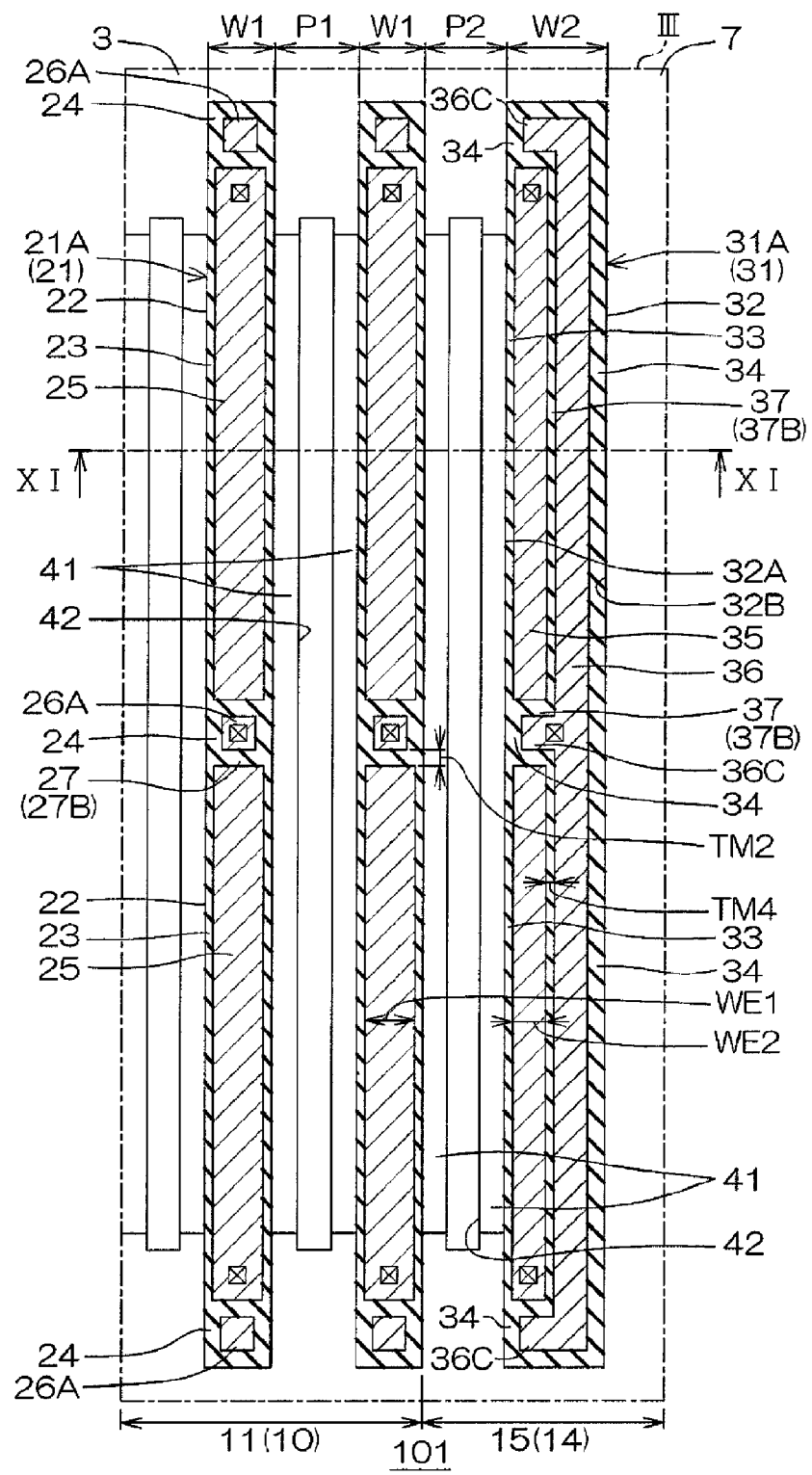
FIG. 10 is a plan view corresponding to FIG. 3 and showing a structure of a first main surface of a semiconductor chip of a semiconductor device according to a second embodiment of the present disclosure.
Figure 11:
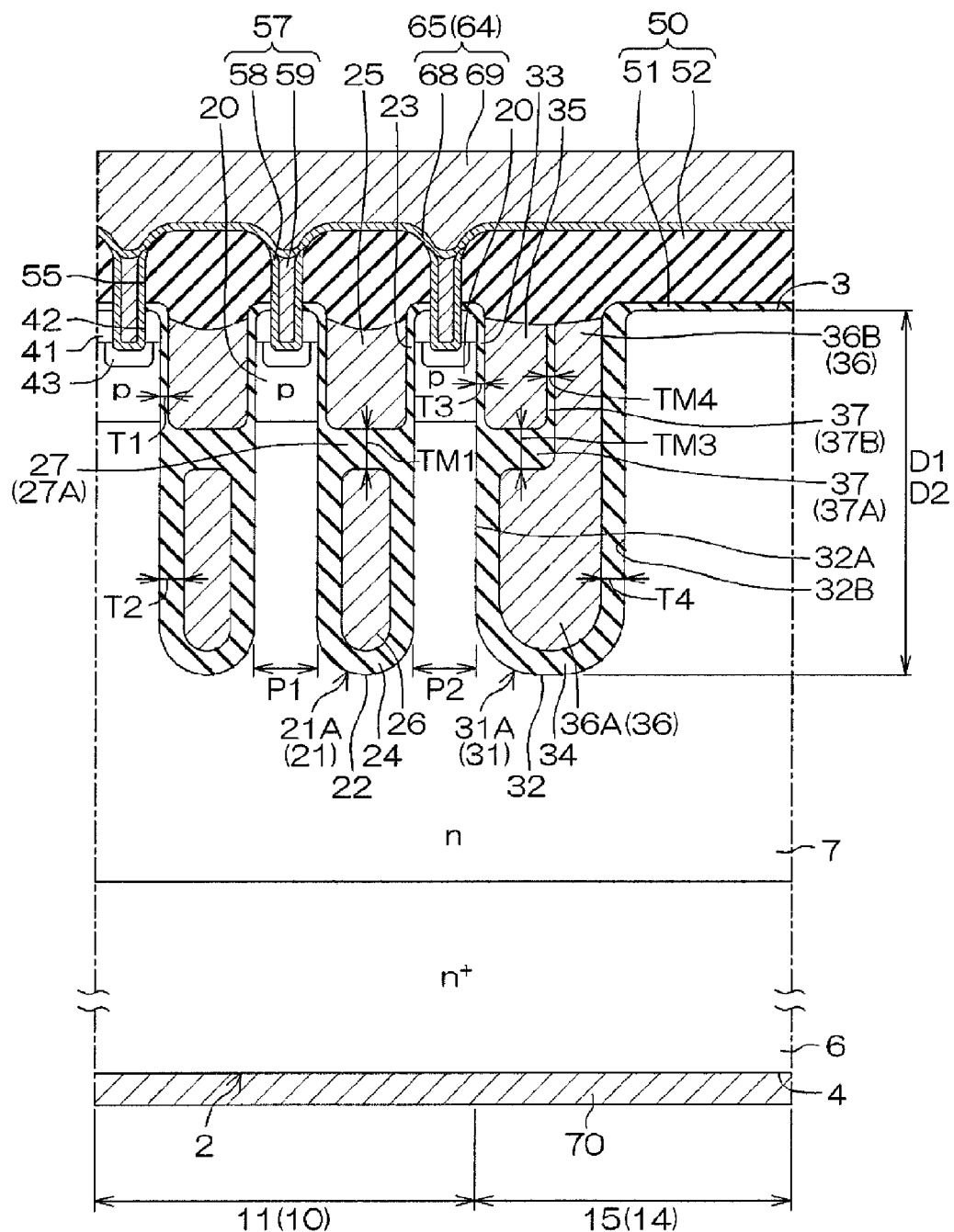
FIG. 11 is a sectional view taken along line XI-XI shown in FIG. 10.

FIG. 10 is a plan view corresponding to FIG. 3 and showing a structure of a first main surface 3 of a semiconductor chip 2 of a semiconductor device 101 according to a second embodiment of the present disclosure. FIG. 11 is a cross-sectional view taken along line XI-XI in FIG. 10. Hereinafter, the structures corresponding to the structures described for the semiconductor device 1 will be designated by the same reference numerals, and the description thereof will be omitted. The semiconductor device 101 includes a source region 41, a source contact hole 42 and a contact region 43 formed in a region between the trench gate structure 21 and the field trench structure 31. The structure on the side of the trench gate structure 21 is the same as in the case of the first embodiment. In the following description, only the structure of the region between the trench gate structure 21 and the field trench structure 31 will be described.

The source region 41 is formed in a band shape extending along the facing wall 32A of the field trench 32 in a plan view. The source region 41 covers the third insulating film 33 exposed from the facing wall 32A of the field trench 32. That is, the source region 41 faces the third electrode 35 with the third insulating film 33 interposed therebetween. The source region 41 defines a MISFET channel between the source region 41 and the bottom portion of the body region 20 (drift region 7) in the region extending along the facing wall 32A of the field trench 32.

The source contact hole 42 is formed on the first main surface 3 so as to be spaced apart from the gate trench 22 and the field trench 32. The source contact hole 42 is formed in a band shape extending along the field trench 32. With respect to the first direction X, the length of the source contact hole 42 is preferably less than the length of the field trench 32. The source contact hole 42 exposes the source region 41 from both sides in a cross-sectional view.

The contact region 43 is formed in the region between the gate trench 22 and the field trench 32 in the body region 20 along the bottom wall of the source contact hole 42. The main surface insulating film 50 described above includes a source contact opening 55 communicating with the source contact hole 42 between the gate trench 22 and the field trench 32. The source plug electrode 57 described above is also embedded in the source contact hole 42 between the gate trench 22 and the field trench 32, and is electrically connected to the source region 41 and the contact region 43. The source main surface electrode 64 (source pad electrode 65) described above is electrically connected to the source region 41 and the contact region 43 between the gate trench 22 and the field trench 32 via the source plug electrode 57.

Figure 12:
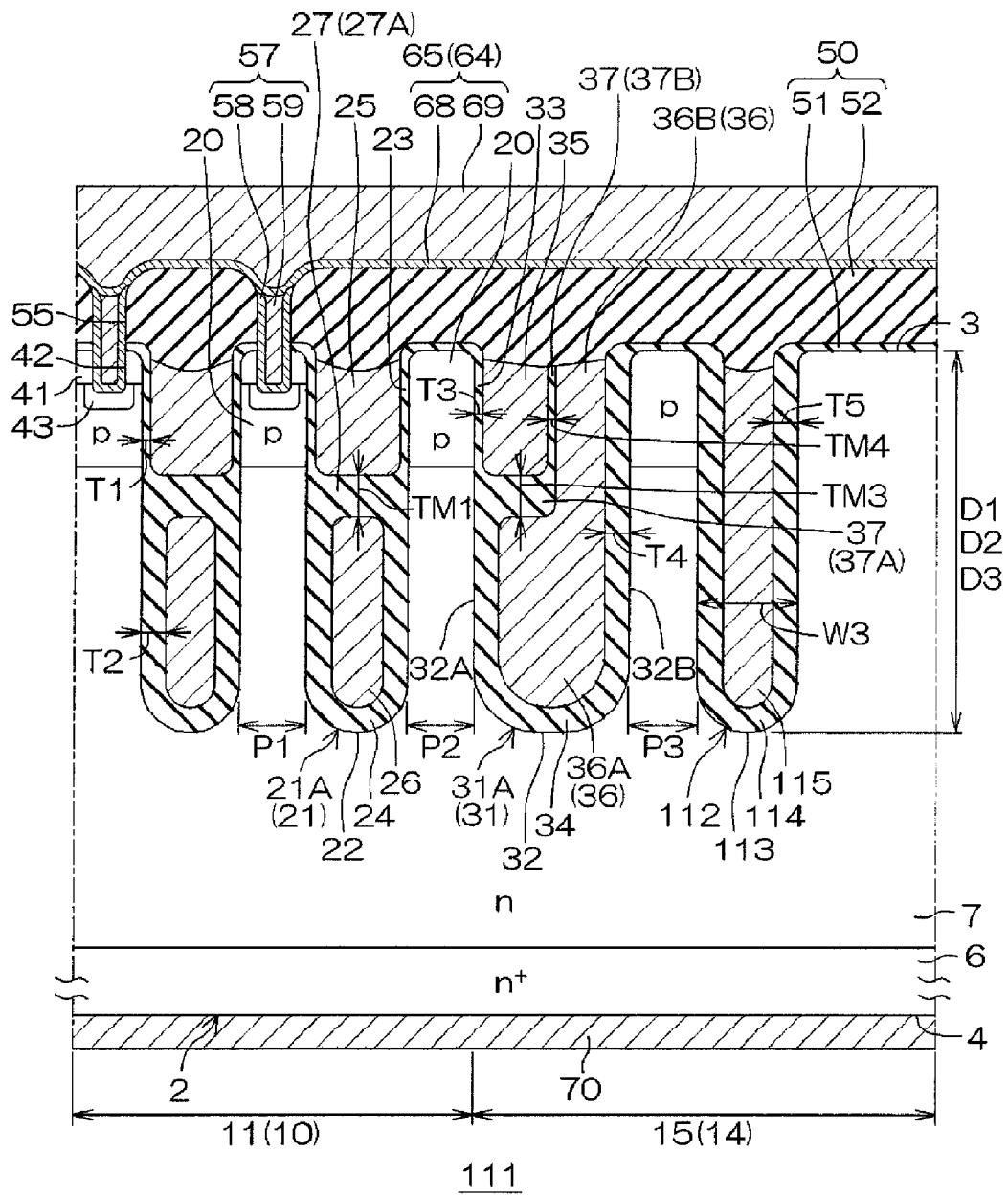
FIG. 12 is a cross-sectional view corresponding to FIG. 4 and showing a region of a portion of a semiconductor device according to a third embodiment of the present disclosure.

As described above, the semiconductor device 101 can also have the same effects as the effects described for the semiconductor device 1. FIG. 12 is a cross-sectional view corresponding to FIG. 4 and showing a region of a portion of a semiconductor device 111 according to a third embodiment of the present disclosure. Hereinafter, the structures corresponding to the structures described for the semiconductor device 1 will be designated by the same reference numerals, and the description thereof will be omitted.

Referring to FIG. 12, the semiconductor device 111 includes an outer field trench structure 112 formed on the first main surface 3 so as to be spaced apart from the field trench structure 31 in the inactive region 14. FIG. 12 shows an example in which the outer field trench structure 112 is formed adjacent to the first field trench structure 31A. As in the case of the first embodiment described above, the outer field trench structure 112 may be formed adjacent to the second field trench structure 31B. Further, the outer field trench structure 112 may be formed adjacent to the third field trench structure 31C.

The active region 10 and the inactive region 14 are defined by a multi-trench structure that includes a field trench structure 31 and an outer field trench structure 112. The field trench structure 31 and the outer field trench structure 112 are formed so as to penetrate the body region 20 in this embodiment. The presence or absence of the body region 20 in the inactive region 14 is arbitrary.

The outer field trench structure 112 is formed in a band shape extending in the first direction X. That is, the outer field trench structure 112 extends parallel to the field trench structure 31. The outer field trench structure 112 is formed so as to be spaced apart by a third interval P3 from the field trench structure 31. The third interval P3 may be 0.1 μm or more and 2 μm or less. The third interval P3 may be 0.1 μm or more and 0.5 μm or less, 0.5 μm or more and 1 μm or less, 1 μm or more and 1.5 μm or less, or 1.5 μm or more and 2 μm or less. The third interval P3 is preferably 0.5 μm or more and 1.5 μm or less.

The third interval P3 is preferably equal to the first interval P1 of the trench gate structure 21. The third interval P3 being equal to the first interval P1 means that the value of the third interval P3 falls within ±10% of the value of the first interval P1. The third interval P3 is preferably equal to the second interval P2 of the field trench structure 31. The third interval P3 being equal to the second interval P2 means that the value of the third interval P3 falls within ±10% of the value of the second interval P2.

The outer field trench structure 112 has a single electrode structure including an outer field trench 113, a fifth insulating film 114 and a fifth electrode 115. The outer field trench 113 is formed by digging the first main surface 3 toward the second main surface 4. The outer field trench 113 penetrates the body region 20 and is formed so as to be spaced apart from the bottom portion of the drift region 7 to the side of the first main surface 3.

The angle formed by the side wall of the outer field trench 113 with the first main surface 3 in the semiconductor chip 2 may be 90° or more and 92° or less. The outer field trench 113 may be formed in a tapered shape in which the opening width narrows from an opening toward a bottom wall. The bottom wall of the outer field trench 113 is preferably formed in a curved shape toward the second main surface 4.

The outer field trench 113 has a third width W3. The third width W3 is the width in the direction orthogonal to the direction in which the outer field trench 113 extends (i.e., in the second direction Y). The third width W3 may be 0.5 μm or more and 4 μm or less. The third width W3 may be 0.5 μm or more and 1 μm or less, 1 μm or more and 2 μm or less, 2 μm or more and 3 μm or less, or 3 μm or more and 4 μm or less. The third width W3 is preferably 1 μm or more and 2.5 μm or less.

The third width W3 may be less than the second width W2 of the field trench 32. The third width W3 may be equal to the first width W1 of the gate trench 22. The third width W3 being equal to the first width W1 means that the value of the third width W3 falls within ±10% of the value of the first width W1. The outer field trench 113 has a third depth D3. The third depth D3 may be 1 μm or more and 10 μm or less. The third depth D3 may be 1 μm or more and 2 μm or less, 2 μm or more and 4 μm or less, 4 μm or more and 6 μm or less, 6 μm or more and 8 μm or less, or 8 μm or more and 10 μm or less. The third depth D3 is preferably 1 μm or more and 5 μm or less.

The third depth D3 is preferably equal to the second depth D2 of the field trench 32. The third depth D3 is preferably equal to the first depth D1 of the gate trench 22. The third depth D3 being equal to the second depth D2 (first depth D1) means that the value of the third depth D3 falls within ±10% of the value of the second depth D2 (first depth D1). The outer field trench 113 has a third aspect ratio D3/W3. The third aspect ratio D3/W3 is the ratio of the third depth D3 to the third width W3. The third aspect ratio D3/W3 is preferably more than 1 and 5 or less. It is particularly preferable that the third aspect ratio D3/W3 is 3 or more and 5 or less. The third aspect ratio D3/W3 is preferably equal to the first aspect ratio D1/W1 of the gate trench 22.

The fifth insulating film 114 is formed along the wall surface of the outer field trench 113. Specifically, the fifth insulating film 114 is formed in a film shape over the entire wall surface of the outer field trench 113 to define a U-shaped recess space in the outer field trench 113. The fifth insulating film 114 faces the fourth insulating film 34 of the field trench structure 31 with a portion of the semiconductor chip 2 interposed therebetween over the entire depth direction of the outer field trench 113. The fifth insulating film 114 includes silicon oxide in this embodiment.

The fifth insulating film 114 has a fifth thickness T5 larger than the third thickness T3 of the third insulating film 33 of the field trench structure 31. The fifth thickness T5 is the thickness of the fifth insulating film 114 along the normal line direction of the wall surface of the outer field trench 113. The fifth thickness T5 may be 0.1 µm or more and 1 µm or less. The fifth thickness T5 may be 0.1 µm or more and 0.25 µm or less, 0.25 µm or more and 0.5 µm or less, 0.5 µm or more and 0.75 µm or less, or 0.75 µm or more and 1 µm or less. The fifth thickness T5 is preferably 0.15 µm or more and 0.65 µm or less.

The fifth thickness T5 is preferably equal to the fourth thickness T4 of the fourth insulating film 34 of the field trench structure 31. The fifth thickness T5 being equal to the fourth thickness T4 means that the value of the fifth thickness T5 falls within ±10% of the value of the fourth thickness T4. The fifth electrode 115 is embedded in the outer field trench 113 with the fifth insulating film 114 interposed therebetween. The fifth electrode 115 faces the fourth electrode 36 of the field trench structure 31 in the horizontal direction (second direction Y) parallel to the first main surface 3 over the entire depth direction of the outer field trench 113. The fifth electrode 115 includes conductive polysilicon in this embodiment.

The fifth electrode 115 may be formed in an electrically floating state. In this case, the entire region of the outer field trench structure 112 is covered with the main surface insulating film 50 described above, and is electrically insulated from the outside. A source potential (e.g., a ground potential) as a reference potential may be applied to the fifth electrode 115. In this case, the fifth electrode 115 is electrically connected to the source main surface electrode 64 via the source plug electrode 57 described above.

As described above, the field trench structure 31 has a structure corresponding to the trench gate structure 21 on the side of the facing wall 32A. Further, the field trench structure 31 has a structure corresponding to the outer field trench structure 112 on the side of the non-facing wall 32B. As a result, it is possible to relieve the stress generated in the region between the trench gate structure 21 and the field trench structure 31 in the semiconductor chip 2. Further, it is possible to relieve the stress generated in the region between the field trench structure 31 and the outer field trench structure 112 in the semiconductor chip 2. Therefore, the semiconductor device 111 can also have the same effects as the effects described for the semiconductor device 1.

The semiconductor device 111 can be manufactured by merely changing the layout of the resist mask or the like in the method of manufacturing the semiconductor device 1. The outer field trench structure 112 of the semiconductor device 111 may be applied to the second embodiment described above. In this embodiment, the example in which one outer field trench structure 112 is formed has been described. Alternatively, a plurality of (two or more) outer field trench structures 112 may be formed so as to be spaced apart in the second direction Y.

Figure 13:
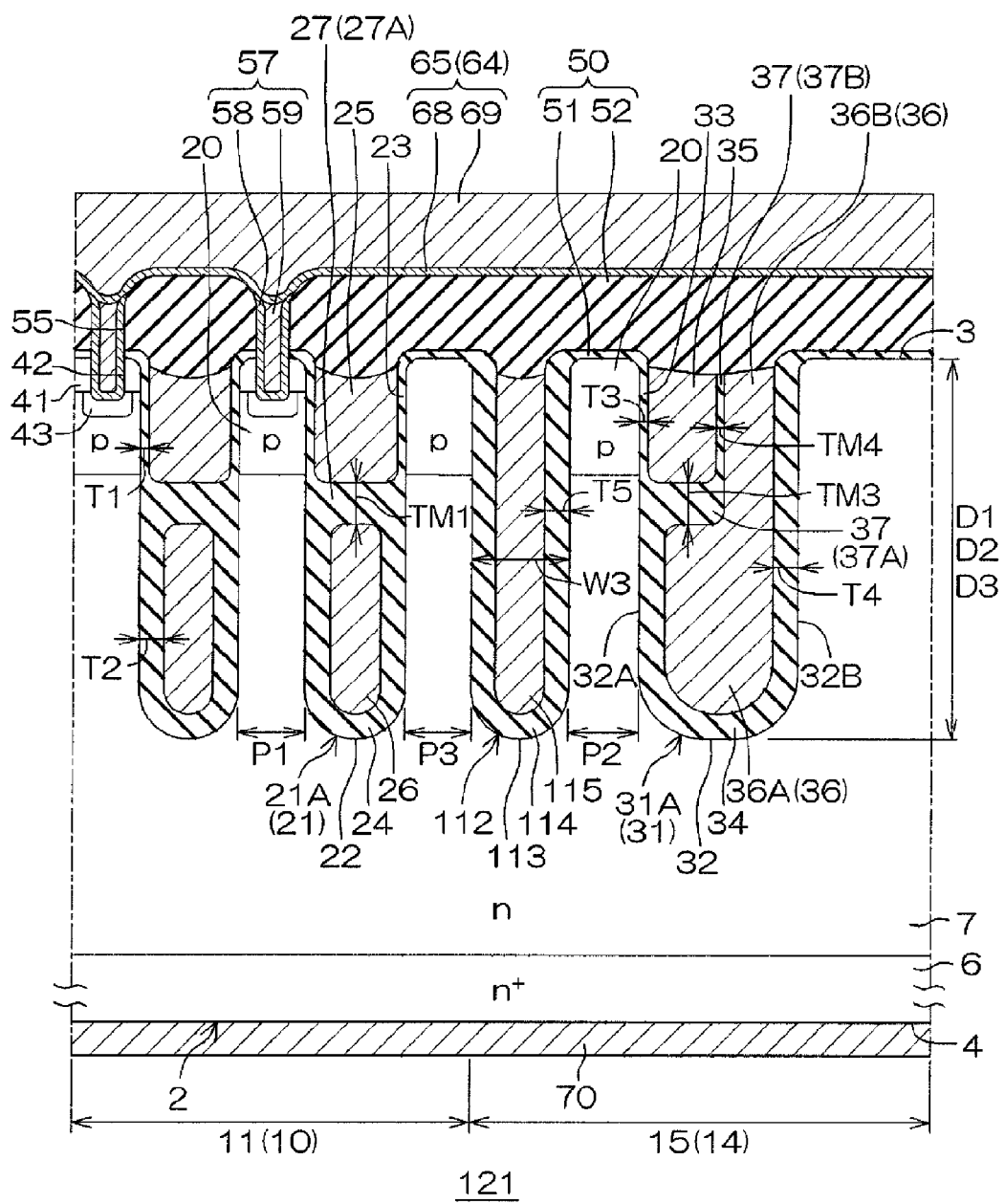
FIG. 13 is a cross-sectional view corresponding to FIG. 4 and showing a region of a portion of a semiconductor device according to a fourth embodiment of the present disclosure.

FIG. 13 is a cross-sectional view corresponding to FIG. 4 and showing a region of a portion of a semiconductor device 121 according to a fourth embodiment of the present disclosure. Hereinafter, the structures corresponding to the structures described for the semiconductor device 1 and the semiconductor device 111 will be designated by the same reference numerals and the description thereof will be omitted. Referring to FIG. 13, the semiconductor device 121 includes an outer field trench structure 112 formed on the first main surface 3 so as to be interposed between the trench gate structure 21 and the field trench structure 31 in the inactive region 14. That is, the semiconductor device 121 has a structure obtained by changing the arrangement of the field trench structure 31 and the outer field trench structure 112 in the semiconductor device 111 according to the third embodiment. The active region 10 and the inactive region 14 are defined by a multi-trench structure that includes the field trench structure 31 and the outer field trench structure 112.

The field trench structure 31 is formed in the inactive region 14 so as to be spaced apart by the aforementioned second interval P2 from the outer field trench structure 112. The outer field trench structure 112 is formed in the inactive region 14 so as to be spaced apart by the aforementioned third interval P3 from the trench gate structure 21. The field trench structure 31 and the outer field trench structure 112 are formed so as to penetrate the body region 20 in this embodiment. The presence or absence of the body region 20 in the inactive region 14 is arbitrary.

A first stress and a second stress are generated in the portions of the semiconductor chip 2 located on both sides of the outer field trench structure 112. The first stress is generated in the region between the trench gate structure 21 and the outer field trench structure 112 in such a direction as to pull the outer field trench structure 112 toward the trench gate structure 21. The second stress is generated in the region between the outer field trench structure 112 and the field trench structure 31 in such a direction as to pull the outer field trench structure 112 toward the field trench structure 31.

That is, the second stress is generated in such a direction as to cancel the first stress. Therefore, according to the semiconductor device 121, the stress generated in the region between the trench gate structure 21 and the field trench structure 31 can be relieved by the structure in the field trench structure 31. Further, the stress generated in the region between the field trench structure 31 and the outer field trench structure 112 can be relieved by the structure in the trench gate structure 21. Therefore, the semiconductor device 121 can also have the same effects as the effects described for the semiconductor device 1.

The semiconductor device 121 can be manufactured by merely changing the layout of the resist mask or the like in the method of manufacturing the semiconductor device 1. The outer field trench structure 112 according to the semiconductor device 121 may be applied to the second embodiment described above. In this embodiment, the example in which one outer field trench structure 112 is formed has been described. Alternatively, a plurality of (two or more) outer field trench structures 112 may be formed in the region between the trench gate structure 21 and the field trench structure 31 so as to be spaced apart from each other in the second direction Y. However, in order to relieve the stress, it is preferable to form only one outer field trench structure 112.

Figure 14:
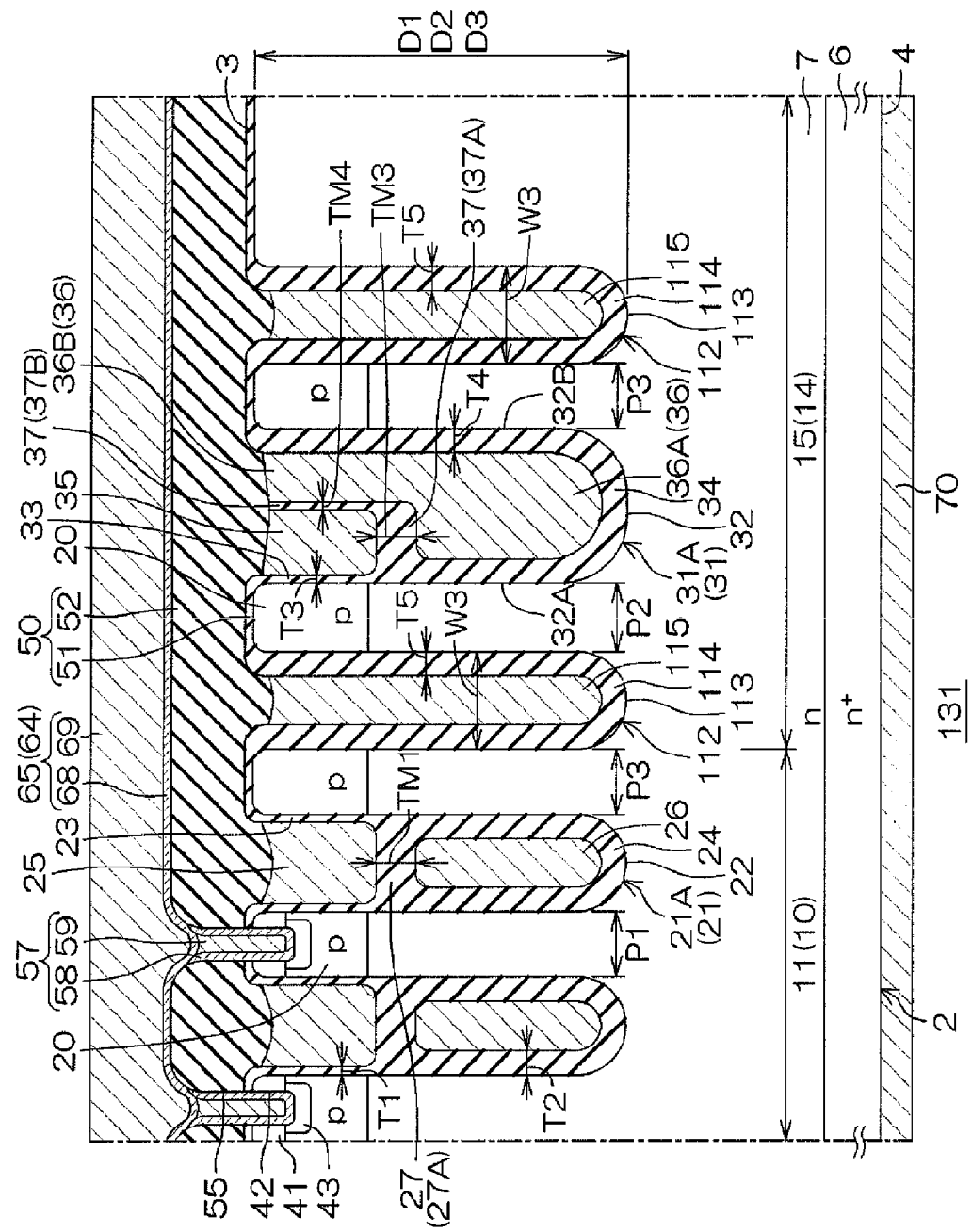
FIG. 14 is a cross-sectional view corresponding to FIG. 4 and showing a region of a portion of a semiconductor device according to a fifth embodiment of the present disclosure.

FIG. 14 is a cross-sectional view corresponding to FIG. 4 and showing a region of a portion of a semiconductor device 131 according to a fifth embodiment of the present disclosure. Hereinafter, the structures corresponding to the structures described for the semiconductor device 1 and the semiconductor device 121 will be designated by the same reference numerals and the description thereof will be omitted. Referring to FIG. 14, the semiconductor device 131 includes a plurality of (two, in this embodiment) outer field trench structures 112 formed so as to be spaced apart from the trench gate structure 21. Further, the semiconductor device 131 includes a field trench structure 31 formed in the region between the outer field trench structures 112 adjacent to each other. That is, the semiconductor device 131 has a structure in which the structure of the semiconductor device 121 according to the fourth embodiment is combined with the structure of the semiconductor device 111 according to the third embodiment. The active region 10 and the inactive region 14 are defined by a multi-trench structure including the field trench structure 31 and the outer field trench structures 112.

Figure 15:
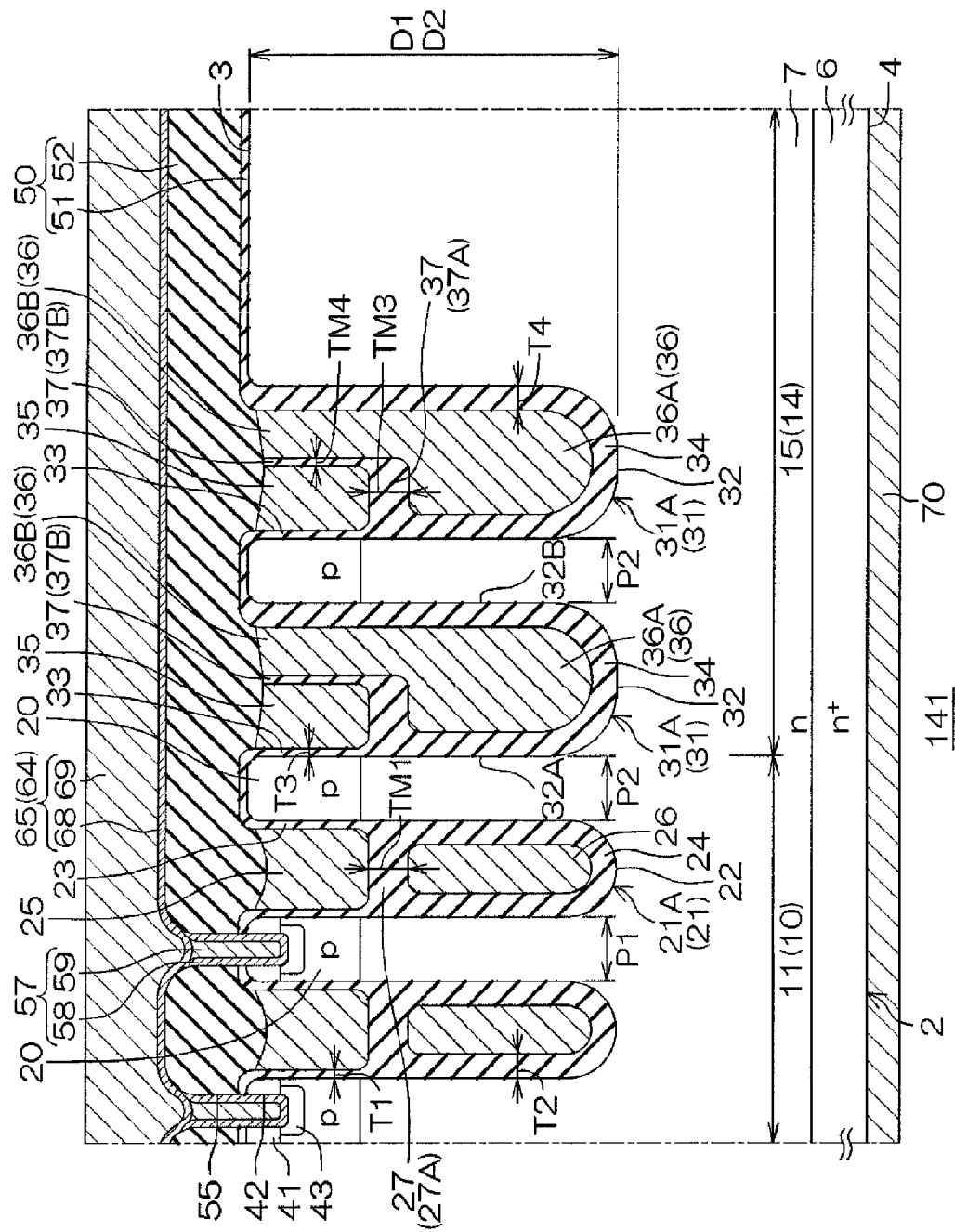
FIG. 15 is a cross-sectional view corresponding to FIG. 4 and showing a region of a portion of a semiconductor device according to a sixth embodiment of the present disclosure.

As described above, according to the semiconductor device 131, it is possible to obtain the same effects as described for the semiconductor device 111 and the semiconductor device 121. The semiconductor device 131 can be manufactured by merely changing the layout of the resist mask or the like in the method of manufacturing the semiconductor device 1. FIG. 15 is a cross-sectional view corresponding to FIG. 4 and showing a region of a portion of a semiconductor device 141 according to a sixth embodiment of the present disclosure. Hereinafter, the structures corresponding to the structures described for the semiconductor device 1 will be designated by the same reference numerals and the description thereof will be omitted.

Referring to FIG. 15, the semiconductor device 141 includes a plurality of (two, in this embodiment) field trench structures 31 formed so as to be spaced apart from the trench gate structure 21 in the inactive region 14. FIG. 15 shows an example in which the field trench structures 31 are formed so as to be spaced apart from the first trench gate structure 21A. The field trench structures 31 may be formed so as to be spaced apart from the second field trench structure 31B. Further, the field trench structures 31 may be formed so as to be spaced apart from the third field trench structure 31C.

The active region 10 and the inactive region 14 are defined by a multi-trench structure that includes a plurality of field trench structures 31. The number of field trench structures 31 is arbitrary. Three or more field trench structures 31 may be formed so as to be spaced apart from each other. The field trench structures 31 are formed so as to penetrate the body region 20 in this embodiment. The presence or absence of the body region 20 in the inactive region 14 is arbitrary.

Each of the field trench structures 31 is formed in a band shape extending in the first direction X in a plan view. The field trench structures 31 are formed so as to be spaced apart from each other in the second direction Y. That is, the field trench structures 31 are formed in a stripe shape in a plan view. Each of the field trench structures 31 is formed in a posture in which the facing wall 32A faces the side of the trench gate structure 21. The field trench structures 31 may be formed so as to be spaced apart from each other by the aforementioned second interval P2.

Figure 16:
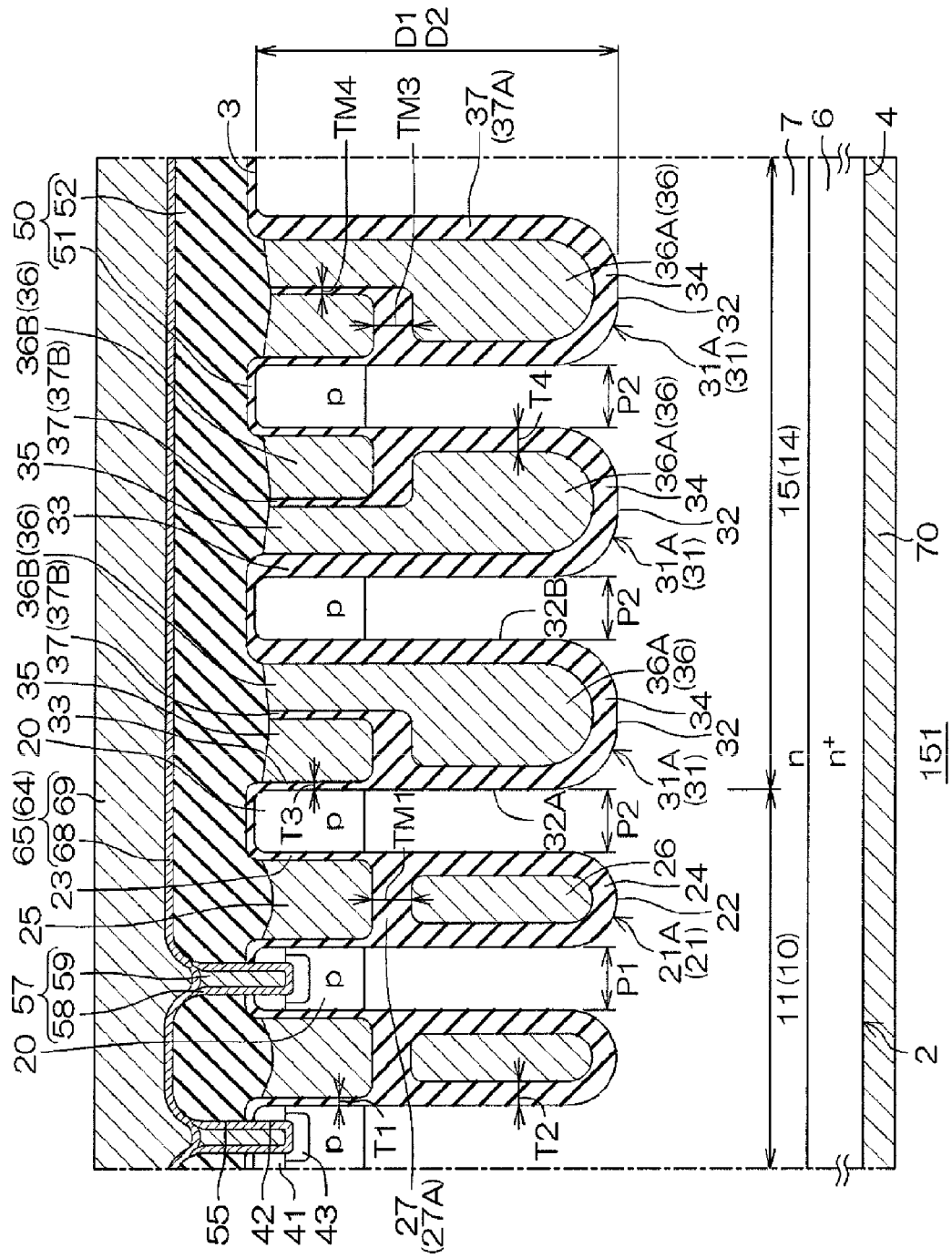
FIG. 16 is a cross-sectional view corresponding to FIG. 4 and showing a region of a portion of a semiconductor device according to a seventh embodiment of the present disclosure.

As described above, the semiconductor device 141 can also have the same effects as the effects described for the semiconductor device 1. The semiconductor device 141 can be manufactured by merely changing the layout of the resist mask or the like in the method of manufacturing the semiconductor device 1. The structure of the semiconductor device 141 can also be applied to the above-described second to fifth embodiments. FIG. 16 is a cross-sectional view corresponding to FIG. 4 and showing a region of a portion of a semiconductor device 151 according to a seventh embodiment of the present disclosure. Hereinafter, the structures corresponding to the structures described for the semiconductor device 1 will be designated by the same reference numerals and the description thereof will be omitted.

Referring to FIG. 16, the semiconductor device 151 includes a plurality of (three, in this embodiment) field trench structures 31 formed so as to be spaced apart from the trench gate structure 21 in the inactive region 14. FIG. 16 shows an example in which the field trench structures 31 are formed so as to be spaced apart from the first trench gate structure 21A. The field trench structures 31 may be formed so as to be spaced apart from the second field trench structure 31B. Further, the field trench structures 31 may be formed so as to be spaced apart from the third field trench structure 31C.

The active region 10 and the inactive region 14 are defined by a multi-trench structure that includes a plurality of field trench structures 31. The number of field trench structures 31 is arbitrary. Three or more field trench structures 31 may be formed so as to be spaced apart from each other. The field trench structures 31 are formed so as to penetrate the body region 20 in this embodiment. The presence or absence of the body region 20 in the inactive region 14 is arbitrary.

Each of the field trench structures 31 is formed in a band shape extending in the first direction X in a plan view. The field trench structures 31 are formed so as to be spaced apart in the second direction Y. That is, the field trench structures 31 are formed in a stripe shape in a plan view. Each of the field trench structures 31 is formed in such a posture that the facing walls 32A face each other and the non-facing walls 32B face each other. The field trench structures 31 may be formed so as to be spaced apart from each other by the aforementioned second interval P2.

As described above, the semiconductor device 151 can also have the same effects as the effects described for the semiconductor device 1. The semiconductor device 151 can be manufactured by merely changing the layout of the resist mask or the like in the method of manufacturing the semiconductor device 1. The structure of the semiconductor device 151 can also be applied to the above-described second to sixth embodiments. Embodiments of the present disclosure may be implemented in still other forms.

Figure 17:
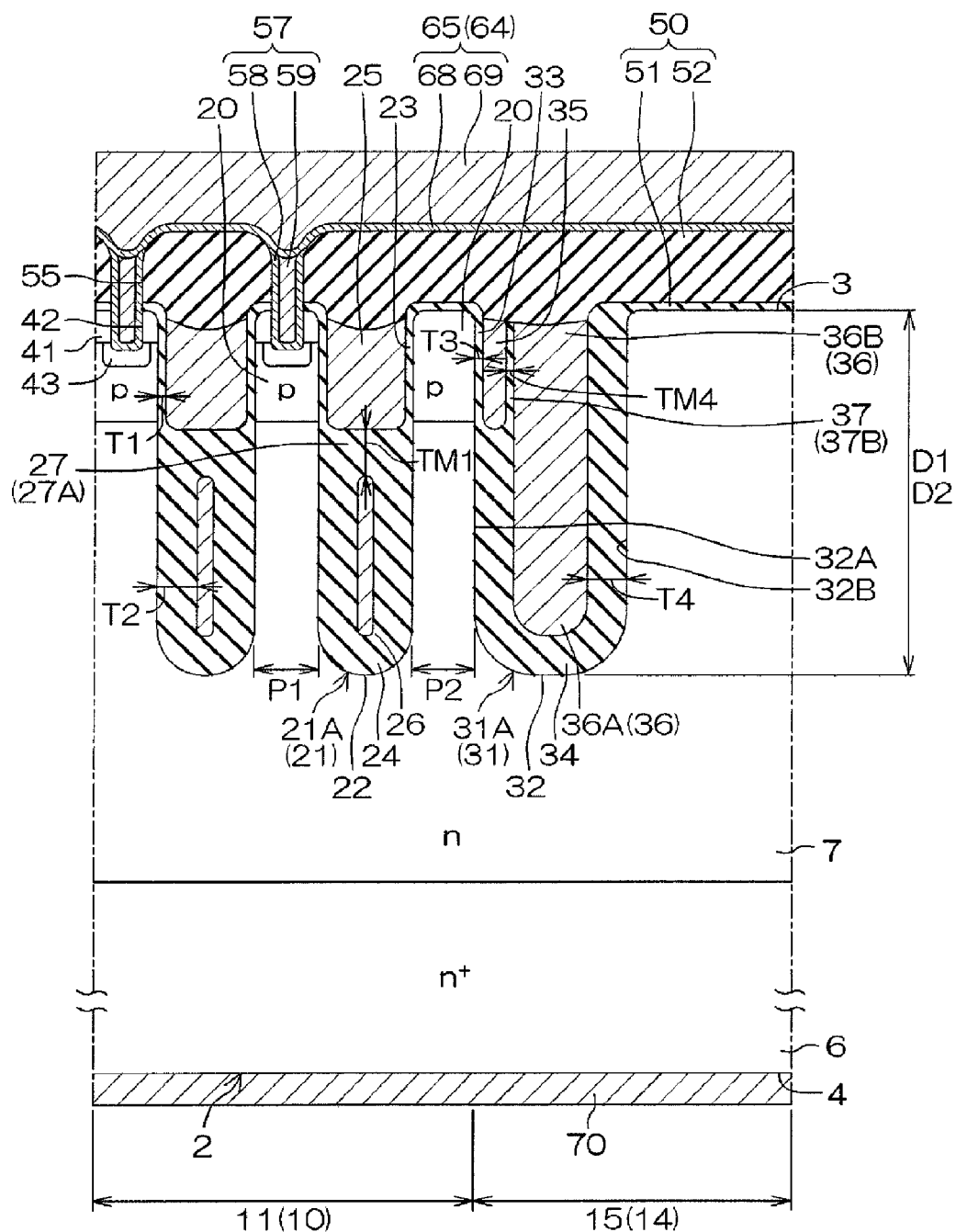
FIG. 17 is a cross-sectional view corresponding to FIG. 4 and showing a field trench structure according to a modification example.

In each of the above-described embodiments, the field trench structure 31 shown in FIG. 17 may be adopted. FIG. 17 is a cross-sectional view corresponding to FIG. 4 and showing a field trench structure 31 according to a modification example. Hereinafter, the structures corresponding to the structures described for the semiconductor device 1 will be designated by the same reference numerals and the description thereof will be omitted. In the field trench structure 31 according to the modification example, the lower electrode portion 36A of the fourth electrode 36 does not have a portion located in the region directly below the third electrode 35. That is, the fourth electrode 36 is formed so as to be spaced apart from the third electrode 35 to the side of the non-facing wall 32B of the field trench 32, so that only the fourth insulating film 34 exists in the region directly below the third electrode 35. The second intermediate insulating film 37 does not include the third intermediate portion 37A, but includes only the fourth intermediate portion 37B.

As described above, even when the field trench structures 31 according to the modification example are formed, it is possible to obtain the same effects as described for the semiconductor device 1. Such field trench structures 31 can be formed by merely changing the layout of the resist mask or the like in the method of manufacturing the semiconductor device 1. In each of the above-described embodiments, the example has been described in which the second electrode 26 of the trench gate structure 21 is formed as a field electrode and the source potential (e.g., the ground potential) as a reference potential is applied to the second electrode 26. However, the second electrode 26 may be formed as a gate electrode, and the gate potential as a control potential may be applied to the second electrode 26.

In each of the above-described embodiments, examples have been described in which the third electrode 35 of the field trench structure 31 is formed as a gate electrode and the gate potential as a control potential is applied to the third electrode 35. Alternatively, the third electrode 35 may be formed as a field electrode, and the source potential (e.g., the ground potential) may be applied to the third electrode 35. Further, the third electrode 35 of the field trench structure 31 may be formed as a dummy electrode which is electrically opened and electrically floating.

In each of the above-described embodiments, examples have been described in which the body region 20 is formed in the region between the trench gate structure 21 and the field trench structure 31 in the surface layer portion of the first main surface 3. Alternatively, a structure may be adopted in which the body region 20 does not exist in the region between the trench gate structure 21 and the field trench structure 31 in the surface layer portion of the first main surface 3. In this case, the drift region 7 is exposed from the region between the trench gate structure 21 and the field trench structure 31 on the first main surface 3.

In each of the above-described embodiments, examples have been described in which the source main surface electrodes 64 are not connected to the lead-out electrodes 26A and the lead-out electrodes 36C located at both ends. Alternatively, the source main surface electrodes 64 may be connected to the lead-out electrodes 26A and the lead-out electrodes 36C located at both ends via the source plug electrodes 57. In this case, the source main surface electrodes 64 may include source finger electrodes linearly led out from the source pad electrodes 65 so as to be connected to the lead-out electrodes 26A and the lead-out electrodes 36C located at both ends.

In each of the above-described embodiments, a structure may be adopted in which the conductive type of each of the semiconductor portions is inverted. That is, the p-type portion may become n-type and the n-type portion may become p-type.

According to this semiconductor device, it is possible to relieve the stress generated in the region between the gate trench and the field trench.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a semiconductor chip including a main surface;
a gate trench formed on the main surface;
a first insulating film configured to cover an upper wall surface of the gate trench;
a second insulating film configured to cover a lower wall surface of the gate trench, and having a larger thickness than the first insulating film;
a field trench formed on the main surface so as to be spaced apart from the gate trench, and including a facing wall at a side of the gate trench and a non-facing wall at an opposite side of the facing wall;
a third insulating film configured to cover an upper wall surface of the field trench at a side of the facing wall, and having a smaller thickness than the second insulating film;
a fourth insulating film configured to cover a lower wall surface of the field trench at the side of the facing wall and the non-facing wall, and having a larger thickness than the third insulating film;
a first electrode embedded on an upper side of the gate trench with the first insulating film interposed between the first electrode and the upper side of the gate trench;
a second electrode embedded on a lower side of the gate trench with the second insulating film interposed between the second electrode and the lower side of the gate trench;
a third electrode embedded on the side of the facing wall in the field trench with the third insulating film interposed between the third electrode and the side of the facing wall;
a fourth electrode embedded on a side of the non-facing wall in the field trench with the fourth insulating film interposed between the fourth electrode and the side of the non-facing wall;
a main surface insulating film formed to fully cover an upper side of the fourth electrode in a cross-sectional view taken along a direction perpendicular to a depth direction of the field trench; and
at least one gate plug electrode embedded in the main surface insulating film,
wherein the fourth electrode is embedded on an upper side and a lower side of the field trench,
wherein the third electrode includes an inclined upper surface inclined downward toward a center of the field trench,
wherein a gate plug electrode, which is formed in an outer peripheral portion of the semiconductor device, of the at least one gate plug electrode is in contact with the inclined upper surface of the third electrode, and
wherein none of the at least one gate plug electrode is in contact with the upper side of the fourth electrode.

2. The semiconductor device of claim 1,
wherein the semiconductor chip includes an active region and an inactive region outside the active region,
wherein the gate trench is formed on the main surface in the active region, and
wherein the field trench is formed on the main surface in the inactive region, and configured to separate the active region from the inactive region.

3. The semiconductor device of claim 1,
wherein the third insulating film faces the first insulating film with a portion of the semiconductor chip interposed between the third insulating film and the first insulating film, and
wherein the fourth insulating film faces the second insulating film with a portion of the semiconductor chip interposed between the fourth insulating film and the second insulating film.

4. The semiconductor device of claim 1, wherein the fourth insulating film covers an upper wall surface at a side of the non-facing wall, and faces the third insulating film at the side of the facing wall in the field trench.

5. The semiconductor device of claim 1, wherein the third electrode is embedded on an upper side of the field trench.

6. The semiconductor device of claim 1, wherein the fourth electrode is configured to cross a bottom portion of the third electrode in the depth direction of the field trench.

7. The semiconductor device of claim 1, wherein the third electrode is formed to have a smaller width than the first electrode.

8. The semiconductor device of claim 1, further comprising:
a first intermediate insulating film interposed between the first electrode and the second electrode; and
a second intermediate insulating film interposed between the third electrode and the fourth electrode.

9. The semiconductor device of claim 1,
wherein a control potential is applied to the first electrode,
wherein a reference potential or the control potential is applied to the second electrode,
wherein the control potential or the reference potential is applied to the third electrode, and
wherein the reference potential is applied to the fourth electrode.

10. The semiconductor device of claim 9, wherein the reference potential is applied to the second electrode.

11. The semiconductor device of claim 9, wherein the control potential is applied to the third electrode.

12. The semiconductor device of claim 1, further comprising:
a body region formed at a surface layer portion of the main surface,
wherein the gate trench is formed to penetrate the body region, and
wherein the first insulating film is in contact with the body region.

13. The semiconductor device of claim 12,
wherein the field trench is formed to penetrate the body region, and
wherein the third insulating film is in contact with the body region.

14. The semiconductor device of claim 12, further comprising:
a source region formed at the surface layer portion of the body region in a region extending along the gate trench.

15. The semiconductor device of claim 1,
wherein the gate trench is formed in a band shape in a plan view, and
wherein the field trench is formed in a band shape extending parallel to the gate trench in the plan view.

16. The semiconductor device of claim 1, wherein the field trench is formed to have a larger width than the gate trench.

* * * * *